United States Patent
Sasaoka

(10) Patent No.: US 9,660,610 B2
(45) Date of Patent: May 23, 2017

(54) CRYSTAL DEVICE AND MOUNTING ARRANGEMENT

(71) Applicant: KYOCERA Crystal Device Corporation, Higashine-shi, Yamagata (JP)

(72) Inventor: Kouhei Sasaoka, Higashine (JP)

(73) Assignee: KYOCERA CRYSTAL DEVICE CORPORATION, Yamagata (JP)

( * ) Notice: Subject to any disclaimer, the term of this patent is extended or adjusted under 35 U.S.C. 154(b) by 94 days.

(21) Appl. No.: 14/710,091

(22) Filed: May 12, 2015

(65) Prior Publication Data

US 2015/0349744 A1 Dec. 3, 2015

(30) Foreign Application Priority Data

May 30, 2014 (JP) .................................. 2014-112432
Oct. 31, 2014 (JP) .................................. 2014-222114
Jan. 29, 2015 (JP) .................................. 2015-015125

(51) Int. Cl.
*H03H 9/17* (2006.01)
*H03H 3/02* (2006.01)
*H03H 9/10* (2006.01)

(52) U.S. Cl.
CPC ............... *H03H 9/17* (2013.01); *H03H 3/02* (2013.01); *H03H 9/1021* (2013.01); *H03H 2003/022* (2013.01); *Y10T 29/43* (2015.01)

(58) Field of Classification Search
CPC ............................... H03H 9/17; H03H 9/1021
USPC .................................. 310/320–321, 344, 365
See application file for complete search history.

(56) References Cited

U.S. PATENT DOCUMENTS

| 2010/0066213 A1* | 3/2010 | Takahashi | H03H 3/02 310/364 |
| 2010/0141100 A1* | 6/2010 | Takahashi | H03H 3/02 310/365 |
| 2010/0231094 A1* | 9/2010 | Kameda | H03H 9/1021 310/344 |
| 2010/0244630 A1* | 9/2010 | Wada | H03H 9/19 310/340 |

(Continued)

FOREIGN PATENT DOCUMENTS

| JP | 2014-11647 A | 1/2014 | |
| JP | WO 2015107947 A1 * | 7/2015 | ........... H01L 41/047 |

(Continued)

*Primary Examiner* — J. San Martin
(74) *Attorney, Agent, or Firm* — Shuji Yoshizaki

(57) ABSTRACT

A crystal device has a crystal blank, a first excitation electrode part which is provided on an upper surface of the crystal blank, a first wiring part which extends from the first excitation electrode part to an edge part of the upper surface, a first lead-out terminal which is provided at the edge part of the upper surface of the crystal blank, a first mounting terminal which is provided at a position facing the first lead-out terminal, a first connection part which is provided so that one end is superimposed on the first lead-out terminal and the other end is superimposed on the first mounting terminal, a substrate having a mounting pad which is provided on its upper surface, a conductive adhesive which is provided between the mounting pad and the first mounting terminal, and a lid which is bonded to the upper surface of the substrate.

10 Claims, 29 Drawing Sheets

(56) References Cited

U.S. PATENT DOCUMENTS

| | | | | |
|---|---|---|---|---|
| 2011/0203083 A1* | 8/2011 | Sasaki | .................. | H03H 3/02 |
| | | | | 29/25.35 |
| 2012/0056514 A1* | 3/2012 | Ishikawa | ............ | H03H 9/02157 |
| | | | | 310/344 |
| 2012/0313721 A1* | 12/2012 | Kohda | ................. | H03H 9/0514 |
| | | | | 331/158 |
| 2013/0249353 A1* | 9/2013 | Naito | ................ | H01L 41/0825 |
| | | | | 310/367 |
| 2016/0035962 A1* | 2/2016 | Yamashita | ......... | H03H 9/02102 |
| | | | | 310/348 |
| 2016/0043702 A1* | 2/2016 | Okamoto | ............ | H03H 9/0509 |
| | | | | 310/348 |

FOREIGN PATENT DOCUMENTS

| | | | | |
|---|---|---|---|---|
| JP | WO 2015137251 A1 * | 9/2015 | ............... | G01L 1/16 |
| JP | 5955919 B2 * | 7/2016 | ........... | H05K 3/3442 |

* cited by examiner

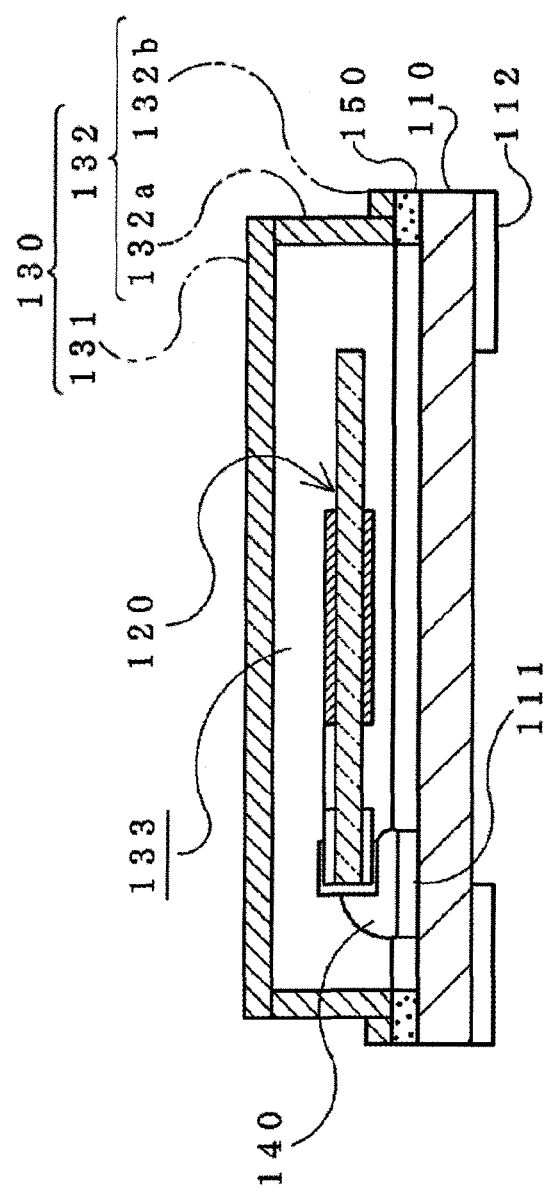

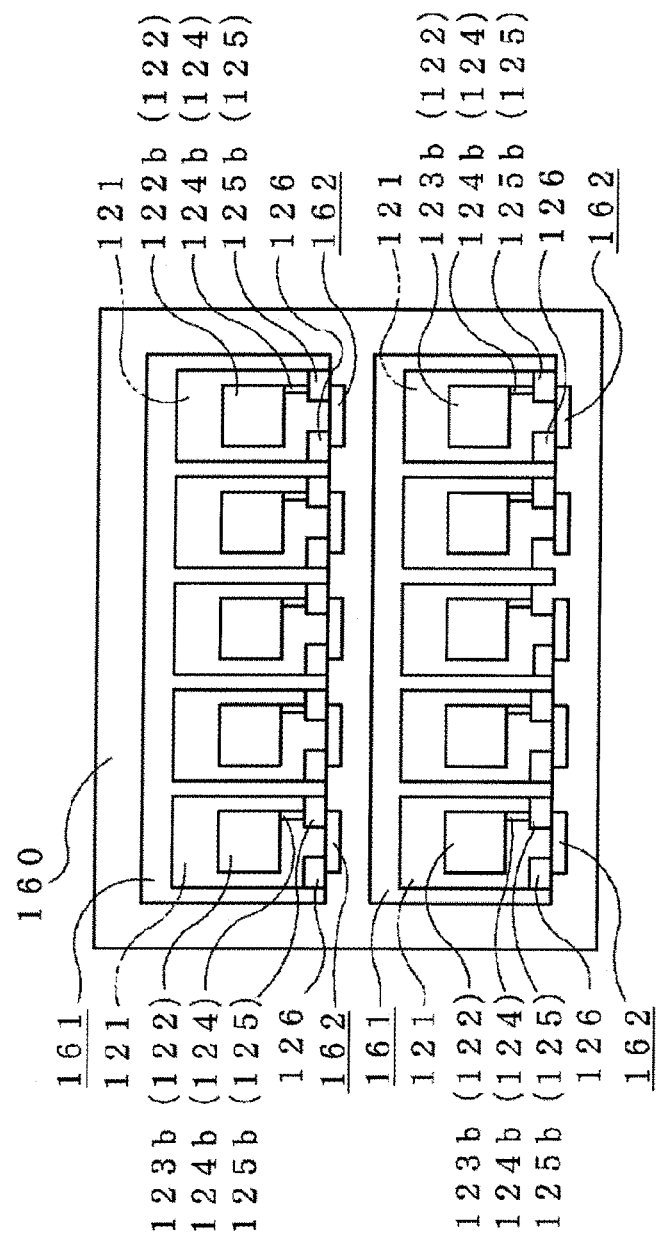

CRYSTAL DEVICE AND MOUNTING ARRANGEMENT

TECHNICAL FIELD

The present invention relates to a crystal device used in a mobile communication device or another piece of electronic equipment.

BACKGROUND ART

A crystal device is for example structured comprised of a substrate and a lid which are bonded together and a crystal blank which is mounted on an upper surface of the substrate and which is hermetically sealed in a concave portion which is formed by the substrate and the lid. The crystal blank is formed for example by using a photolithography technique and an etching technique to form a crystal blank part at a predetermined position of a crystal wafer having crystal axes consisting of an X-axis, Y-axis and Z-axis which are perpendicular to each other in a state fixed at a single predetermined side of the major surface, then snapping off this crystal blank part at the predetermined single side to segment it.

At such a crystal blank, predetermined metal patterns, specifically a first excitation electrode part, second excitation electrode part, first wiring part, second wiring part, first mounting terminal, second lead-out terminal, first lead-out terminal, and first connection part are integrally formed. The first excitation electrode part is provided on the upper surface of the crystal blank. The first wiring part extends from the first excitation electrode part up to the edge part of the upper surface of the crystal blank. The first lead-out terminal is provided at the edge part of the upper surface of the crystal blank so as to be connected to the end part of the first wiring part. The first mounting terminal is provided at the lower surface of the crystal blank at a position which faces the first lead-out terminal. The first connection part is provided on the side surface of the crystal blank so that one end is connected to the first lead-out terminal and the other end is connected to the first mounting terminal. The second excitation electrode part is provided on the lower surface of the crystal blank. The second wiring part extends from the second excitation electrode part up to the edge part of the lower surface of the crystal blank. The second lead-out terminal is provided at the edge part of the lower surface of the crystal blank so as to be connected to the end part of the second wiring part. The crystal blank provided with the metal patterns is mounted on the upper surface of the substrate so that the first mounting terminal and second lead-out terminal and the mounting pads (first mounting pad and second mounting pad) provided on the upper surface of the substrate are bonded by coating and curing a conductive adhesive (see for example Patent Literature 1).

CITATIONS LIST

Patent Literature

Patent Literature 1: Japanese Patent Publication No. 2014-11647A

SUMMARY OF INVENTION

Technical Problem

In a conventional crystal device, the first lead-out terminal is provided at the edge part of the upper surface of the crystal blank, the first mounting terminal is provided at the edge part of the lower surface of the crystal blank, the first connection part is provided on the side surface of the crystal blank so that one end is connected to the first lead-out terminal and the other end is connected to the first mounting terminal, and the first lead-out terminal, first mounting terminal, and first connection part are integrally provided so that their thicknesses in an up-and-down direction become the same. Accordingly, in a conventional crystal device, when a shrinkage stress caused by curing the conductive adhesive provided between the first mounting terminal and the first mounting pad is applied to the first connection part, the stress is concentrated at the end part of the upper surface of the crystal blank which forms the connection part of the first connection part and the first lead-out terminal or the end part of the lower surface of the crystal blank which forms the connection part of the first connection part and the first mounting terminal, therefore the first connection part is peeled off at the end part of the upper surface of the crystal blank or the end part of the lower surface of the crystal blank resulting in poor conduction between the first connection part and the first mounting terminal and between the first connection part and the first lead-out terminal, so the equivalent series resistance value is liable to become large.

Accordingly, a crystal device and a method for production of a crystal device which are capable of reducing an increase of equivalent series resistance value by reducing the poor conduction between the connection part and the lead-out terminal and between the connection part and the mounting terminal are desirably provided.

Solution to Problem

A crystal device according to one aspect of the present invention has a crystal blank which has a substantially block shape, a first excitation electrode part which is provided on an upper surface of the crystal blank, a first wiring part which extends from the first excitation electrode part up to an edge part of the upper surface of the crystal blank, a first lead-out terminal which is provided at the edge part of the upper surface of the crystal blank so as to be connected to the first wiring part, a first mounting terminal which is provided at a position facing the first lead-out terminal on a lower surface of the crystal blank, a first connection part which is provided so that one end is superimposed on the first lead-out terminal and the other end is superimposed on the first mounting terminal, a second excitation electrode part which is provided on the lower surface of the crystal blank, a second wiring part which extends from the second excitation electrode part up to an edge part of the lower surface of the crystal blank, a second lead-out terminal which is provided at the edge part of the lower surface of the crystal blank so as to be connected to the second wiring part, a substrate which has an upper surface provided with a first mounting pad and a second mounting pad, conductive adhesives which are provided between the first mounting pad and the first mounting terminal and between the second mounting pad and the second lead-out terminal, and a lid which is bonded to the upper surface of the substrate.

A method for production of a crystal device according to another aspect of the present invention has a crystal wafer forming process of forming a flat plate-shaped crystal wafer having crystal axes consisting of an X-axis, Y-axis and Z-axis which are perpendicular to each other, a crystal blank part forming process of using a photolithography technique and etching technique to form at a predetermined position of the crystal wafer a crystal blank part which is formed to a schematically rectangular flat plate shape and which is fixed at a predetermined single side of its major surface, an excitation electrode part forming process of using a photolithography technique and etching technique to form a first excitation electrode part on the upper surface of the crystal blank part and form a second excitation electrode part on the lower surface of the crystal blank part, a wiring part forming process of using a photolithography technique and etching technique to form a first wiring part so as to extend from the first excitation electrode part toward an edge part of the upper surface of the crystal blank part and form a second wiring part so as to extend from the second excitation electrode part toward an edge part of the lower surface of the crystal blank part, a lead-out terminal forming process of using a photolithography technique and etching technique to form at the edge part of the upper surface of the crystal blank part a first lead-out terminal which is electrically connected with the first wiring part and form at the edge part of the lower surface of the crystal blank part a second lead-out terminal which is electrically connected to the second wiring part, a mounting terminal forming process of using a photolithography technique and etching technique to form a first mounting terminal on the lower surface of the crystal blank part at a position which faces the first lead-out terminal, a connection part forming process of using a vapor deposition technique or sputtering technique to form a first connection part on the upper surface, lower surface, and side surface of the crystal blank part so that one end is superimposed on the first lead-out terminal and the other end is superimposed on the first mounting terminal, a segmentation process of snapping-off or cutting the predetermined single side of the crystal blank part which is formed in the crystal wafer and thereby segmenting a crystal blank, a mounting process of electrically bonding the second lead-out terminal and first mounting terminal which are formed on the crystal blank to mounting pads which are provided on an upper surface of a substrate and thereby mounting the crystal blank, and a lid bonding process of bonding the substrate and a lid.

Advantageous Effects of Invention

In the above-described constitution or procedure, the first lead-out terminal is provided at the edge part of the upper surface of the crystal blank, the first mounting terminal is provided at the edge part of the lower surface of the crystal blank, and the first connection part is provided so that one end is superimposed on the first lead-out terminal and the other end is superimposed on the first mounting terminal. Therefore, when a shrinkage stress caused by solidifying a conductive adhesive provided between the first mounting terminal and the first mounting pad is applied to the first connection part, stress concentration at the end part of the upper surface of the crystal blank forming the connection part of the first connection part and the first lead-out terminal or the end part of the lower surface of the crystal blank forming the connection part of the first connection part and the first mounting terminal can be mitigated compared with a conventional device. Accordingly, in the crystal device according to the present invention, the stress concentration at the end part of the upper surface or lower surface of the crystal blank can be mitigated compared with a conventional device, it becomes possible to reduce peeling of the connection part at the end part of the crystal blank, and the apprehension of peeling of the first connection part at the end part of the crystal blank due to the stress concentration in a case where shrinkage stress caused when the conductive adhesive is hardened is applied to the first connection part can be reduced. Consequently, poor conduction between the first connection part and the first lead-out terminal or poor conduction between the first connection part and the first mounting terminal can be reduced. As a result, in the crystal device according to the present invention, it becomes possible to reduce an increase of equivalent series resistance value due to poor conduction between the first connection part and the first mounting terminal and between the first connection part and the first lead-out terminal.

BRIEF DESCRIPTION OF DRAWINGS

FIG. 2 A cross-sectional view taken along a II-II line in FIG. 1.

FIG. 10 A plan view when viewing the lower surface of the crystal wafer after a mounting terminal forming process in the method of production of a crystal device of the first embodiment from the upper surface through the crystal wafer.

DESCRIPTION OF EMBODIMENTS

First Embodiment

Figure 1:
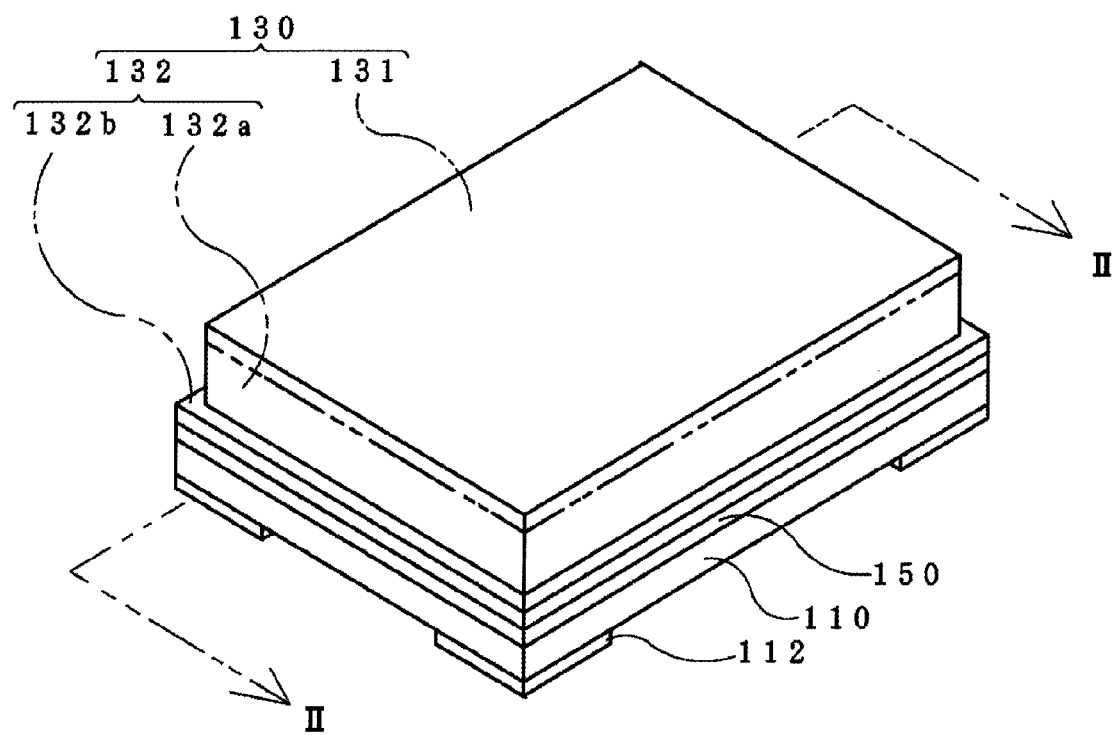
FIG. 1 A perspective view of a crystal device produced according to a method for production of a crystal device of a first embodiment.
Figure 3A:
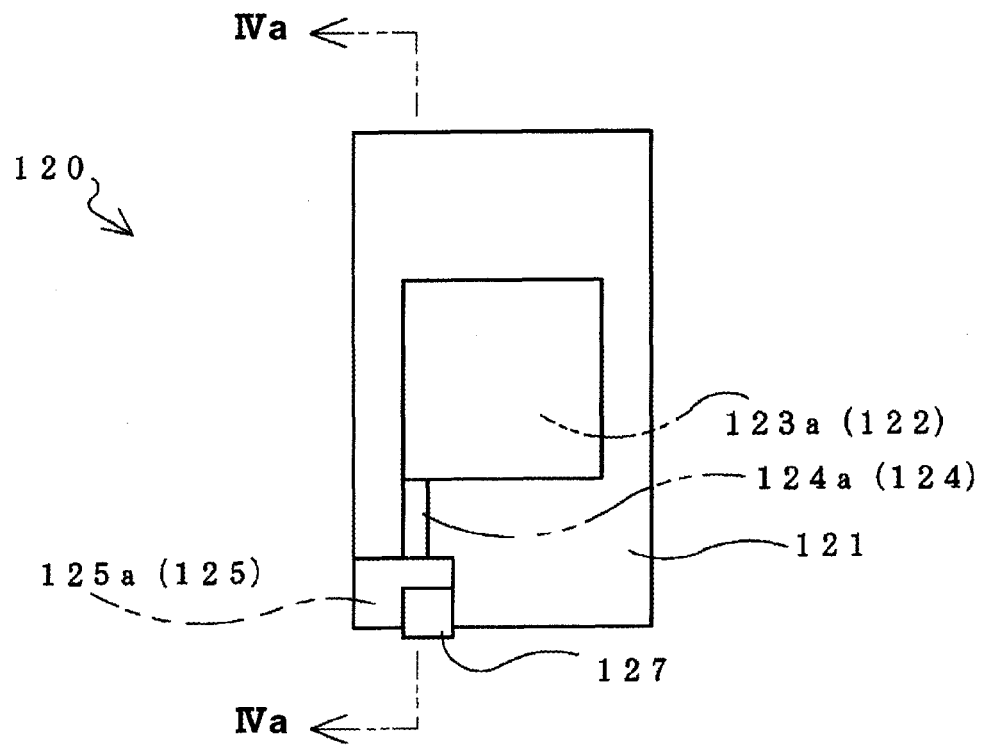
FIG. 3A is a plan view of an upper surface of a crystal element of the crystal device produced according to the method of production of a crystal device in the first embodiment.
Figure 3B:
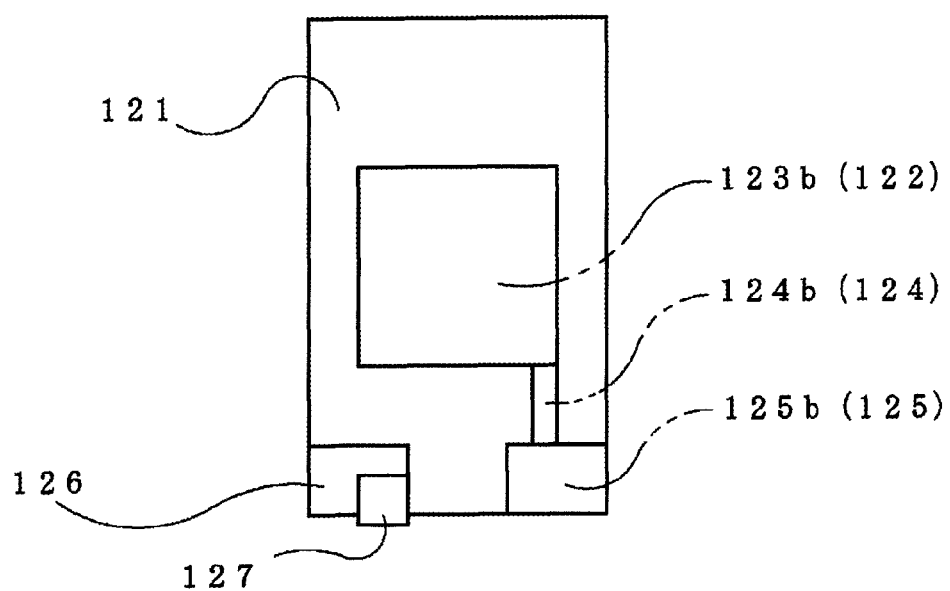
FIG. 3B is a plan view of a lower surface of a crystal element when viewing the crystal element of the crystal device produced according to the method of production of a crystal device of the first embodiment from the upper surface through the crystal element.

A crystal device which is produced by a method for production of a crystal device according to a first embodiment is, as shown in FIG. 1 to FIG. 4, constituted by a crystal element 120, a substrate 110 on which the crystal element 120 is mounted, and a lid 130 which is bonded to the substrate 110 and hermetically seals the crystal element 120 in a concave portion 133 which is formed with the substrate 110.

The substrate 110 is for mounting the crystal element 120. The substrate 110 is for example formed in a flat plate rectangular shape, has a pair of mounting pads 111 which are provided on one major surface, and has a plurality of external terminals 112 which are provided on the other major surface. Further, the substrate 110 is provided with wiring patterns (not shown) for electrically connecting the pair of mounting pads 111 and predetermined two external terminals 112. The substrate 110 is comprised of an insulating layer which is made of for example an alumina ceramic or glass ceramic or another ceramic material. The substrate 110 may be comprised by using one insulating layer or may be comprised by stacking a plurality of insulating layers. Here, matching with the drawings, the other major surface of the substrate 110 which is provided with the external terminals 112 will be defined as the "lower surface" of the substrate 110, and the one major surface of the substrate 110 which faces the opposite side from the lower surface of the substrate 110 will be defined as the "upper surface" of the substrate 110.

The mounting pads 111 are for mounting the crystal element 120 on the substrate 110. The mounting pads 111 are provided on the upper surface of the substrate 110 so that the two are aligned along the short side of the substrate 110 when viewing the upper surface of the substrate 110 on a plane.

The external terminals 112 are for mounting the crystal device on a mother board of electronic equipment or the like and are connected and fixed to predetermined mounting pads (not shown) which are formed on the mother board when mounting the crystal device on the mother board of the electronic equipment or the like. For example, four external terminals are provided and are arranged one each at the four corners of the lower surface of the substrate 110. Two among the external terminals 112 are electrically connected to the pair of mounting pads 111 which are provided on the upper surface of the substrate 110 by wiring pattern (not shown) of the substrate 110. For example, in the substrate 110, when viewing the upper surface of the substrate 110 on a plane, the dimension of the long side becomes 0.6 to 5.0 mm, and the dimension of the short side becomes 0.4 to 3.2 mm.

Further, here, a method for preparing the substrate 110 will be explained. When the substrate 110 is made of an alumina ceramic, first, a suitable organic solvent or the like is added to a predetermined ceramic material powder and mixed to prepare a plurality of ceramic green sheets. Further, on the surfaces of the ceramic green sheets or in through holes which are provided in advance by punching the ceramic green sheets, a predetermined conductive paste which becomes the conductor patterns is coated by using a conventionally known screen printing or the like. Next, in the case where a plurality of insulating layers are stacked, the ceramic green sheets are stacked, pressed, and fired at a high temperature. After firing, predetermined positions of the conductor patterns, specifically portions which become the mounting pads 111, external terminals 112, and wiring patterns are plated by nickel plating or gold plating or the like, whereby the substrate 110 is prepared. Further, the conductor paste is comprised of a sintered body of for example tungsten, molybdenum, copper, silver, palladium, or another metal powder.

The crystal element 120 is for obtaining a stable mechanical vibration and transmitting a reference signal of electronic equipment or the like. The crystal element 120 consists of a crystal blank 121 and predetermined metal patterns which are formed on the surfaces of the crystal blank 121, specifically excitation electrode parts 122 (123*a*, 123*b*), wiring parts 124 (124*a*, 124*b*), lead-out terminals 125 (125*a*, 125*b*), a first mounting terminal 126, and a first connection part 127. Further, the crystal element 120 is mounted on the upper surface of the substrate 110 by a conductive adhesive 140 so that part of the predetermined metal patterns which are formed on the surfaces of the crystal blank 121, specifically the second lead-out terminal 125*b* and first mounting pad 126, are electrically connected to the mounting pads 111 on the substrate 110 and thereby held.

Here, matching with the drawings, when mounted on the substrate 110, the surface of the crystal blank 121 which faces the substrate 110 will be defined as the "lower surface" of the crystal blank 121, and the surface of the crystal blank 121 which faces the opposite side from the lower surface of the crystal blank 121 will be defined as the "upper surface" of the crystal blank 121. Further, the upper surface of the crystal blank 121 and the lower surface of the crystal blank 121 will be defined as the "major surfaces" of the crystal blank 121.

The crystal blank 121 is formed using a piezoelectric material which stably mechanically vibrates, for example, using crystal, by using a photolithography technique and etching technique. The crystal blank 121 has crystal axes consisting of an X-axis, Y-axis and Z-axis which are perpendicular to each other and for example exhibits a rectangular flat plate shape. The major surfaces of the crystal blank 121 are parallel to a plane which is obtained by rotating a plane parallel to the X-axis and Z-axis around the X-axis in a counterclockwise direction when viewing the negative direction of the X-axis, for example, rotating the plane by 37°. In a portion of the side surface of the crystal blank 121, an m-surface (not shown) which is parallel to the Z-axis is formed. The angle of the m-surface which is formed together with the major surface of the crystal blank 121 becomes the angle obtained by adding 90° and the rotation angle and becomes for example about 127°. For this reason, in the crystal blank 121, at the time when voltage is applied to the two major surfaces of the crystal blank 121 to cause thickness slip vibration, the vibration state can be changed at the end part of the crystal blank 121 having the m-surface formed thereon, therefore it becomes possible to increase attenuation of the vibration displacement at the end part of the crystal blank 121. For this reason, an increase of the crystal impedance value or equivalent series resistance value of the crystal device can be reduced, so it becomes possible to improve the productivity.

The predetermined metal patterns which are formed on the surfaces of the crystal blank 121 are for applying voltage to the crystal blank 121 from the outside of the crystal blank 121. Further, the predetermined metal patterns which are formed on the surface of the crystal blank 121 are constituted by excitation electrode parts 122 (123*a*, 123*b*), wiring parts 124 (124*a*, 124*b*), lead-out terminals 125 (125*a*, 125*b*), a first mounting terminal 126, and a first connection part 127.

Figure 29:
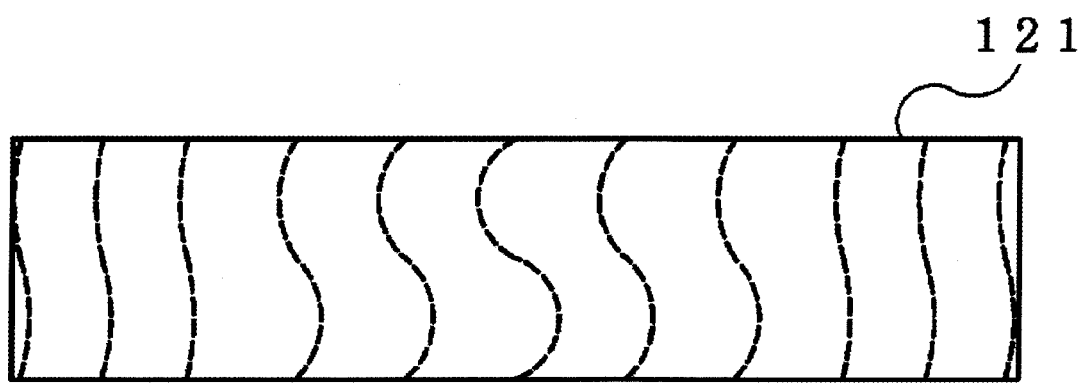
FIG. 29 An image showing an image of the vibration state of a thickness slip vibration.

The excitation electrode parts 122 are for creating an inverse piezoelectric effect and piezoelectric effect in a portion of the crystal blank 121 to cause mechanical vibration in the portion of the crystal blank 121. The excitation electrode parts 122 are provided at predetermined portions of the crystal blank 121 by a photolithography technique and etching technique. Further, the excitation electrode parts 122 are constituted by the first excitation electrode part 123*a* and second excitation electrode part 123*b*. The first excitation electrode part 123*a* is provided on the upper surface of the crystal blank 121 and forms a schematically rectangular shape when viewing the upper surface of the crystal blank 121 on a plane. The second excitation electrode part 123*b* is provided on the lower surface of the crystal blank 121 so as to face the first excitation electrode part 123*a*. Further, the second excitation electrode part 123*b* forms a schematically rectangular shape when viewing the lower surface of the crystal blank 121 on a plane. By applying voltage to the first excitation electrode part 123*a* which is provided on the upper surface of the crystal blank 121 and the second excitation electrode part 123*b* which is provided on the lower surface of the crystal blank 121, an electric field is generated between the first excitation electrode part 123*a* and the second excitation electrode part 123*b* and, as shown in FIG. 29, a thickness slip vibration of vibration in the up-and-down direction of the crystal blank 121 (direction from the upper surface of the crystal blank 121 toward the lower surface of the crystal blank 121) can be caused.

The wiring parts 124 are connected at one end to the excitation electrode parts 122 and are for applying voltage to the excitation electrode parts 122. The wiring parts 124 are formed by a photolithography technique and etching technique at predetermined portions of the crystal blank 121 and are constituted by the first wiring part 124*a* and second wiring part 124*b*. The first wiring part 124*a* extends on the upper surface of the crystal blank 121 from the first excitation electrode part 123*a* to the edge part side of the upper surface of the crystal blank 121. In other words, the first wiring part 124*a* is formed on the upper surface of the crystal blank 121 so that one end is connected to the first excitation electrode part 123*a* and the other end is positioned on the edge part side of the upper surface of the crystal blank 121. The second wiring part 124*b* extends on the lower surface of the crystal blank 121 from the second excitation electrode part 123*b* to the edge part side of the lower surface of the crystal blank 121. In other words, the second wiring part 124*b* is formed on the lower surface of the crystal blank 121 so that one end is connected to the second excitation electrode part 123*b* and the other end is positioned on the edge part side of the lower surface of the crystal blank 121.

The lead-out terminals 125 are formed at predetermined portions of the crystal blank 121 by a photolithography technique and etching technique, and are constituted by the first lead-out terminal 125*a* and second lead-out terminal 125*b*. The first lead-out terminal 125*a* is formed at the edge part of the upper surface of the crystal blank 121 so as to be connected to the other end of the first wiring part 124*a*. The second lead-out terminal 125*b* is formed at the edge part of the lower surface of the crystal blank 121 so as to be connected to the other end of the second wiring part 124*b*. The second lead-out terminal 125*b* is electrically bonded to the mounting pad 111 which is provided on the substrate 110 by the conductive adhesive 140.

The first mounting terminal 126 is formed at the edge part of the lower surface of the crystal blank 121 at a position which faces the first lead-out terminal 125*a*. The first mounting terminal 126 is formed at a predetermined portion of the lower surface of the crystal blank 121 by a photolithography technique and etching technique. The first mounting terminal 126 is formed so that two components, i.e., this and the second lead-out terminal 125*b*, are aligned along the predetermined single side of the crystal blank 121, specifically the edge part of a single short side when viewing the lower surface of the crystal blank 121 on a plane. The first mounting terminal 126 is electrically bonded to a mounting pad 111 which is provided on the substrate 110 by the conductive adhesive 140.

Figure 4A:
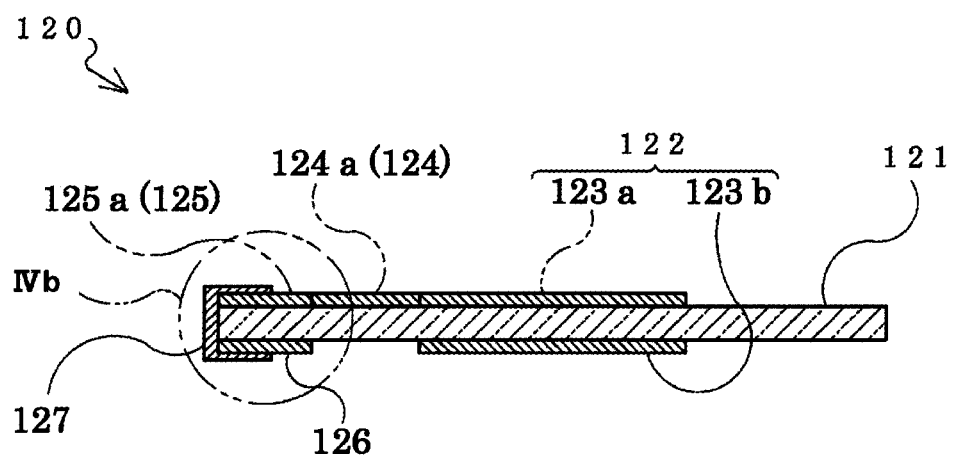
FIG. 4A is a cross-sectional view taken along an Iva-Iva cross-section in FIG. 3A.
Figure 4B:
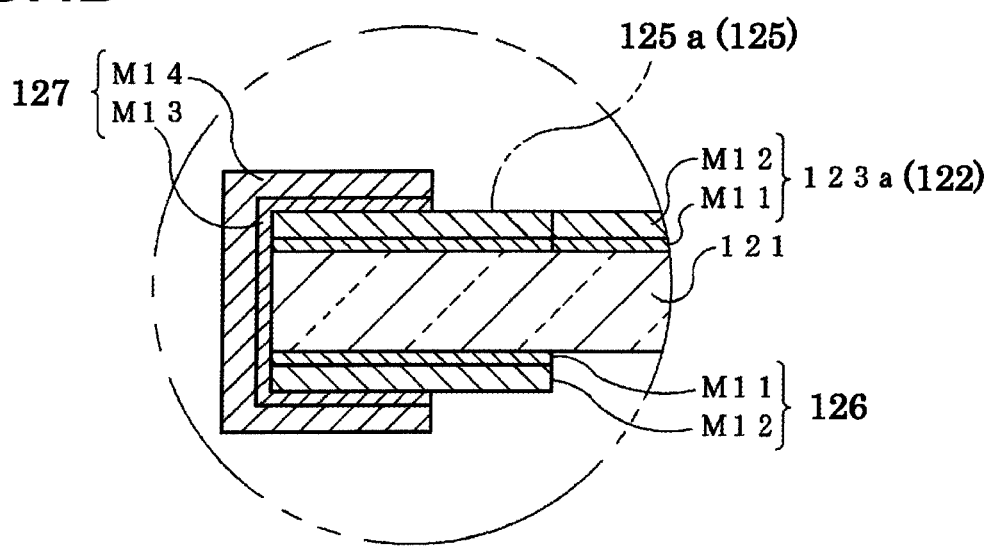
FIG. 4B is a partially enlarged view of a range of IVb shown in FIG. 4A.
Figure 5:
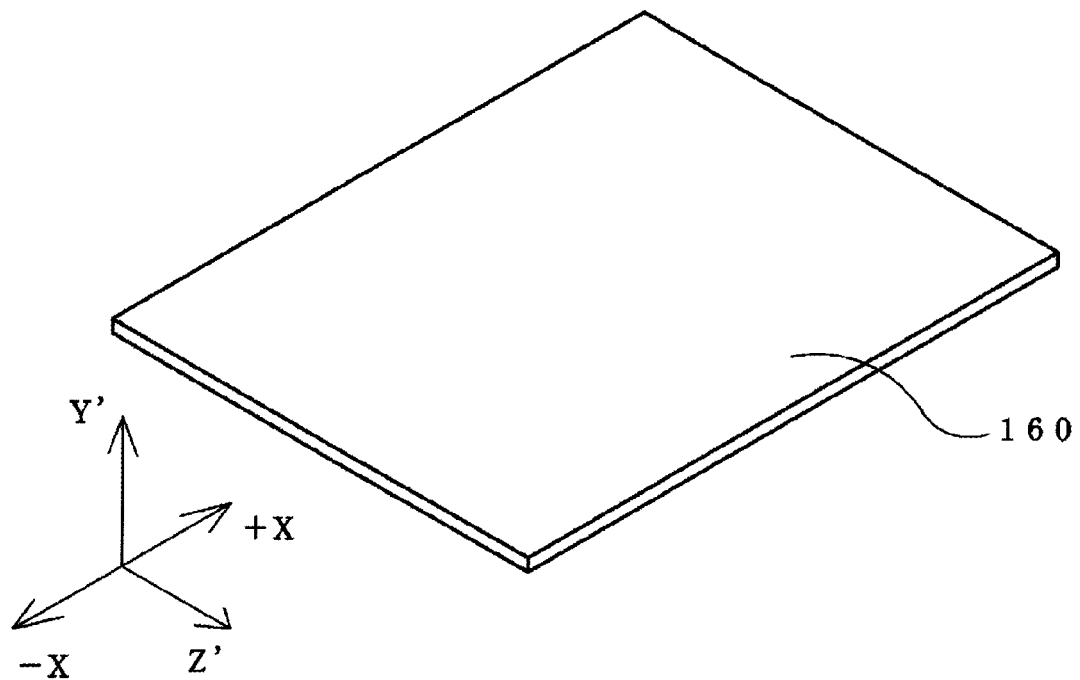
FIG. 5 A perspective view of a crystal wafer after a crystal wafer forming process in the method of production of a crystal device of the first embodiment.
Figure 6:
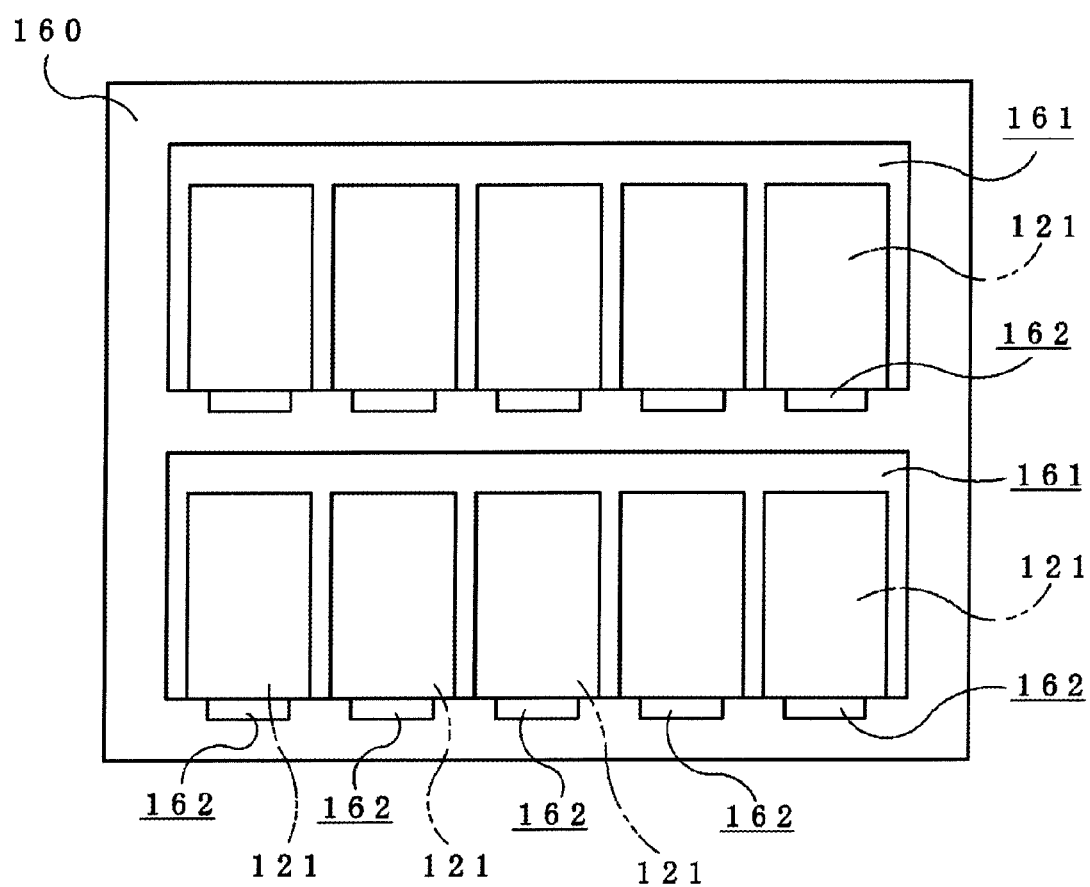
FIG. 6 A plan view of the crystal wafer after a crystal blank part forming process in the method of production of a crystal device of the first embodiment.
Figure 7A:
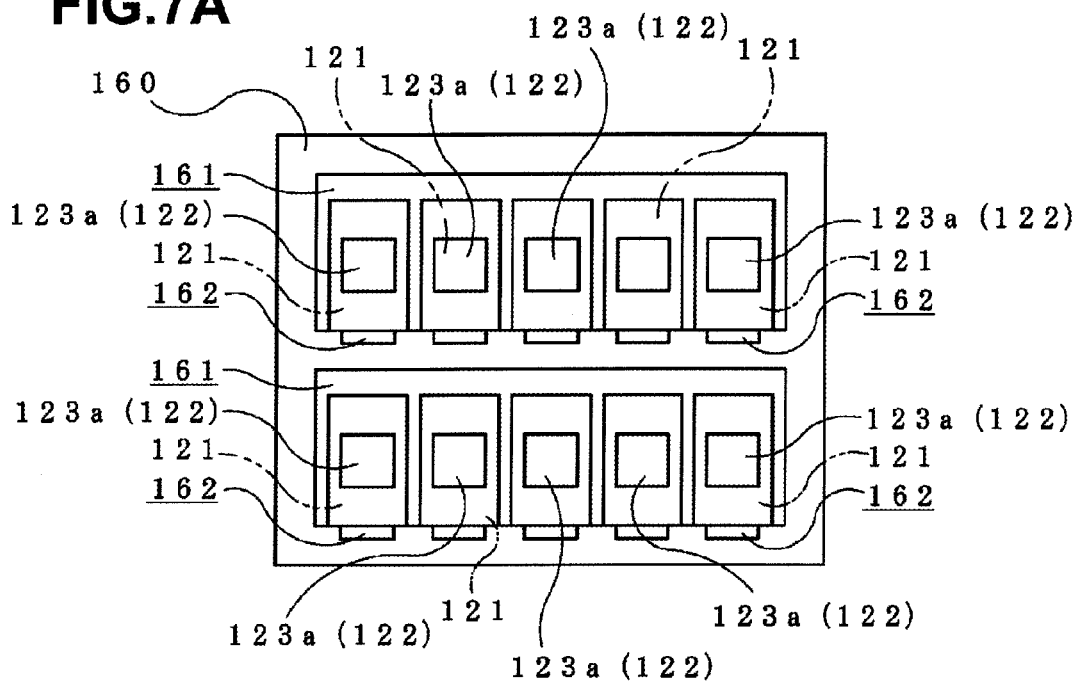
FIG. 7A is a plan view of an upper surface of the crystal wafer after an excitation electrode part forming process in the method of production of a crystal device of the first embodiment.
Figure 7B:
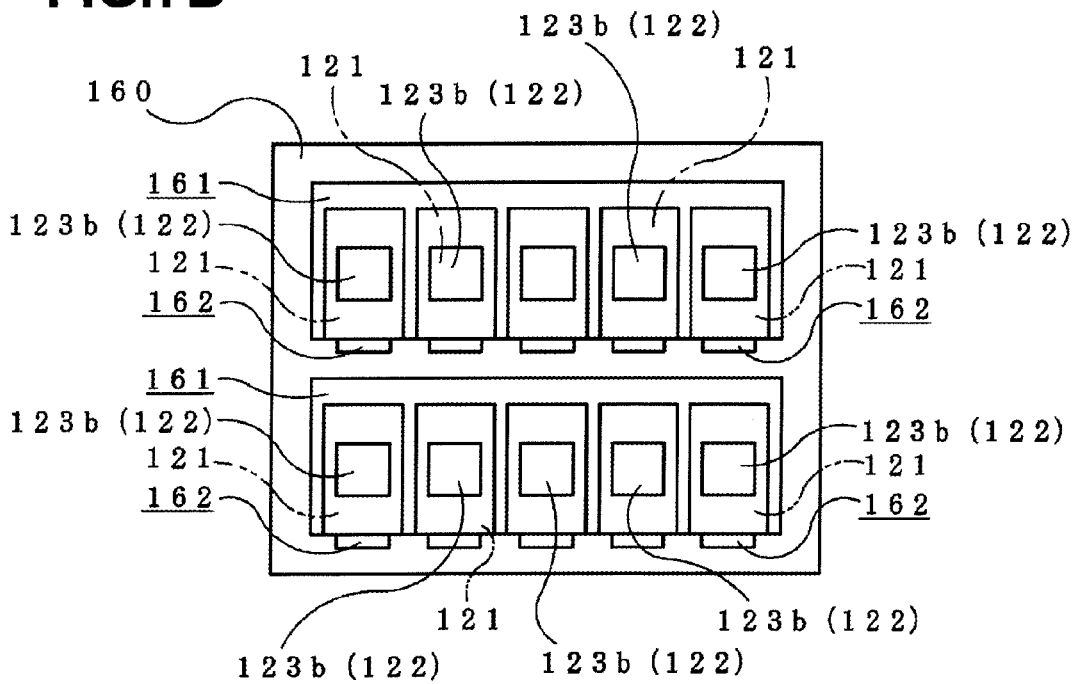
FIG. 7B is a plan view when viewing a lower surface of the crystal wafer in the excitation electrode part forming process in the method of production of a crystal device of the first embodiment from the upper surface through the crystal wafer.
Figure 8A:
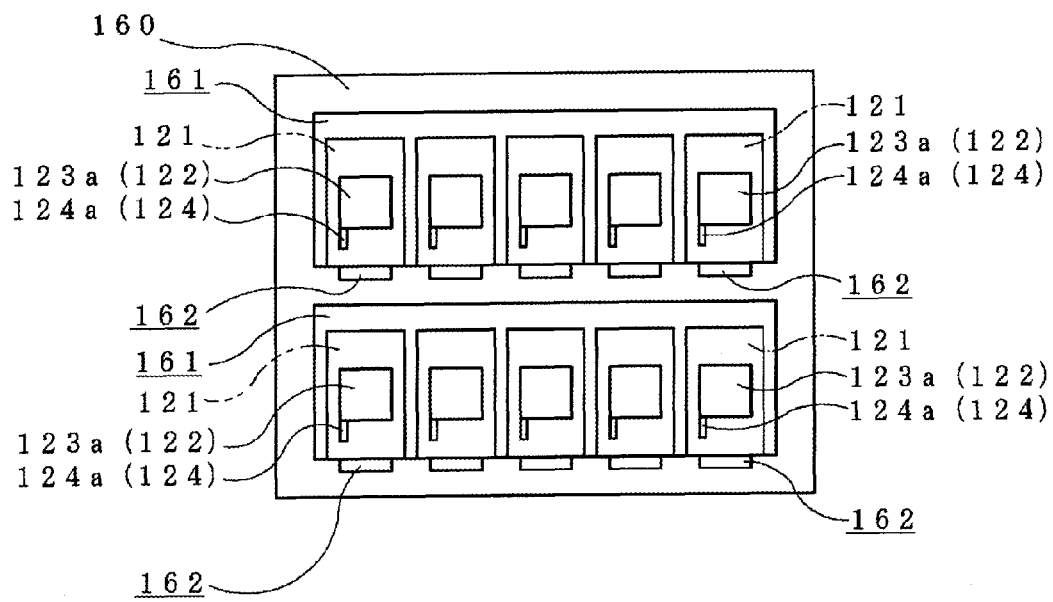
FIG. 8A is a plan view of the upper surface of the crystal wafer after a wiring part forming process in the method of production of a crystal device of the first embodiment.
Figure 8B:
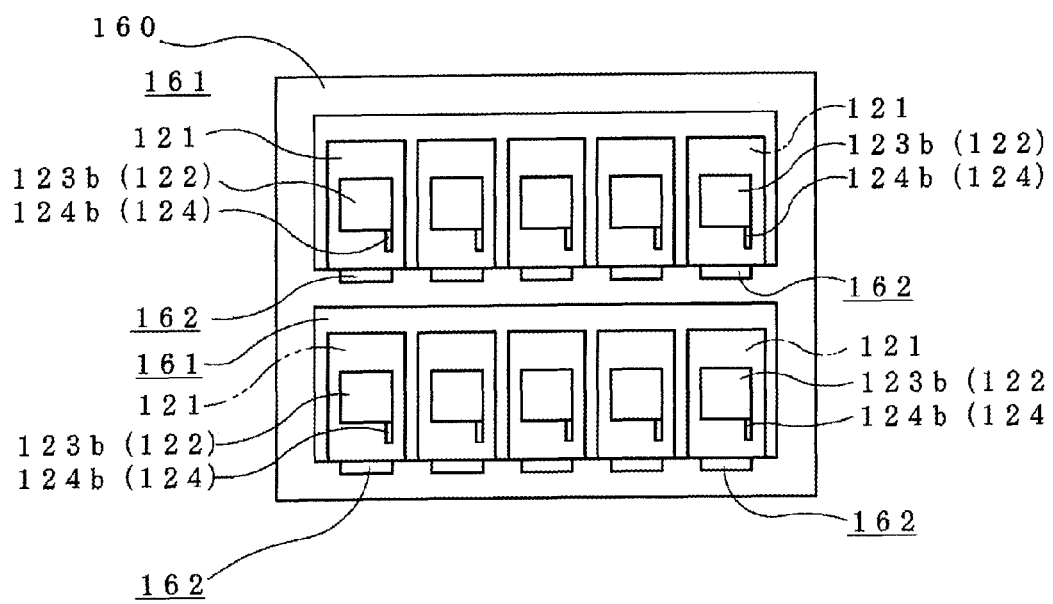
FIG. 8B is a plan view when viewing the lower surface of the crystal wafer after the wiring part forming process in the method of production of a crystal device of the first embodiment from the upper surface through the crystal wafer.
Figure 9A:
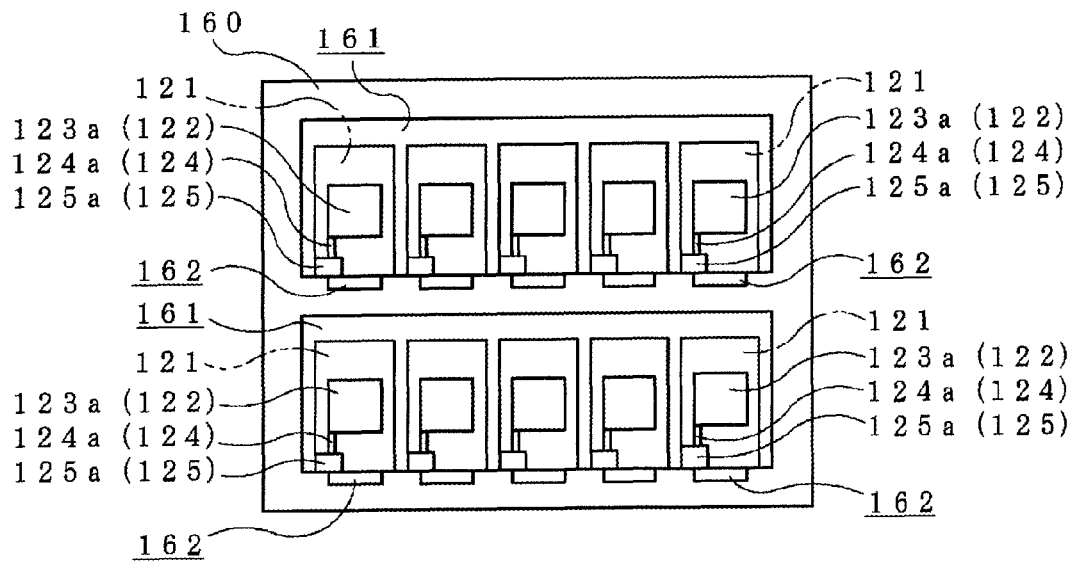
FIG. 9A is a plan view of the upper surface of the crystal wafer after a lead-out terminal forming process in the method of production of a crystal device of the first embodiment.
Figure 9B:
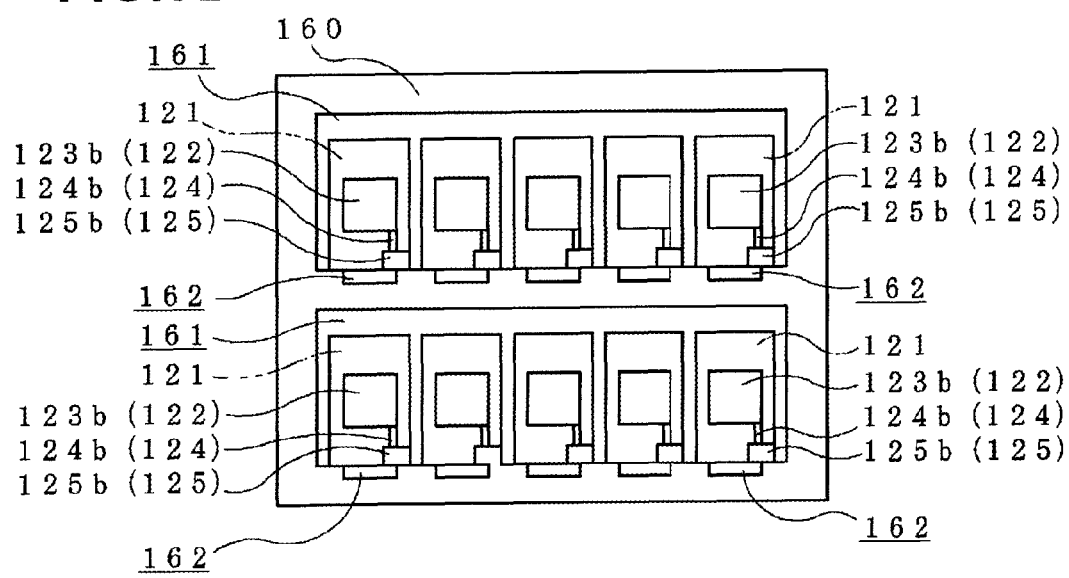
FIG. 9B is a plan view when viewing the lower surface of the crystal wafer after the lead-out terminal forming process in the method of production of a crystal device of the first embodiment from the upper surface through the crystal wafer.
Figure 11A:
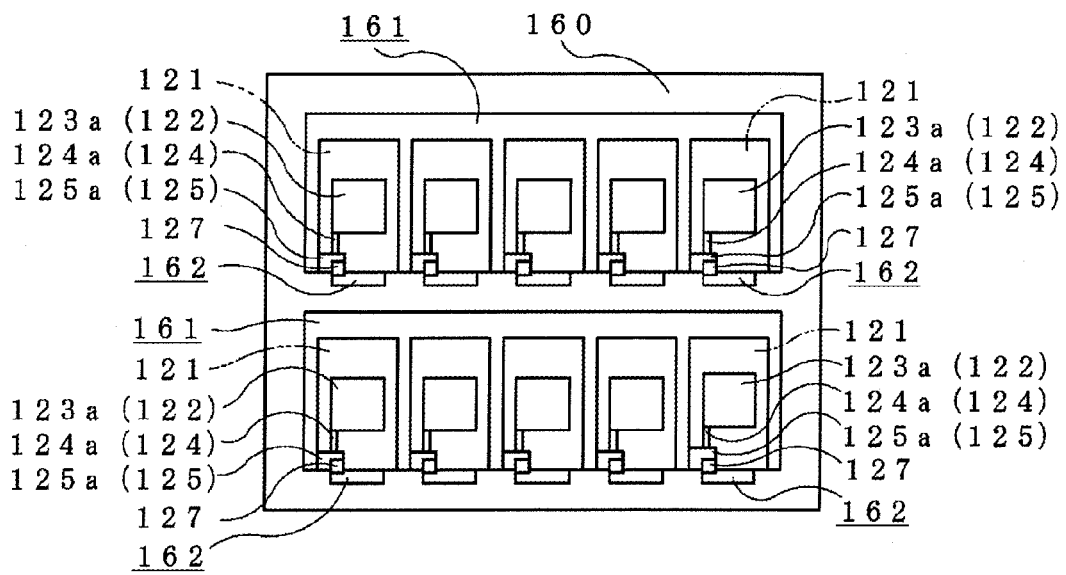
FIG. 11A is a plan view of the upper surface of the crystal wafer after a connection part forming process in the method of production of a crystal device of the first embodiment.
Figure 11B:
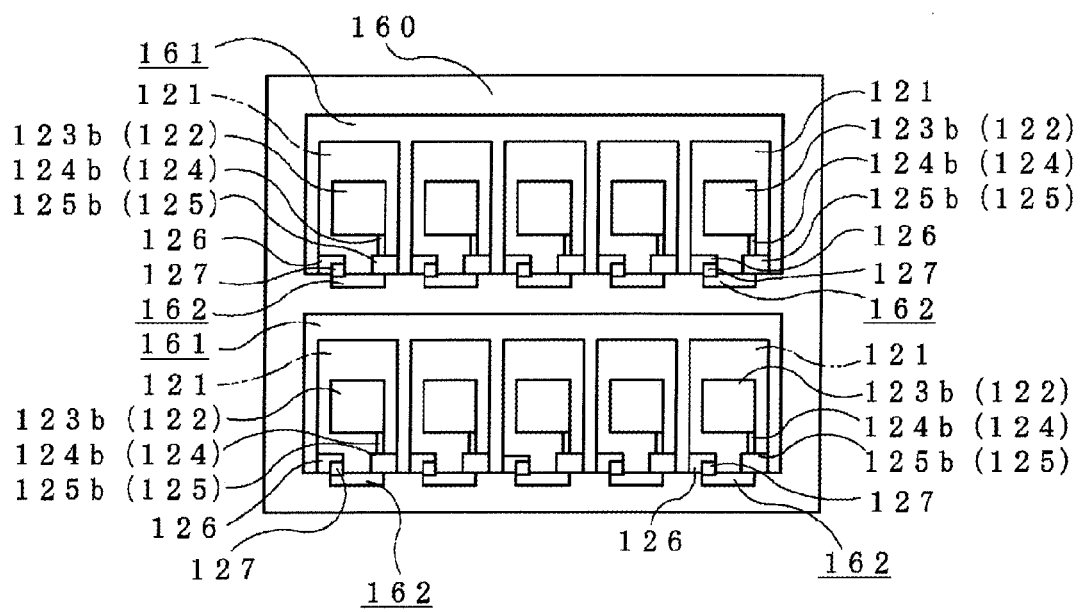
FIG. 11B is a plan view when viewing the lower surface of the crystal wafer after the connection part forming process in the method of production of a crystal device of the first embodiment from the upper surface through the crystal wafer.
Figure 12A:
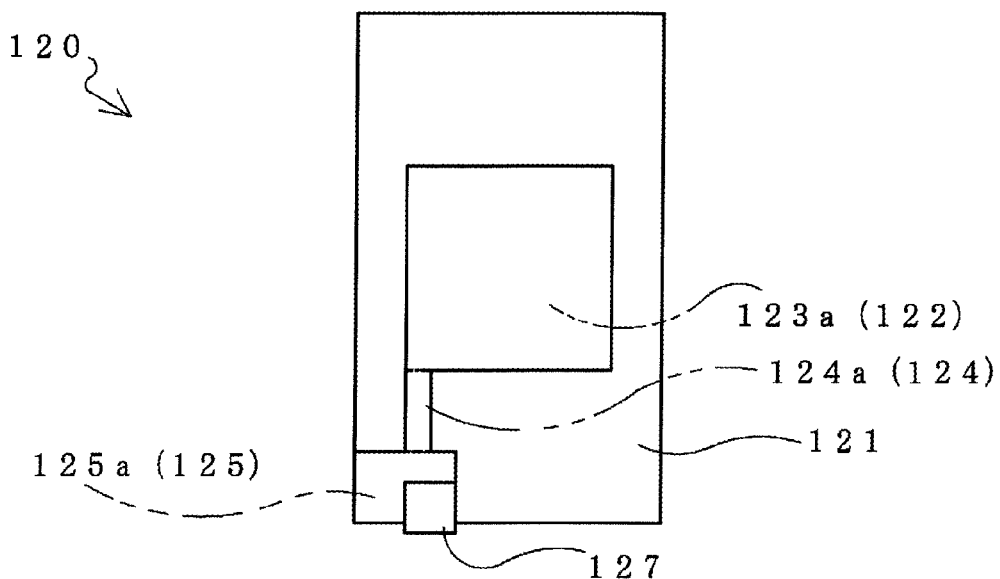
FIG. 12A is a plan view of the upper surface of a crystal blank which is segmented by a segmentation process in the method of production of a crystal device of the first embodiment.
Figure 12B:
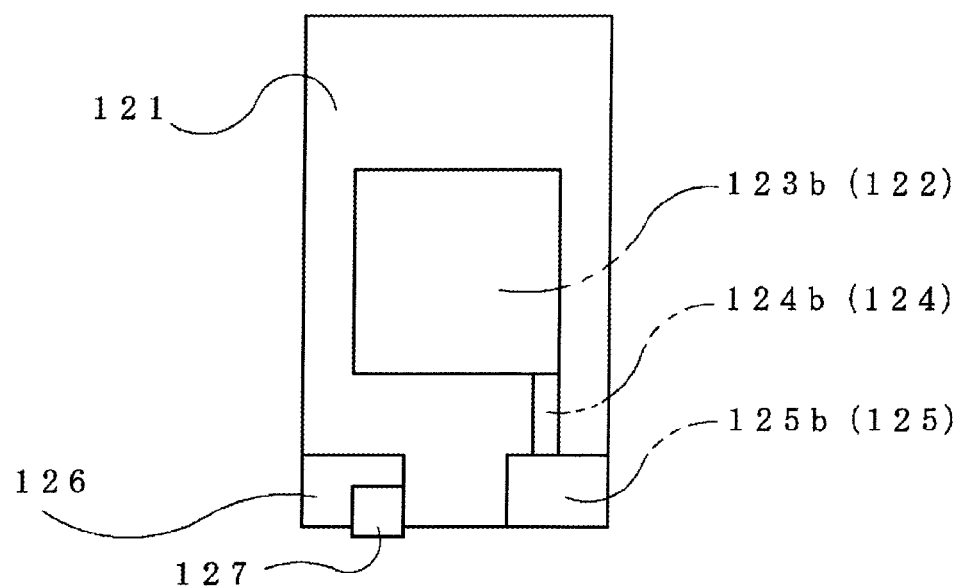
FIG. 12B is a plan view when viewing the lower surface of the crystal blank which is segmented by the segmentation process in the method of production of a crystal device of the first embodiment from the upper surface through the crystal blank.
Figure 13:
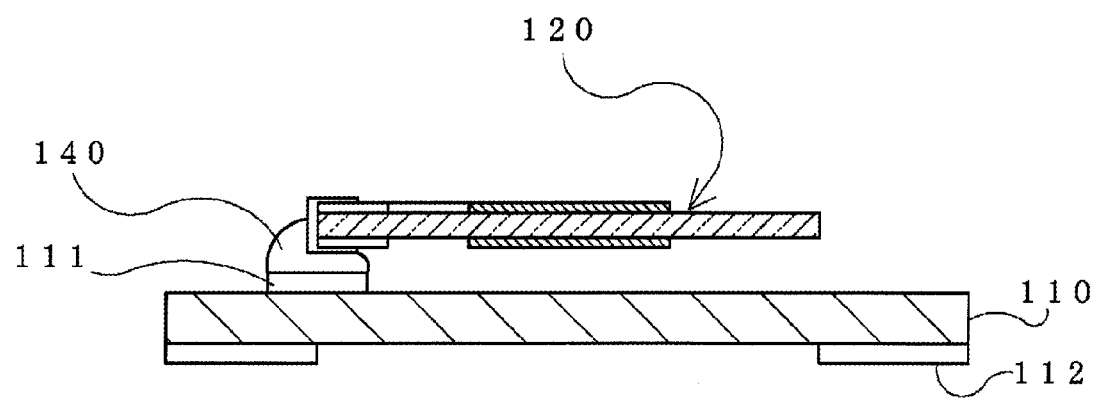
FIG. 13 A cross-sectional view after a mounting process in the method of production of a crystal device of the first embodiment.
Figure 14:
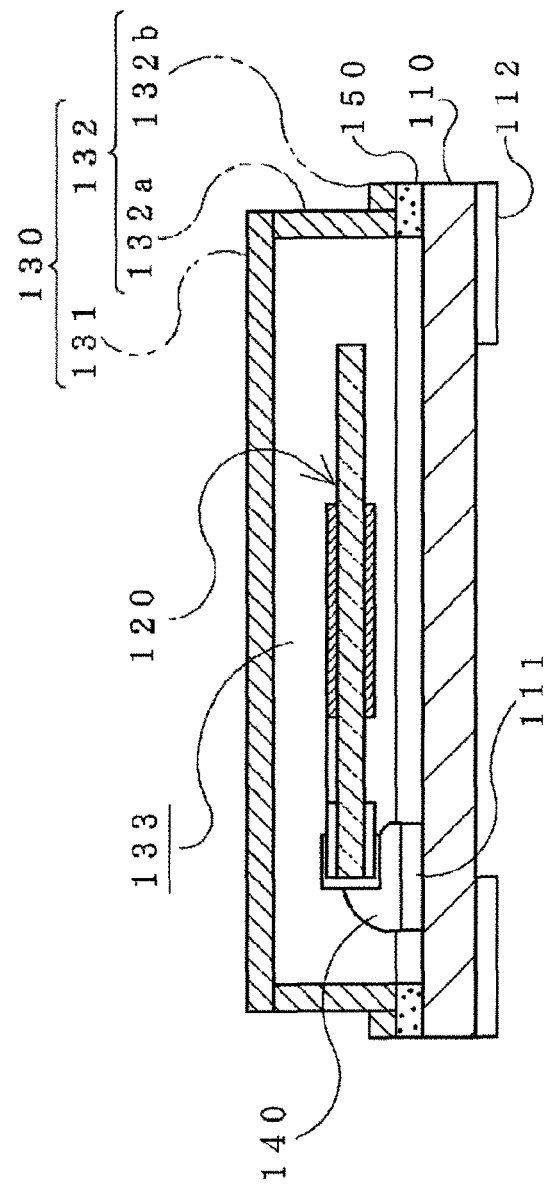
FIG. 14 A cross-sectional view after a lid bonding process in the method of production of a crystal device of the first embodiment.
Figure 15:
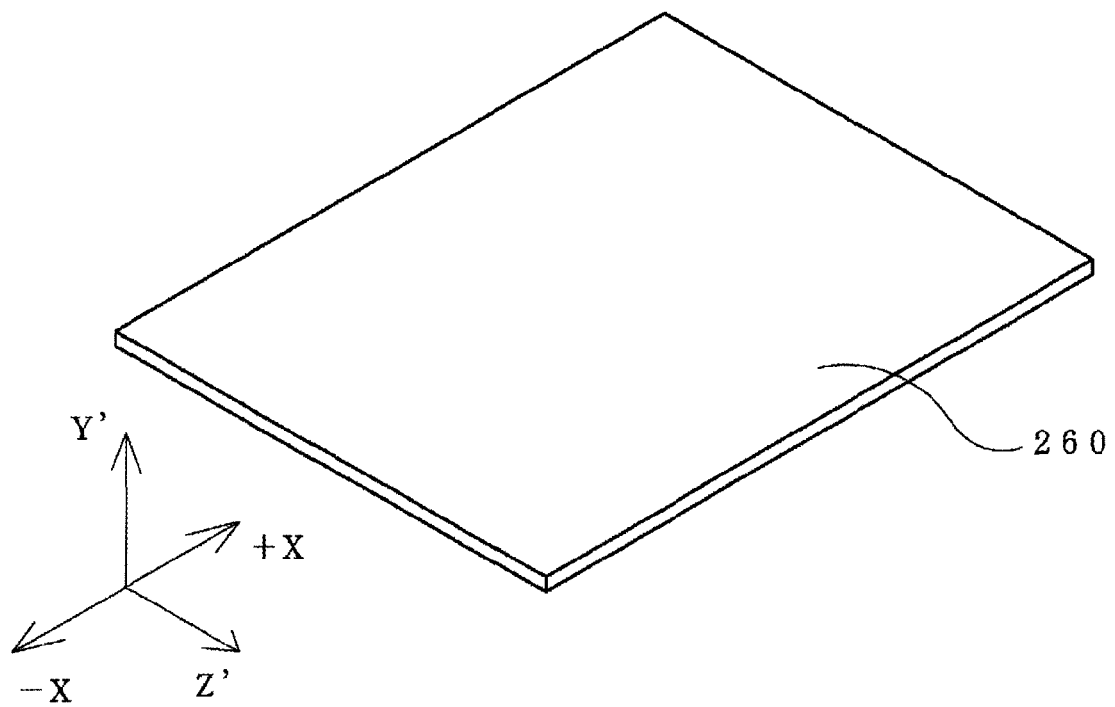
FIG. 15 A perspective view of a crystal wafer after the crystal wafer forming process in a method of production of a crystal device of a second embodiment.
Figure 16:
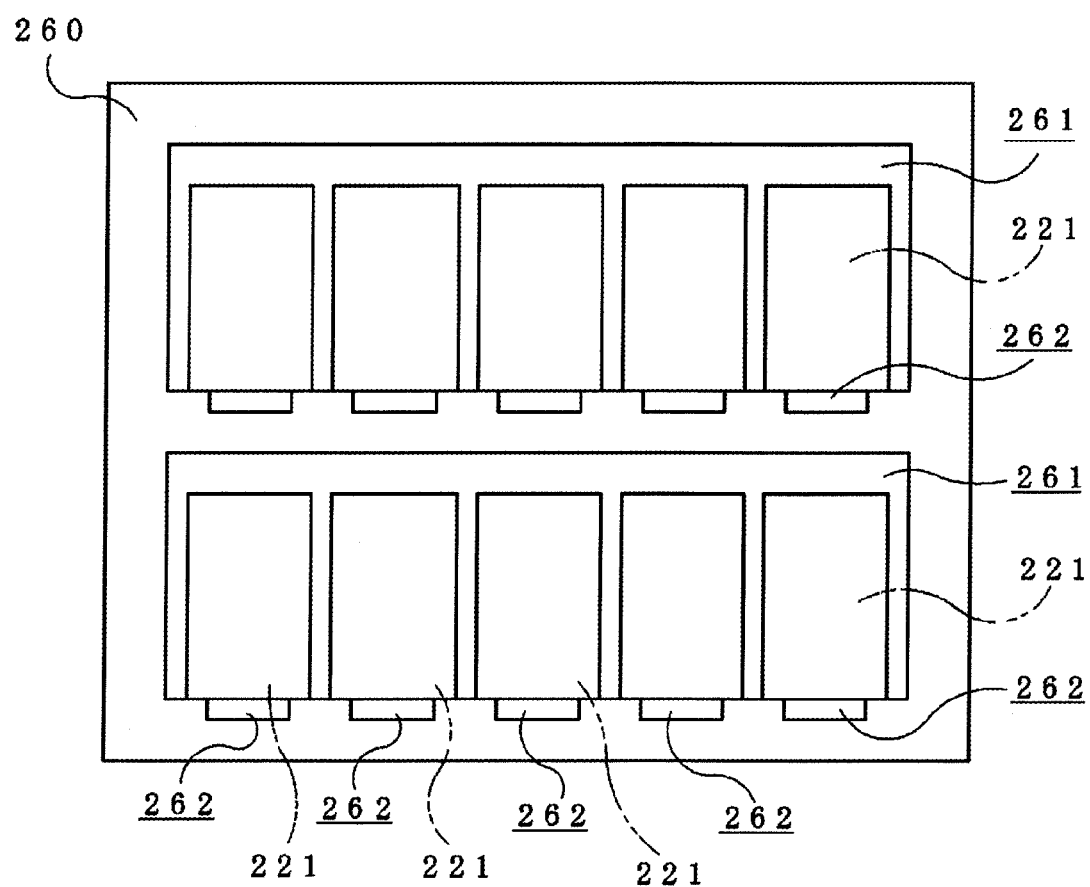
FIG. 16 A plan view of the crystal wafer after the crystal blank part forming process in the method of production of a crystal device of the second embodiment.
Figure 17A:
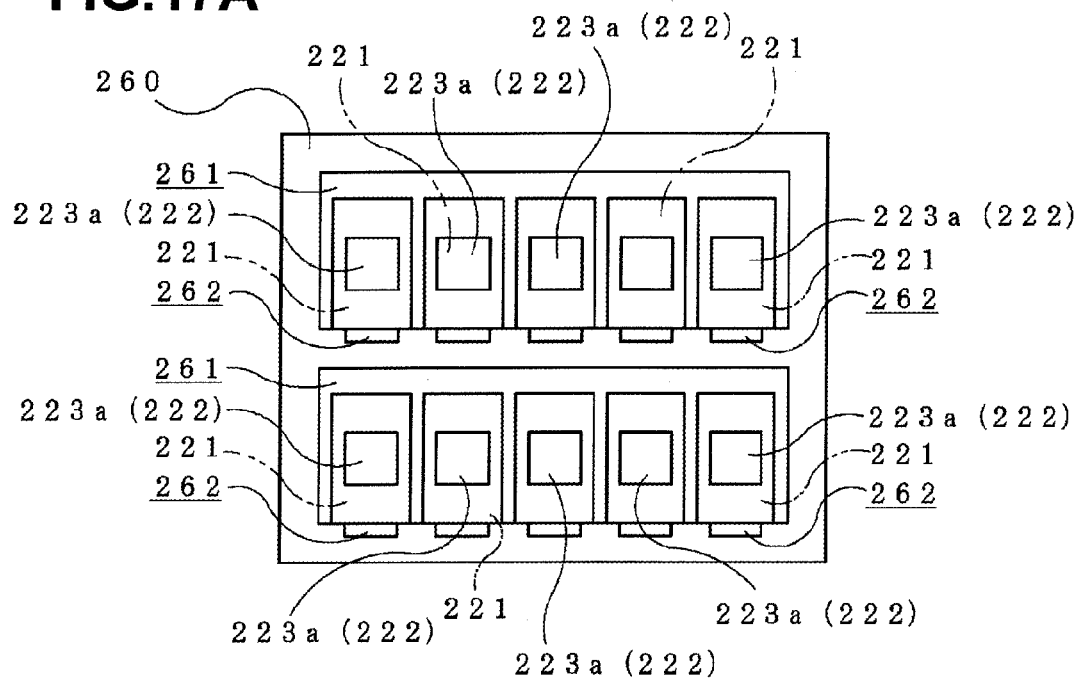
FIG. 17A is a plan view of the upper surface of the crystal wafer after the excitation electrode part forming process in the method of production of a crystal device of the second embodiment.
Figure 17B:
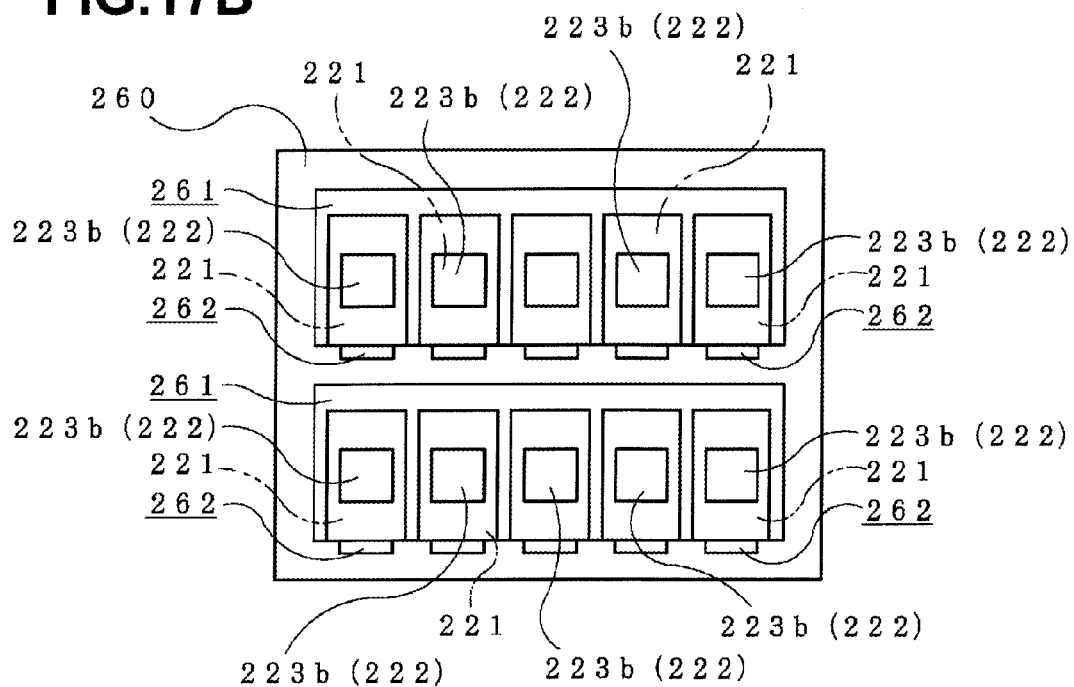
FIG. 17B is a plan view when viewing the lower surface of the crystal wafer after the excitation electrode part forming process in the method of production of a crystal device of the second embodiment from the upper surface through the crystal wafer.
Figure 18A:
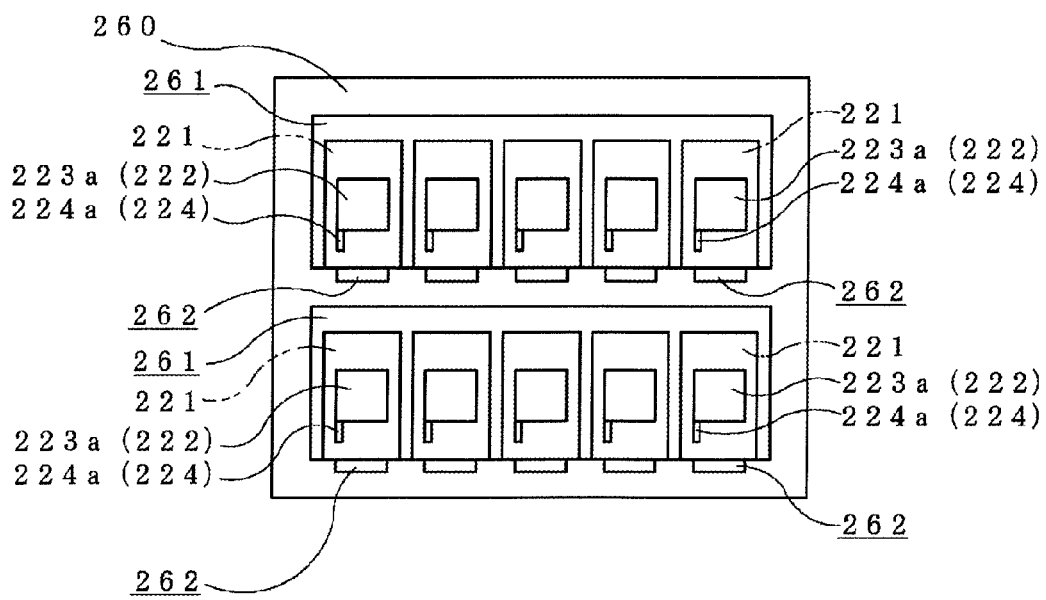
FIG. 18A is a plan view of the upper surface of the crystal wafer after the wiring part forming process in the method of production of a crystal device of the second embodiment.
Figure 18B:
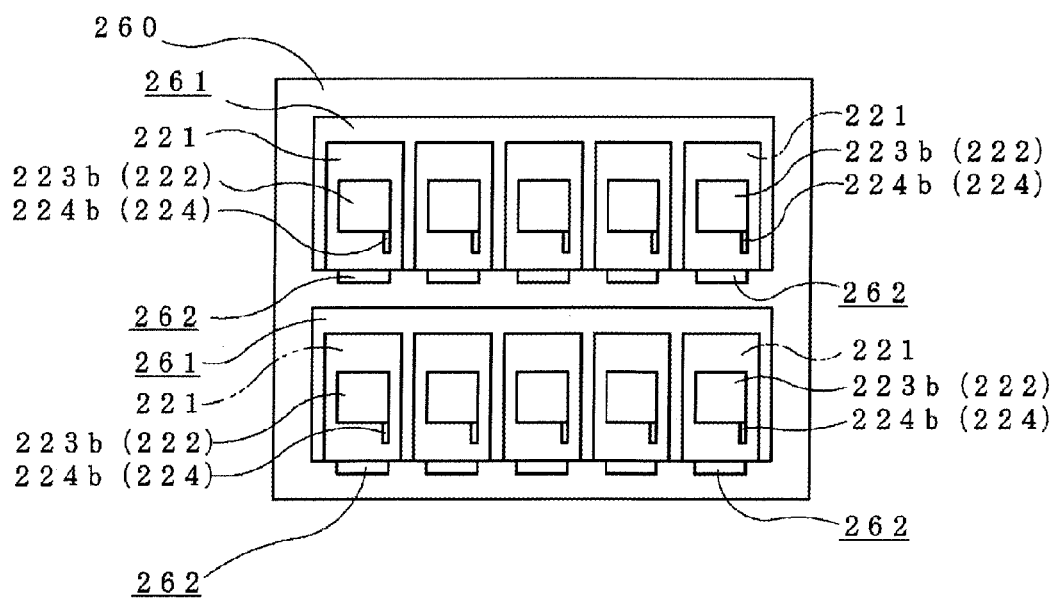
FIG. 18B is a plan view when viewing the lower surface of the crystal wafer after the wiring part forming process in the method of production of a crystal device of the second embodiment from the upper surface through the crystal wafer.
Figure 19A:
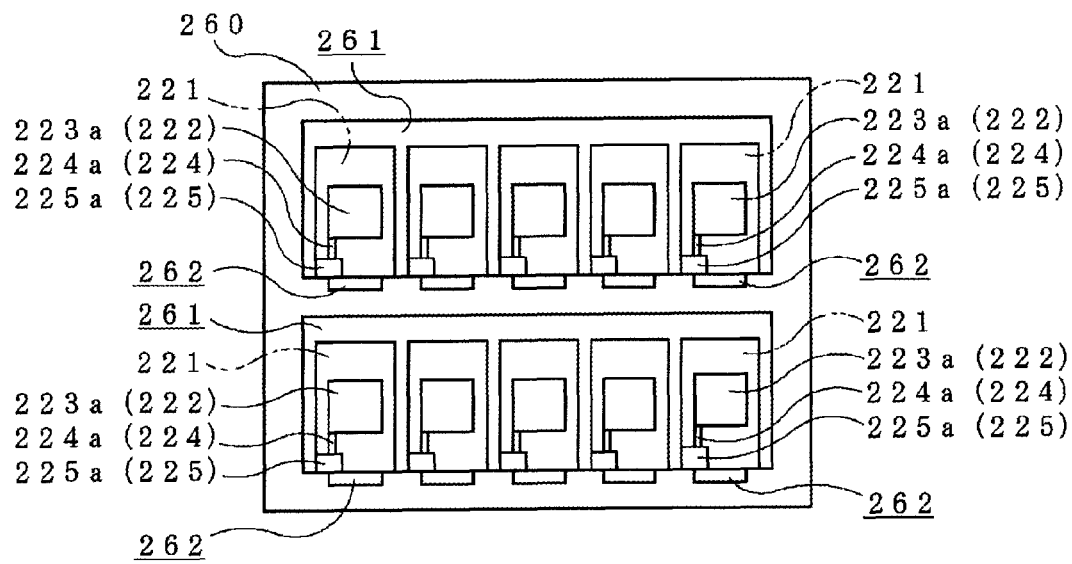
FIG. 19A is a plan view of the upper surface of the crystal wafer after the lead-out terminal forming process in the method of production of a crystal device of the second embodiment.
Figure 19B:
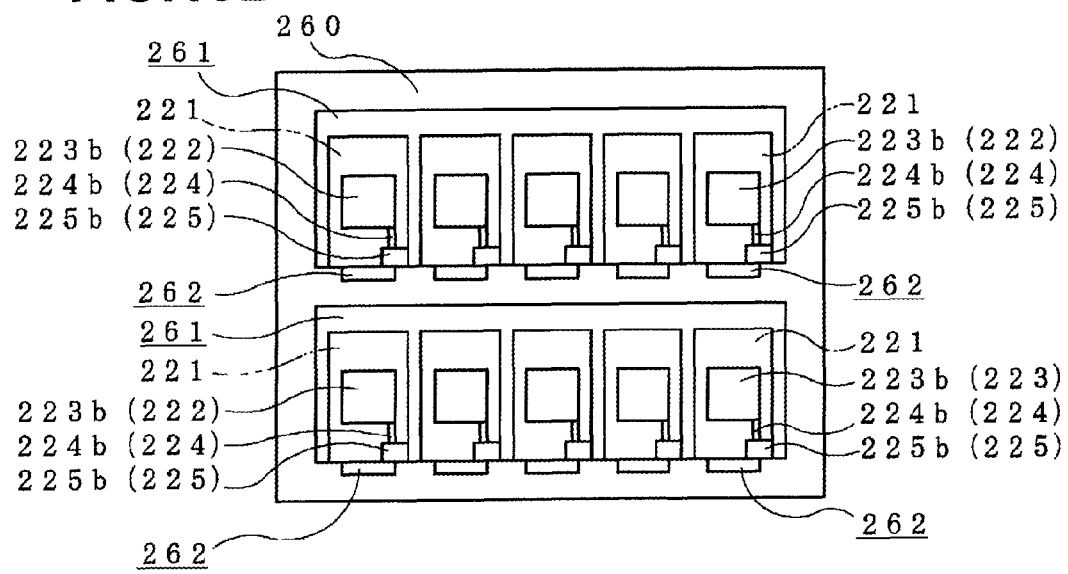
FIG. 19B is a plan view when viewing the lower surface of the crystal wafer after the lead-out terminal forming process in the method of production of a crystal device of the second embodiment from the upper surface through the crystal wafer.
Figure 20A:
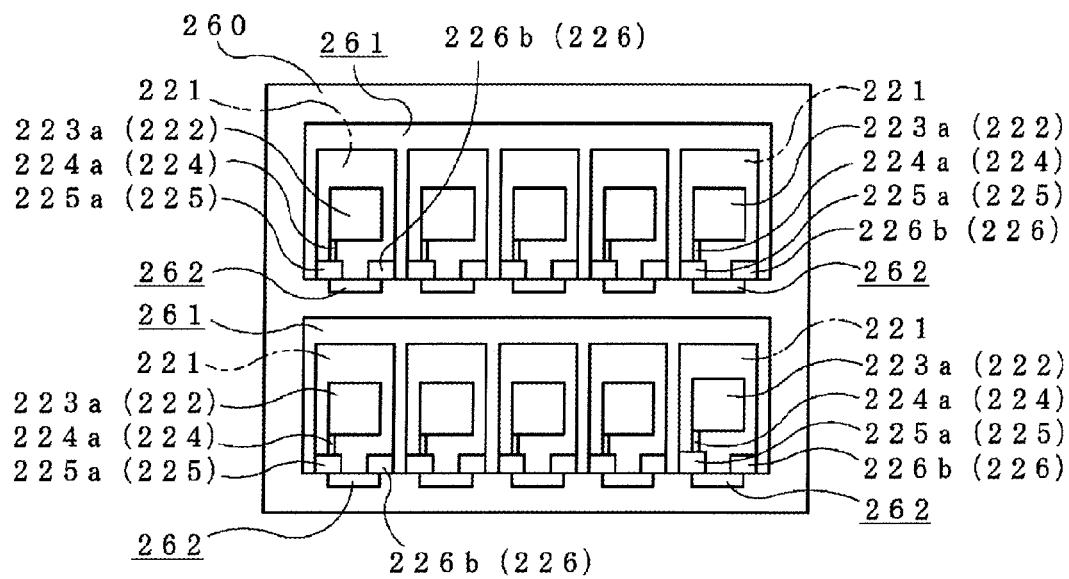
FIG. 20A is a plan view of the upper surface of the crystal wafer after the mounting terminal forming process in the method of production of a crystal device of the second embodiment.
Figure 20B:
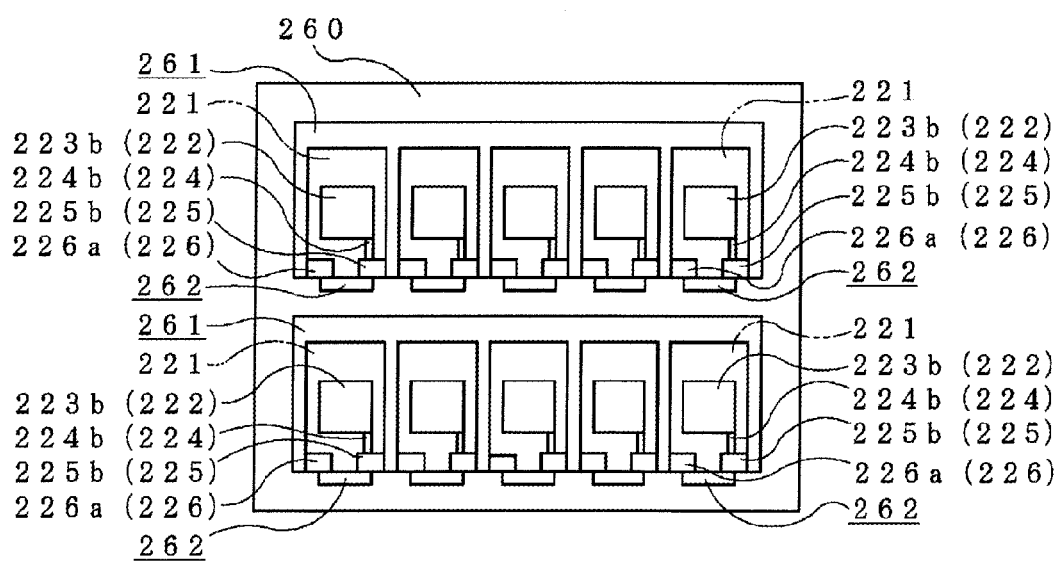
FIG. 20B is a plan view when viewing the lower surface of the crystal wafer after the mounting terminal forming process in the method of production of a crystal device of the second embodiment from the upper surface through the crystal wafer.
Figure 21A:
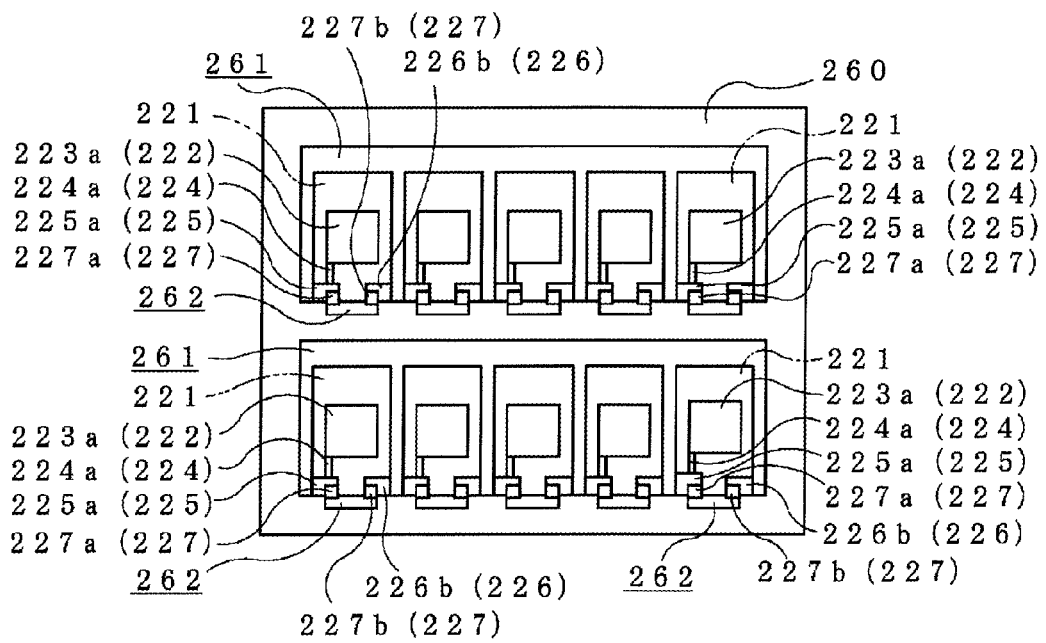
FIG. 21A is a plan view of the upper surface of the crystal wafer after the connection part forming process in the method of production of a crystal device of the second embodiment.
Figure 21B:
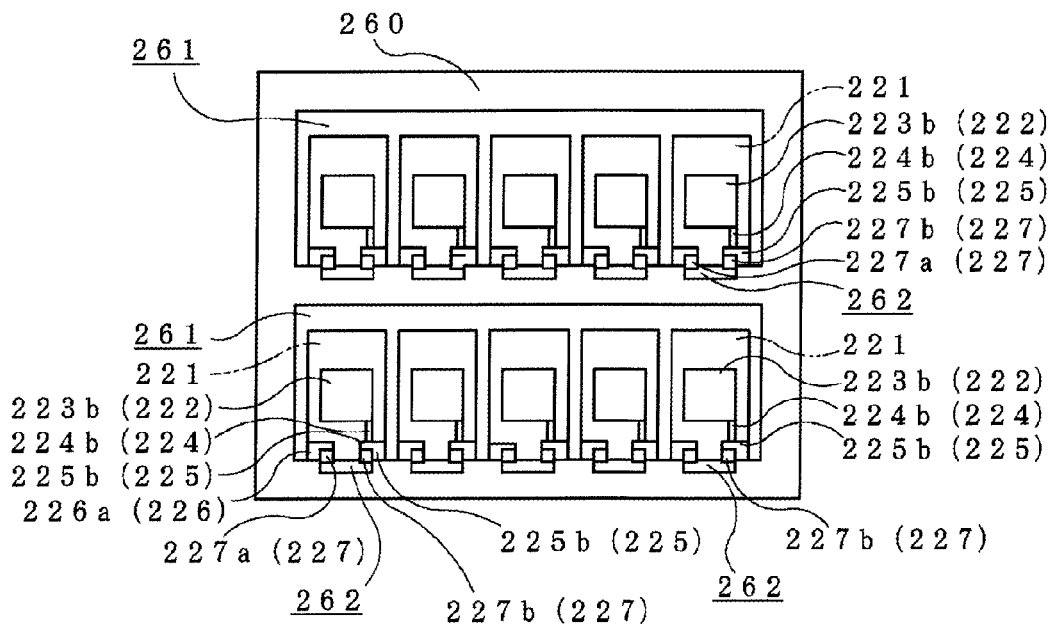
FIG. 21B is a plan view when viewing the lower surface of the crystal wafer after the connection part forming process in the method of production of a crystal device of the second embodiment from the upper surface through the crystal wafer.
Figure 22A:
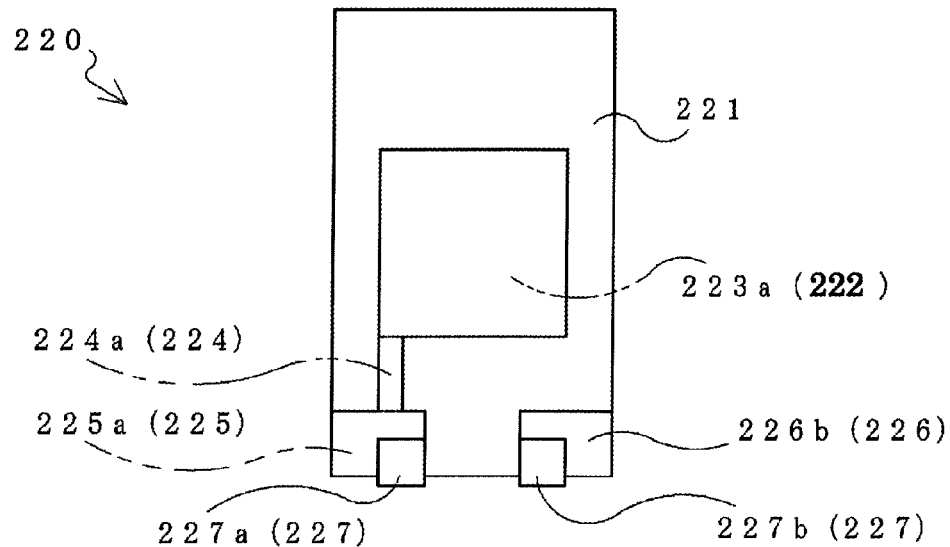
FIG. 22A is a plan view of the upper surface of a crystal blank which is segmented by the segmentation process in the method of production of a crystal device of the second embodiment.
Figure 22B:
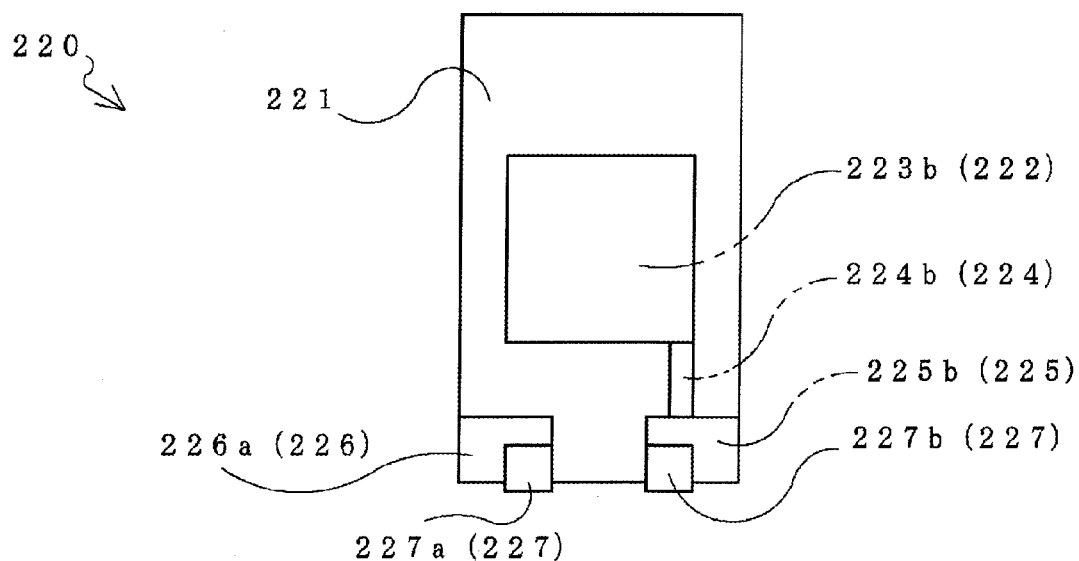
FIG. 22B is a plan view when viewing the lower surface of the crystal blank which is segmented by the segmentation process in the method of production of a crystal device of the second embodiment from the upper surface through the crystal blank.
Figure 23:
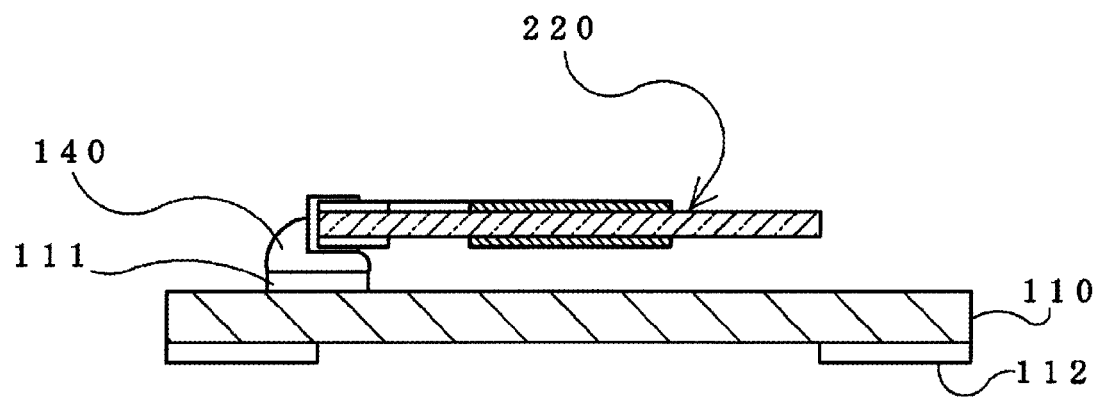
FIG. 23 A cross-sectional view after the mounting process in the method of production of a crystal device of the second embodiment.
Figure 24:
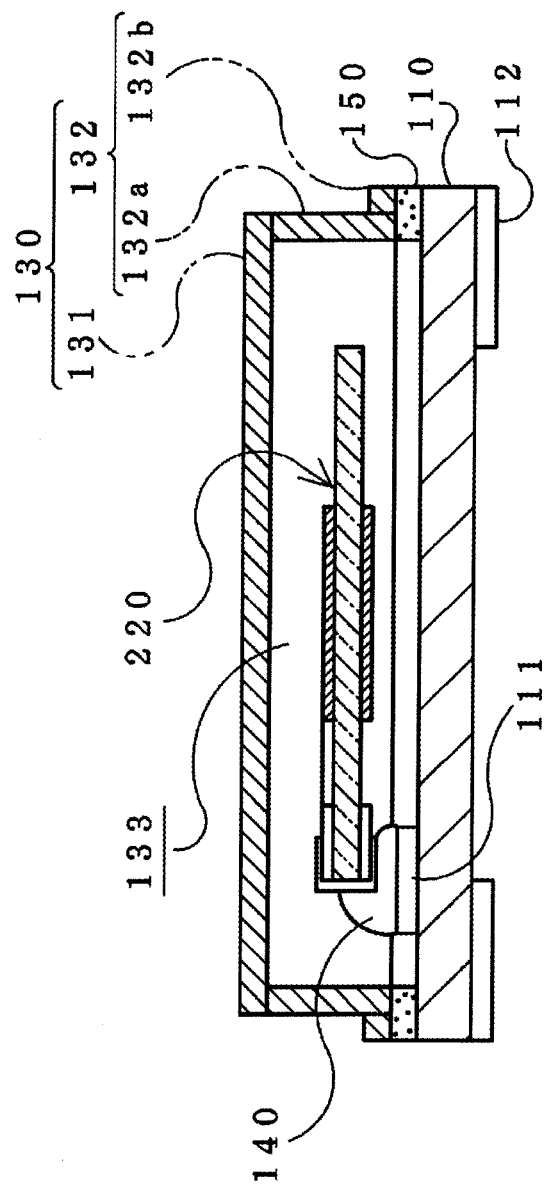
FIG. 24 A cross-sectional view after the lid bonding process in the method of production of a crystal device of the second embodiment.
Figure 25:
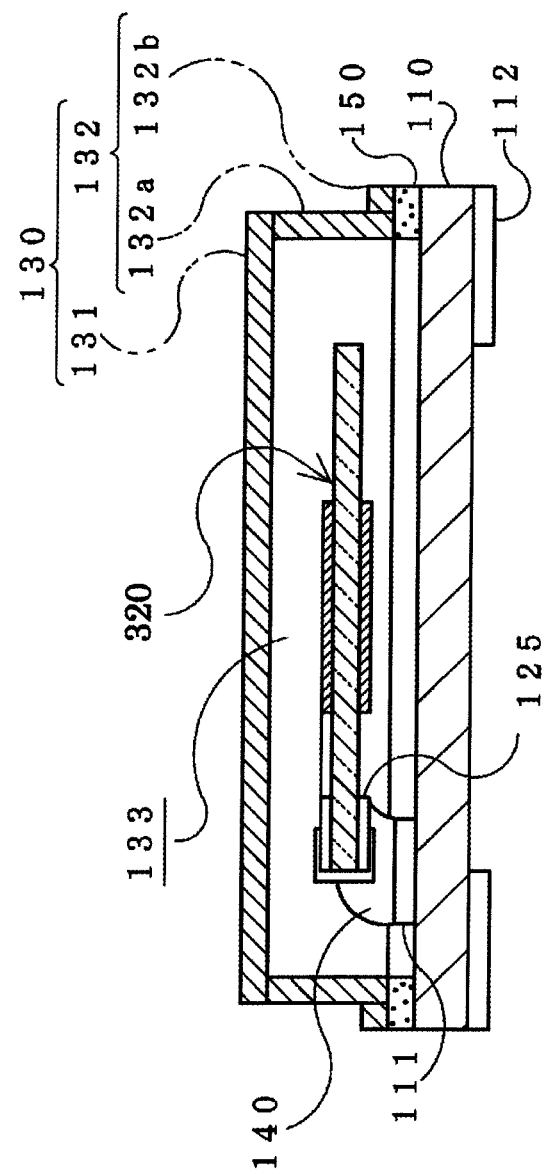
FIG. 25 A cross-sectional view of a crystal device according to a third embodiment.

The metal patterns which become the excitation electrode parts 122, wiring parts 124, lead-out terminals 125, and first mounting terminal 126, as shown in the FIG. 4B, are constituted by a first metal layer M11 and second metal layer M12. The second metal layer M12 is laminated on the first metal layer M11. For the first metal layer M11, use is made of a metal material having a good bondability with the crystal blank 121. For example, use is made of chromium, Nichrome, titanium, or nickel. For the second metal layer M12, use is made of a metal material having a relatively low electric resistivity among metal materials. For example, use is made of gold, silver, aluminum, an alloy containing gold as the principal ingredient, or an alloy containing silver as the principal ingredient.

The first connection part 127 is for electrically connecting the first lead-out terminal 125*a* which is formed at the edge part of the upper surface of the crystal blank 121 and the first mounting terminal 126 which is formed at the edge part of the lower surface of the crystal blank 121. The first connection part 127 is formed upon the upper surface, lower surface, and side surface of the crystal blank 121 so that one end is superimposed on the first lead-out terminal 125*a* and the other end is superimposed on the first mounting terminal 126. The first connection part 127 is formed by a vapor deposition technique or sputtering technique. By forming the first connection part 127 so that one end of the first connection part 127 is superimposed on the first lead-out terminal 125*a*, it becomes possible to reliably electrically connect the first connection part 127 and the first lead-out terminal 125*a*. In the same way, by forming the first connection part 127 so that the other end of the first connection part 127 is superimposed on the first mounting terminal 126, it becomes possible to reliably electrically connect the first connection part 127 and the first mounting terminal 126. Further, by superimposing these, a connection area between the first connection part 127 and the first lead-out terminal 125*a* and a connection area between the first connection part 127 and the first mounting terminal 126 become large, thus conduction between them can be reliably secured.

Further, by employing such a superimposed constitution, in the case where stress is applied in a direction which is vertical to the lower surface of the crystal blank 121 and extends from the upper surface of the crystal blank 121 toward the lower surface of the crystal blank 121, the stress is dispersed by the amount that the first connection part 127 is formed at the end part of the upper surface of the crystal blank 121, therefore it becomes possible to reduce peeling due to stress concentration. Accordingly, even in a case where shrinkage stress is applied in a direction which is vertical to the lower surface of the crystal blank 121 and extends from the upper surface of the crystal blank 121 toward its lower surface when the conductive adhesive 140 is cured, compared with the conventional case, peeling due to stress concentration can be reduced at the end part of the upper surface of the crystal blank 121. For this reason, poor conduction between the first lead-out terminal 125*a* and the first connection part 127 due to peeling is reduced, therefore it becomes possible to reduce and lighten the increase of the equivalent series resistance value which is caused by this poor conduction.

Further, by employing such a superimposed constitution, in a case where stress is applied in a direction which is parallel to the lower surface of the crystal blank 121 and extends from the outer edge of the crystal blank 121 toward the inner edge, compared with the conventional case, because the thickness in the up-and-down direction becomes thicker by exactly the amount of the first connection part 127 at the end part of the lower surface of the crystal blank 121, it becomes possible to reduce peeling due to stress concentration. Accordingly, even in a case where stress is applied in a direction which is parallel to the lower surface of the crystal blank 121 and extends from the outer edge of the crystal blank 121 toward the inner edge when the conductive adhesive 140 is cured, compared with the conventional case, peeling due to stress concentration can be reduced at the end part of the lower surface of the crystal blank 121. For this reason, it becomes possible to reduce poor conduction between the first mounting terminal 126 and the first connection part 127 due to peeling and reduce and lighten the increase of equivalent series resistance value which is caused by this poor conduction.

Further, the first connection part 127 is configured to be separately formed from the first lead-out terminal 125*a* and the first mounting terminal 126. Therefore, even in a case where the width of the first connection part 127 (side surface distance which will be defined later) which is provided on the side surface of the crystal blank 121 is thin, by making the thickness of the first connection part 127 thicker than the thicknesses of the excitation electrode parts 122, wiring parts 124, lead-out terminals 125, and first mounting terminal 126, the increase of electric resistivity due to the small volume of the first connection part 127 can be reduced. For this reason, it becomes possible to reduce the increase of equivalent series resistance value.

The first connection part 127, as shown in FIG. 4B, is constituted by a third metal layer M13 and fourth metal layer M14 and forms a state where the fourth metal layer M14 is laminated on the third metal layer M13. Accordingly, when paying attention to one end side of the first connection part 127, the first connection part 127 is provided so as to be superimposed on the first lead-out terminal 125a, therefore a structure where the first metal layer M11, second metal layer M12, third metal layer M13, and fourth metal layer M14 are laminated in that order on the crystal blank 121 is exhibited. Further, when paying attention to the other end side of the first connection part 127, the connection part 127 is provided so as to be superimposed on the first mounting terminal 126, therefore a structure where the first metal layer M11, second metal layer M12, third metal layer M13, and fourth metal layer M14 are laminated in that order on the crystal blank 121 is exhibited. For the third metal layer M13, use is made of a metal material having a good bondability with the crystal blank 121. For example, use is made of chromium, Nichrome, titanium, or nickel. For the fourth metal layer M14, use is made of a metal material having a relatively low electric resistivity among metal materials. For example, use is made of gold, silver, aluminum, an alloy containing gold as the principal ingredient, or an alloy containing silver as the principal ingredient.

Further, the first connection part 127 is positioned at a position where, when viewing the upper surface of the crystal blank 121 on a plane, the end part of the first connection part 127 on the upper surface side of the crystal blank 121 is superimposed on the first mounting terminal 126 which is formed on the lower surface of the crystal blank 121. Accordingly, when viewing this on a plane while viewing this from the upper surface side of the crystal blank 121 through the crystal blank 121, a distance between the side of the first connection part 127 which faces the second excitation electrode part 123b side and the side of the second excitation electrode part 123b which faces the first connection part 127 side becomes longer than a distance between the side of the first mounting terminal 126 which faces the second excitation electrode part 123b side and the side of the second excitation electrode part 123b which faces the first mounting terminal 126 side. For this reason, it becomes possible to reduce the occurrence of a spurious vibration which is a vibration different from the thickness slip vibration due to an inverse piezoelectric effect occurring between the first connection part 127 and the second excitation electrode part 123b.

Further, when viewing the lower surface of the crystal blank 121 on a plane, a portion of the first connection part 127 is formed on the side surface of the crystal blank 121 including the predetermined single side of the crystal blank 121 on which the two, i.e., the first mounting terminal 126 and the second lead-out terminal 125b, are formed so as to be aligned, specifically, a single short side of the crystal blank 121. That is, a portion of the first connection part 127 is formed on the side surface including a single short side of the crystal blank 121. Due to this, compared with a case where the first connection part 127 is formed on the side surface including a single long side of the crystal blank 121, it becomes possible to make the distance between a portion of the first connection part 127 which is formed on the side surface of the crystal blank 121 and the second excitation electrode part 123b long.

When it is used as a crystal device, voltage is applied from the outside of the crystal device. At this time, electric charges having different polarities are applied to the first mounting terminal 126 and the second lead-out terminal 125b. Therefore, in the first connection part 127 which is electrically connected to the first mounting terminal 126 and in the second excitation electrode part 123b which is electrically connected to the second lead-out terminal 125b, electric charges having different polarities are stored.

In general, the amount of electric charge stored differs according to the volume. The larger the volume is, the larger the amount of electric charge which is stored becomes. Further, in the piezoelectric material, the larger the amount of electric charge which is stored is, the stronger the intensity of the induced electric field becomes and the easier the occurrence of the inverse piezoelectric effect becomes.

For this reason, even when the thickness in the up-and-down direction of the first connection part 127 is made thick or the width of the first connection part 127 is made wide in order to reliably electrically connect the first mounting terminal 126 and the first lead-out terminal 125a by the first connection part 127, it becomes possible to reduce the occurrence of the spurious vibration due to the inverse piezoelectric effect occurring between the first connection part 127 and the second excitation electrode part 123b. As a result, the problem of the crystal impedance value of the crystal device becoming large due to the spurious vibration can be reduced, therefore the productivity can be improved.

Further, by forming a portion of the first connection part 127 on the side surface including a single short side of the crystal blank 121, the distance between the portion of the first connection part 127 which is formed on the side surface and the second excitation electrode part 123b can be made longer. Accordingly, the occurrence of spurious vibration by the first connection part 127 and the second excitation electrode part 123b can be reduced by exactly the among of increase of the distance, therefore it becomes possible to reduce the problem of the crystal impedance value of the crystal device becoming large and improve the productivity more.

In the first embodiment, the first excitation electrode part 123a which is formed on the upper surface of the crystal blank 121 is electrically connected through the first wiring part 124a, first lead-out terminal 125a, and first connection part 127 to the first mounting terminal 126, and the second excitation electrode part 123b which is formed on the lower surface of the crystal blank 121 is electrically connected through the second wiring part 124b to the second lead-out terminal 125b.

Here, the operation of the crystal element 120 will be explained. In the crystal element 120, when voltage is applied from the outside to the first mounting terminal 126 and second lead-out terminal 125b, voltage is applied to the first excitation electrode part 123a which is electrically connected to the first mounting terminal 126 and to the second excitation electrode part 123b which is electrically connected to the second lead-out terminal 125b, so different electric charges are stored in the first excitation electrode part 123a and in the second excitation electrode part 123b, therefore distortion is caused in a portion of the crystal blank 121 which is sandwiched between the first excitation electrode part 123a and the second excitation electrode part 123b due to the inverse piezoelectric effect and deformation occurs. As a result, the crystal blank 121 tries to restore its figure before deformation. Therefore, due to the piezoelectric effect, electric charges having different polarities from those of the electric charges which were stored in the first excitation electrode part 123a and second excitation electrode part 123b at first are stored. That is, when voltage is applied to the first excitation electrode part 123a and the second excitation electrode part 123b, in the crystal element 120, due to the piezoelectric effect and inverse piezoelectric effect, the portion of the crystal blank 121 which is sandwiched between the first excitation electrode part 123a and the second excitation electrode part 123b vibrates. Accordingly, when an AC voltage is applied to the crystal element 120, different electric charges are alternately stored in the first excitation electrode part 123a and the second excitation electrode part 123b to cause deformation, thus a portion of the crystal blank 121 which is sandwiched between the first excitation electrode part 123a and the second excitation electrode part 123b can be vibrated.

Further, here, the size of the crystal element 120 will be explained. In the crystal blank 121, when viewing the crystal blank 121 on a plane, the long side becomes 0.5 to 4.6 mm, the short side becomes 0.4 to 2.8 mm, and the thickness in the up-and-down direction of the crystal blank 121 becomes 10 to 300 µm. In the excitation electrode parts 122, the first excitation electrode part 123a and the second excitation electrode part 123b have the same size, when viewing the crystal blank 121 on a plane, the side parallel to the long side of the crystal blank 121 becomes 0.3 to 4.5 mm, the side parallel to the short side of the crystal blank 121 becomes 0.3 to 2.7 mm, and the thickness in the up-and-down direction becomes 50 to 500 Å. When viewing the crystal blank 121 on a plane, the lead-out terminals 125 and first mounting terminal 126 are given sizes such that the side parallel to the short side of the crystal blank 121 becomes 0.05 to 1.0 mm, the side parallel to the long side of the crystal blank 121 becomes 0.05 to 1.0 mm, and the thickness in the up-and-down direction becomes 50 to 500 Å. The length of the wiring parts 124, specifically, when viewing the upper surface of the crystal element 120 on a plane, the length between the side of the first lead-out terminal 125a which faces the first excitation electrode part 123a side and the side of the first excitation electrode part 123a which faces the first lead-out terminal 125a side becomes 0.03 to 3.0 mm. Further, the thickness in the up-and-down direction of the wiring parts 124 becomes 50 to 500 Å. In the first connection part 127, the thickness in the up-and-down direction becomes 50 to 500 Å.

Further, here, a method of using the conductive adhesives 140 and electrically bonding the crystal element 120 to the pair of mounting pads 111 which are provided on the upper surface of the substrate 110 to mount the crystal element 120 on the substrate 110 will be explained. First, the conductive adhesive 140 is coated on the mounting pads 111 by for example a dispenser. After that, the crystal element 120 is conveyed onto the conductive adhesive 140, the crystal element 120 is placed so as to sandwich the conductive adhesive 140 between the crystal element 120 and the mounting pads 111, and thermal curing is carried out in that state. At this time, the conductive adhesive 140 which is coated on one mounting pad 111 is sandwiched between the one mounting pad 111 and the first mounting terminal 126, and the conductive adhesive 140 which is coated on the other mounting pad 111 is sandwiched between the other mounting pad 111 and the second lead-out terminal 125b. By thermal curing, the conductive adhesives 140 electrically bond the one mounting pad 111 and the first mounting terminal 126 and electrically bond the other mounting pad 111 and the second lead-out terminal 125b.

The conductive adhesive 140 is for mounting the crystal element 120 on the substrate 110. The conductive adhesive 140 is comprised of a silicone resin binder in which is contained a conductive filler constituted by a conductive powder. As the conductive powder, use is made of any of aluminum, molybdenum, tungsten, platinum, palladium, silver, titanium, and nickel or nickel iron, or one containing a combination of the same. Further, as the binder, for example, use is made of a silicone resin, epoxy resin, polyimide resin, or bismaleimide resin.

The conductive adhesive 140 has the characteristic that, for example, when thermal curing is carried out, the resin binder shrinks and the particles of the conductive filler become closer to each other. Therefore, by performing thermal curing, the mounting pad 111 and the first mounting terminal 126 or second lead-out terminal 125b can be electrically connected while adhering. For this reason, when the conductive adhesive 140 is thermally cured and solidified, the conductive adhesive 140 shrinks. Accordingly, when the conductive adhesive 140 is thermally cured and solidified, for example, the stress (shrinkage stress) is applied to each of the mounting pads 111, first mounting terminal 126, and first connection part 127 which are in contact with the conductive adhesive 140, in direction which extends from each of these toward the conductive adhesive 140.

The lid 130 is bonded to the upper surface of the substrate 110 by the joining member 150 and is for hermetically sealing the crystal element 120 which is mounted on the upper surface of the substrate 110. Further, the lid 130 is constituted by a sealing base 131 and a sealing frame 132. Further, in the lid 130, the sealing frame 132 is provided on the lower surface of the sealing base 131, and the concave portion 133 is formed by the lower surface of the sealing base 131 and the inner wall surfaces of the sealing frame 132.

The sealing base 131 forms for example a substantially block shape. The size of its major surface is larger than the major surface of the crystal blank 121 and is smaller than the upper surface of the substrate 110. The sealing frame 132 is constituted by a frame portion 132a and a flange portion 132b. The frame portion 132a is for forming the concave portion 133 in the lid 130 and is provided along the outer edge of the lower surface of the sealing base 131. In the concave portion 133, the crystal element 120 mounted on the upper surface of the substrate 110 is accommodated. The flange portion 132b is provided in order to secure an area for bonding the lid 130 and the substrate 110 and raise the bonding strength. The flange portion 132b exhibits a ring shape along the outer circumferential surface of the frame portion 132a and extends to the outer edge side of the frame portion 132a.

The sealing base 131 and the sealing frame 132 are for example made of an alloy containing at least any of iron, nickel, or cobalt and are integrally formed. Such a lid 130 is for hermetically sealing the concave portion 133 which is in a vacuum state or the concave portion 133 which is filled with nitrogen gas or the like. Specifically, in the lid 130, by application of heat to the joining member 150 provided between the lower surface of the sealing frame 132 (the lower surface of the frame portion 132a and the lower surface of the flange portion 132b) and the upper surface of the substrate 110 in a predetermined atmosphere, the joining member 150 is melted, therefore the lower surface of the sealing frame 132 and the upper surface of the substrate 110 are melt bonded.

Here, a method of preparation of the lid 130 will be explained. For preparation of the lid 130, for example, use is made of conventionally known press working. A flat plate having a rectangular shape is prepared, and the flat plate is sandwiched between a pair of dies having a convex portion and a concave portion having the same shape as the concave portion 133 of the lid 130 and is pressed, whereby the sealing base 131 and sealing frame 132 are provided and the concave portion 133 is formed. In this way, the lid 130 is prepared by plastically working the flat plate by using press working.

The joining member 150 is provided between the lower surface of the sealing frame 132 of the lid 130 and the upper surface of the substrate 110, specifically between the lower surface of the frame portion 132a and the upper surface of the substrate 110 and between the lower surface of the flange portion 132b and the upper surface of the substrate 110, and is for bonding the lid 130 and the substrate 110. For example, in the case where the joining member 150 is made of glass, it is a glass which melts at 300° C. to 400° C. and is constituted by for example a low melting point glass containing vanadium or lead oxide-based glass. The composition of the lead oxide-based glass consists of lead oxide, lead fluoride, titanium dioxide, niobium oxide, boron oxide, zinc oxide, ferric oxide, copper oxide, and calcium oxide.

Next, a method of bonding the lid 130 and the substrate 110 by using the joining member 150 will be explained. The glass which becomes the raw material of the joining member 150 is in a paste state obtained by adding a binder and solvent and is bonded to another member by solidification after it is melted. The joining member 150 is for example provided by coating a glass frit paste on the lower surface of the sealing frame 132, specifically the lower surface of the frame portion 132a and the lower surface of the flange portion 132b, by the screen printing process and drying.

Further, the joining member 150 is comprised of, for example, an epoxy resin or polyimide resin in the case of the insulating resin. At this time, the insulating resin is coated on the lower surface of the sealing frame 132 of the lid 130. The lid 130 which is coated with the insulating resin is placed so as to sandwich the insulating resin by the lower surface of the sealing frame 132 and the upper surface of the substrate 110. After that, the insulating resin is thermally cured to bond the lid 130 and the substrate 110.

Next, a method for production of a crystal device according to the first embodiment will be explained. The method of production of a crystal device according to the first embodiment is comprised, as shown in FIG. 5 to FIG. 14, of a crystal wafer forming process, crystal blank part forming process, excitation electrode part forming process, wiring part forming process, lead-out terminal forming process, mounting terminal forming process, connection part forming process, segmentation process, mounting process, and lid bonding process.

Note that, in the method of production of a crystal device according to the first embodiment, the explanation will be given of the case where the excitation electrode part forming process, wiring part forming process, lead-out terminal forming process, and mounting terminal forming process are separately carried out. However, the excitation electrode part forming process, wiring part forming process, lead-out terminal forming process, and mounting terminal forming process may be simultaneously carried out as well. Further, in the mounting process, the surface of the crystal wafer 160 which forms the surface of the crystal blank 121 which faces the substrate 110 side when mounting the crystal blank 121 is defined as the "lower surface" of the crystal wafer 160. Further, the surface of the crystal wafer 160 which faces to the opposite side to the lower surface of the crystal wafer 160 will be defined as the "upper surface" of the crystal wafer 160.

(Crystal Wafer Forming Process)

The crystal wafer forming process is the process of forming the crystal wafer 160 in a flat plate shape having crystal axes consisting of the X-axis, Y-axis and Z-axis which are perpendicular to each other. In the crystal wafer forming process, use is made of an artificial crystal having crystal axes consisting of the X-axis, Y-axis and Z-axis which are perpendicular to each other. The major surface of the crystal wafer 160 which is formed in the crystal wafer forming process has become for example parallel to the plane obtained by rotating the plane parallel to the X-axis and Z-axis around the X-axis in a counterclockwise direction when viewing the negative direction of the X-axis at the predetermined angle, for example, about 37°. Further, the crystal wafer 160 which is formed in the crystal wafer forming process is cut from an artificial crystal by a predetermined cut angle, then is polished at its two major surfaces so that the thickness in the up-and-down direction becomes a predetermined thickness.

Here, the crystal wafer 160 forms for example a schematically rectangular flat plate shape. When viewing on a plane, the dimension of a predetermined single side is 10 to about 102 mm, and the dimension of a single side connected to the predetermined single side is 10 to about 102 mm. At this time, the thickness in the up-and-down direction of the crystal wafer 160 is 0.020 mm to 0.070 mm. Note that, the case where the crystal wafer 160 forms a schematically rectangular flat plate shape is explained, but it may form a flat plate shape having a circular shape or elliptical shape as well, its size when viewed on a plane is 10.0 to 101.6 mm in diameter.

(Crystal Blank Part Forming Process)

The crystal blank part forming process is the process of using a photolithography technique and etching technique to form crystal blank parts which are formed in schematically rectangular flat plate shapes and are fixed at their predetermined single sides of their major surfaces at predetermined positions of the crystal wafer 160. Here, the "crystal blank parts" mean the parts which become the crystal blanks 121. The crystal blank parts will be explained in the following explanation and drawings by attaching the same notation as that of the crystal blanks.

In the crystal blank part forming process, first, metal films are formed on the two major surfaces of the crystal wafer 160, then photosensitive resists are coated on the metal films and are exposed to predetermined patterns and developed. After that, the crystal wafer 160 is immersed in a predetermined etching solution to form crystal blank formation-use through holes 161. Due to this, at the crystal wafer 160, a plurality of crystal blank parts 121 are formed. Further, by utilizing the difference in etching according to the axial direction of the crystal axis, m-surfaces which are parallel to the Z-axis are formed in portions of the side surfaces of the crystal blank parts 121.

Further, in the crystal blank part forming process, at the same time as the formation of the crystal blank formation-use through holes 161, through holes 162 are formed at predetermined single sides of the crystal blank parts 121. Accordingly, when viewing the upper surface of the crystal wafer 160 on a plane, the crystal blank parts 121 after the crystal blank part forming process exhibit states where they are fixed at the crystal wafer 160 at the two end parts of the predetermined single sides of the crystal blank parts 121. For this reason, in the crystal blank part forming process in the method of production of a crystal device of the first embodiment, the side surfaces including the predetermined single sides of the crystal blank parts 121 can be formed while maintaining the state of the crystal wafer 160 as it is. As a result, in the connection part forming process which will be explained later, it becomes possible to easily form the portions of the first connection parts 127 on the side surfaces including the predetermined single sides of the crystal blank parts 121 while maintaining the state of the crystal wafer 160 as it is.

Further, in the crystal blank part forming process, when viewing the upper surfaces of the crystal blank parts 121 on a plane, the lengths of single sides at which the crystal blank parts 121 are fixed become shorter than the lengths of the sides which are connected to the single sides at which the crystal blank parts 121 are fixed. That is, when viewing the upper surfaces of the crystal blank parts 121 on a plane, the crystal blank parts 121 are fixed on a single short side of the crystal blank parts 121.

(Excitation Electrode Part Forming Process)

The excitation electrode part forming process uses a photolithography technique and etching technique to form the first excitation electrode parts 123a on the upper surfaces of the crystal blank parts 121 and form the second excitation electrode parts 123b on the lower surfaces of the crystal blank parts 121. That is, in the excitation electrode part forming process, the excitation electrode parts 122 constituted by the first excitation electrode parts 123a and second excitation electrode parts 123b are formed. In the excitation electrode part forming process, first, metal films are formed on the two major surfaces of the crystal wafer 160 at which the crystal blank parts 121 are formed, then photosensitive resists are coated on these metal films, exposed to predetermined patterns, and developed. After that, the crystal wafer 160 is immersed in a predetermined etching solution to remove the unrequired parts of the metal films. As a result, metal patterns which form the first excitation electrode parts 123a are formed on the upper surfaces of the crystal blank parts 121, and metal patterns which form the second excitation electrode parts 123b are formed on the lower surfaces of the crystal blank parts 121. The first excitation electrode parts 123a are formed near the center portions of the upper surfaces of the crystal blank parts 121. The second excitation electrode parts 123b are formed on the lower surfaces of the crystal blank parts 121 at positions which face the first excitation electrode parts 123a.

In the excitation electrode part forming process, the metal films to be formed on the two major surfaces of the crystal wafer 160 are constituted by a first metal film and a second metal film. A state where the second metal film is laminated on the first metal film is exhibited. Accordingly, in the excitation electrode part forming process, the formed predetermined metal patterns are comprised of the first metal film obtained by removal of the unrequired parts and the second metal film obtained by removal of the unrequired parts and form a laminated state. Here, the first metal film obtained by removal of the unrequired parts will be referred to as the first metal layer M11, and the second metal film obtained by removal of the unrequired parts will be referred to as the second metal layer M12. Accordingly, in the excitation electrode part forming process, the formed predetermined metal patterns are comprised of the first metal layer M11 and second metal layer M12 and exhibit a state where the second metal layer M12 is laminated on the first metal layer M11.

In the excitation electrode part forming process in the method of production of a crystal device according to the first embodiment, the first excitation electrode parts 123a and second excitation electrode parts 123b are formed by a photolithography technique and etching technique. Accordingly, positioning with the use of the outer shape of the crystal wafer 160 after the periphery is etched is not carried out unlike the case where the first excitation electrode parts 123a and second excitation electrode parts 123b are formed by using a vapor deposition technique or sputtering technique, therefore it becomes possible to form these at predetermined positions on the crystal blank parts 121 with a good precision compared with the case where the vapor deposition technique or sputtering technique is used for forming these. For this reason, the increase of crystal impedance values of the crystal devices due to deviation of the first excitation electrode parts 123a and second excitation electrode parts 123b relative to the predetermined positions at the crystal blank parts 121 can be reduced, so it becomes possible to improve the productivity.

Further, in the method of production of a crystal device according to the first embodiment, the metal films are formed by coating the first metal film on the surface of the crystal wafer 160 and laminating the second metal film on the first metal film. At this time, the metal material which is used for the first metal film has the property of being more easily adhered to the crystal wafer 160 compared with the metal material which is used for the second metal film. Accordingly, by forming the metal films in a laminated state in which the second metal film is provided on the first metal film, even a metal material having the property of being hard to be adhered to the crystal wafer 160 can be used as the second metal film. If a first metal film is not provided, but only the second metal film is formed on the crystal wafer 160 and a photolithography technique and etching technique are used, the bonding strength between the second metal film and the crystal wafer 160 will be weak, therefore part or all of the surface of the second metal film will peel off, therefore a metal film having predetermined patterns cannot be formed, so the productivity is liable to be reduced. That is, in the present embodiment, the metal film to be provided on the crystal wafer 160 when forming the predetermined metal patterns is the metal film one which is comprised of the first metal film and second metal film and in which the second metal film is laminated on the first metal film, therefore peeling of the metal film at the time of working can be reduced, so it becomes possible to improve the productivity.

Further, the excitation electrode parts 122 which are formed by the method of production of a crystal device according to the first embodiment form a state where the second metal layer M12 is laminated on the first metal layer M11. At this time, the metal material which is used for the first metal layer M11 has the property of being easily adhered to the crystal blank parts 121 compared with the metal material used for the second metal layer M12. Accordingly, by forming a state where the second metal layer M12 is laminated on the first metal layer M11, for the second metal layer M12, use can be made of a metal material which is hard to be adhered to the crystal blank parts 121. If the excitation electrode parts 122 are not provided with the first metal layer M11, but are constituted only by the second metal layer M12, there is the apprehension that, when moving the crystal elements 120 by a suction nozzle in the mounting process, portions of the second metal layer M12 will end up being peeled off due to contact with the suction nozzle or due to suction by the suction nozzle, therefore the crystal impedance value or equivalent series resistance value becomes larger. That is, in the present embodiment, by constituting the excitation electrode parts 122 by the first metal layer M11 and the second metal layer M12 laminated on the first metal layer M11, the increase of the crystal impedance or equivalent series resistance value due to peeling of the excitation electrode parts 122 of the crystal elements 120 at the time of production of the crystal devices is reduced.

(Wiring Part Forming Process)

The wiring part forming process is the process of using a photolithography technique and etching technique to form the first wiring parts 124a so as to extend from the first excitation electrode parts 123a toward the edge parts of the upper surfaces of the crystal blank parts 121 and to form the second wiring parts 124b so as to extend from the second excitation electrode parts 123b toward the edge parts of the lower surfaces of the crystal blank parts 121. That is, in the wiring part forming process, the wiring parts 124 constituted by the first wiring parts 124a and second wiring parts 124b are formed. In the wiring part forming process, first, metal films are coated on the two major surfaces of the crystal wafer 160 at which the crystal blank parts 121 are formed, then photosensitive resists are coated on these metal films and are exposed to the predetermined patterns and developed. After that, the crystal wafer 160 is immersed in a predetermined etching solution to remove the unrequired parts of the metal film. As a result, the first wiring parts 124a and second wiring parts 124b are formed.

In the wiring part forming process, the metal films which are formed on the two major surfaces of the crystal wafer 160 are constituted by a plurality of metal films comprised of the first metal film and second metal film and form states where the second metal film is laminated on the first metal film. Accordingly, in the wiring part forming process, the formed predetermined metal patterns are comprised of the first metal film from which the unrequired parts are removed and the second metal film from which the unrequired parts are removed and form states where they are laminated. Here, the first metal film from which the unrequired parts are removed will be defined as the first metal layer M11 and the second metal film from which the unrequired parts are removed will be defined as the second metal layer M12. Accordingly, in the wiring part forming process, the formed predetermined metal patterns are comprised of the first metal layer M11 and second metal layer M12 and form states where the second metal layer M12 is laminated on the first metal layer M11.

The first wiring parts 124a extend on the upper surfaces of the crystal blank parts 121 from the first excitation electrode parts 123a toward the edge parts of the upper surfaces of the crystal blank parts 121. That is, the first wiring parts 124a are formed on the upper surfaces of the crystal blank parts 121 so that single ends are connected to the excitation electrode parts 123a and the other ends are positioned at the end parts of the upper surfaces of the crystal blank parts 121. The first wiring parts 124a, when viewing the upper surfaces of the crystal blank parts 121 on a plane, for example, extend from the first excitation electrode parts 123a toward the predetermined single sides at which the crystal blank parts 121 are fixed.

The second wiring parts 124b extend on the lower surfaces of the crystal blank parts 121 from the second excitation electrode parts 123b toward the edge parts of the lower surfaces of the crystal blank parts 121. That is, the second wiring parts 124b are formed on the lower surfaces of the crystal blank parts 121 so that single ends are connected to the second excitation electrode parts 123b and the other ends are positioned at the end parts of the lower surfaces of the crystal blank parts 121. The second wiring parts 124b, when viewing the lower surfaces of the crystal blank parts 121 on a plane, extend from the second excitation electrode parts 123b toward the predetermined single sides at which the crystal blank parts 121 are fixed.

Further, in the wiring part forming process, the metal films are formed by coating the first metal film on the surface of the crystal wafer 160 and laminating the second metal film on this first metal film. In the same way as the case of the excitation electrode part forming process, the metal material which is used for the first metal film has the property that it is more easily adhered to the crystal wafer 160 compared with the metal material which is used for the second metal film. Accordingly, in the wiring part forming process of the first embodiment, by constituting the metal film to be provided on the crystal wafer 160 when forming the predetermined metal patterns by a plurality of metal films comprised of the first metal film and second metal film and having the second metal film laminated on the first metal film, in the same way as the case of the excitation electrode part forming process, when forming the predetermined metal patterns which become the wiring parts, peeling of the metal film at the time of working can be reduced, therefore it becomes possible to improve the productivity.

Further, the wiring parts 124 which are formed by the method of production of a crystal device according to the first embodiment form a state where the second metal layer M12 is laminated on the first metal layer M11. At this time, the metal material which is used for the first metal layer M11 has the property that it is more easily adhered to the crystal blank parts 121 compared with the metal material which is used for the second metal layer M12. Accordingly, by forming a state where the second metal layer M12 is laminated on the first metal layer M11, use can be made of a metal material which is hard to be adhered to the crystal blank parts 121 for the second metal layer M12. If the wiring parts 124 are constituted by only the second metal layer M12 without providing the first metal layer M11, when moving the crystal elements 120 by a suction nozzle in the mounting process, due to the contact with the suction nozzle or contact with the substrate 110 at the time of movement, a portion of the wiring parts 124 will peel off, so the wiring parts 124 will become extremely thin. As a result, the crystal impedance value is liable to become large. That is, in the present embodiment, by constituting the wiring parts 124 by the first metal layer M11 and the second metal layer M12 laminated on the first metal layer M11, the increase of the crystal impedance value due to peeling of the wiring parts 124 at the time of the production of the crystal devices is reduced.

(Lead-Out Terminal Forming Process)

The lead-out terminal forming process is the process of using a photolithography technique and etching technique to form the first lead-out terminals 125a which are located at the edge parts of the upper surfaces of the crystal blank parts 121 and are electrically connected to the first wiring parts 124a, and to form the second lead-out terminals 125b which are located at the edge parts of the lower surfaces of the crystal blank parts 121 and are electrically connected to the second wiring parts 124b. That is, in the lead-out terminal forming process, the lead-out terminals 125 constituted by the first lead-out terminals 125a and second lead-out terminals 125b are formed. In the lead-out terminal forming process, first, metal films are formed on the two major surfaces of the crystal wafer 160 at which the crystal blank parts 121 are formed, then photosensitive resists are coated on the metal films and exposed to the predetermined patterns and developed. After that, the crystal wafer 160 is immersed in a predetermined etching solution to remove the unrequired parts of the metal film. As a result, the first lead-out terminals 125a and second lead-out terminals 125b are formed.

The first lead-out terminals 125a are formed on the upper surfaces of the crystal blank parts 121 and at the edge parts of the single sides of the crystal blank parts 121 at which the crystal blank parts 121 are fixed. The second lead-out terminals 125b are formed on the lower surfaces of the crystal blank parts 121 and at the edge parts of the single sides of the crystal blank parts 121 at which the crystal blank parts 121 are fixed. Further, when viewing the lower surfaces of the crystal blank parts 121 through the crystal blank parts 121 while viewing the upper surfaces of the crystal blank parts 121 on a plane, the first lead-out terminals 125a and second lead-out terminals 125b are formed so that the two are aligned along the single sides of the crystal blank parts 121 at which the crystal blank parts 121 are fixed. That is, the first lead-out terminals 125a and the second lead-out terminals 125b are formed so that they do not face each other.

In the lead-out terminal forming process, the metal film to be formed on the two major surfaces of the crystal wafer 160 is constituted by a plurality of metal films comprised of the first metal film and second metal film and forms a state where the second metal film is laminated on the first metal film. Accordingly, in the lead-out terminal forming process, the formed predetermined metal patterns are comprised of the first metal film from which the unrequired parts are removed and the second metal film from which the unrequired parts are removed and form a state where they are laminated. Here, the first metal film from which the unrequired parts are removed will be defined as the "first metal layer M11" and the second metal film from which the unrequired parts are removed will be defined as the "second metal layer M12". Accordingly, in the lead-out terminal forming process, the formed predetermined metal patterns are comprised of the first metal layer M11 and second metal layer M12 and form a state where the second metal layer M12 is laminated on the first metal layer M11.

Further, in the lead-out terminal forming process, the metal films are formed by forming the first metal film on the surface of the crystal wafer 160 and laminating the second metal film on this first metal film. In the same way as the case of the excitation electrode part forming process, the metal material which is used for the first metal film has the property that it is more easily adhered to the crystal wafer 160 compared with the metal material which is used for the second metal film. Accordingly, in the lead-out terminal forming process in the first embodiment, by constituting the metal film to be provided on the crystal wafer 160 when forming the predetermined metal patterns by a plurality of metal films comprised of the first metal film and second metal film and forming metal films in which the second metal film is laminated on the first metal film, in the same way as the case of the excitation electrode part forming process, when forming the predetermined metal patterns which become the lead-out terminals, peeling of the metal film at the time of working can be reduced, therefore it becomes possible to improve the productivity.

The first lead-out terminals 125a which are formed by the method of production of a crystal device according to the first embodiment forms a state where the second metal layer M12 is laminated on the first metal layer M11. At this time, the metal material which is used for the first metal layer M11 has the property that it is more easily adhered to the crystal blank parts 121 compared with the metal material which is used for the second metal layer M12. Accordingly, by forming a state where the second metal layer M12 is laminated on the first metal layer M11, for the second metal layer M12, use can be made of a metal material which is hard to be adhered to the crystal blank parts 121. If the first lead-out terminals 125a are constituted by only the second metal layer M12 without providing the first metal layer M11, when moving the crystal elements 120 by a suction nozzle in the mounting process, due to the contact with the suction nozzle or contact with the substrate 110 at the time of movement, portions of the lead-out terminals 125a are liable to peel off and electric connection between the first connection parts 127 and the first wiring parts 124a is liable to become difficult. That is, in the present embodiment, by constituting the first lead-out terminals 125a by the first metal layer M11 and the second metal layer M12 laminated on the first metal layer M11, it becomes possible to reduce and lighten the poor conduction between the first wiring parts 124a and the first connection parts 127 due to peeling of the first lead-out terminals 125a at the time of production of the crystal devices.

(Mounting Terminal Forming Process)

The mounting terminal forming process is the process of using a photolithography technique and etching technique to form the first mounting terminals 126 on the lower surfaces of the crystal blank parts 121 at positions facing the first lead-out terminals 125a. In the mounting terminal forming process, first, metal films are coated on the two major surfaces of the crystal wafer 160 at which the crystal blank parts 121 are formed, then photosensitive resists are coated on these metal films and exposed to predetermined patterns and developed. After that, the crystal wafer 160 is immersed in a predetermined etching solution to remove unrequired parts of the metal film. As a result, the first mounting terminals 126 are formed. Accordingly, when viewing the lower surfaces of the crystal blank parts 121 through the crystal blank parts 121 while viewing the upper surfaces of the crystal blank parts 121 on a plane, the first lead-out terminals 125a and the second lead-out terminals 125b are formed so that the two are aligned along the single sides of the crystal blank parts 121 at which the crystal blank parts 121 are fixed, therefore, when viewing the lower surfaces of the crystal blank parts 121 on a plane, the first mounting terminals 126 and the second lead-out terminals 125b are formed so that the two are aligned along the single sides of the crystal blank parts 121 at which the crystal blank parts 121 are fixed.

In the mounting terminal forming process, the metal film which is formed on the major surfaces of the crystal wafer 160 is constituted by a plurality of metal films comprised of the first metal film and second metal film and forms a state where the second metal film is laminated on the first metal film. Accordingly, in the mounting terminal forming process, the formed predetermined metal patterns are comprised of the first metal film from which the unrequired parts are removed and the second metal film from which the unrequired parts are removed and forms a state where they are laminated. Here, the first metal film from which the unrequired parts are removed will be defined as the first metal layer M11, and the second metal film from which the unrequired parts are removed will be defined as the second metal layer M12. Accordingly, in the mounting terminal forming process, the formed predetermined metal patterns are comprised of the first metal layer M11 and second metal layer M12 and form a state where the second metal layer M12 is laminated on the first metal layer M11.

Further, in the mounting terminal forming process, the metal films are formed by coating the first metal film on the surface of the crystal wafer 160 and laminating the second metal film on this first metal film. In the same way as the case of the excitation electrode part forming process, the metal material which is used for the first metal film has the property that it is more easily adhered to the crystal wafer 160 compared with the metal material which is used for the second metal film. Accordingly, in the mounting terminal forming process in the first embodiment, by forming the metal film constituted by the first metal film and second metal film in which the second metal film is laminated on the first metal film as the metal film to be provided on the crystal wafer 160 when forming the predetermined metal patterns, in the same way as the case of the excitation electrode part forming process, when forming the predetermined metal patterns which become the first mounting terminals 126, peeling of the metal film at the time of working can be reduced, therefore it becomes possible to improve the productivity.

Further, the first mounting terminals 126 which are formed by the method of production of a crystal device according to the first embodiment form a state where the second metal layer M12 is laminated on the first metal layer M11. At this time, the metal material which is used for the first metal layer M11 has the property that it is more easily adhered to the crystal blank part 121 compared with the metal material which is used for the second metal layer M12. Accordingly, by forming a state where the second metal layer M12 is laminated on the first metal layer M11, for the metal layer M12, use can be made of a metal material which is hard to be adhered to the crystal blank parts 121. If the first mounting terminals 126 are constituted by only the second metal layer M12 without providing the first metal layer M11, in the mounting process, when bonding the first mounting terminals 126 and the mounting pads 111 of the substrate 110 by the conductive adhesive 140, due to the shrinkage stress caused at the time of curing of the conductive adhesive 140, the first mounting terminals 126 end up peeling, conduction is liable to no longer be achieved between the first connection parts 127 to which the first mounting terminals 126 must be electrically connected and the first mounting terminals 126. That is, in the present embodiment, by constituting the first mounting terminals 126 by the first metal layer M11 and the second metal layer M12 laminated on the first metal layer M11, it becomes possible to reduce poor conduction due to peeling of the first mounting terminals 126 at the time of production of the crystal devices.

Here, in the excitation electrode part forming process, wiring part forming process, lead-out terminal forming process, and mounting terminal forming process, use is made of the same metal material for the first metal film and second metal film. Accordingly, the predetermined metal patterns which are formed in the excitation electrode part forming process, wiring part forming process, lead-out terminal forming process, and mounting terminal forming process are comprised of the first metal layer M11 and the second metal layer M12 laminated on the first metal layer M11.

For the first metal layer M11, use is made of a metal material having a good bondability with the crystal blank part 121. For example, use is made of chromium, Nichrome, titanium, or nickel. For the second metal layer M12, use is made of a metal material having a relatively low electric resistivity among metal materials. For example, use is made of gold, silver, aluminum, an alloy containing gold as the principal ingredient, or an alloy containing silver as the principal ingredient. In the first embodiment, chromium is used for the first metal layer M11, and gold is used for the second metal layer M12. By using chromium for the first metal layer M11, the bondability between the crystal blank part 121 and the second metal layer M12 is secured. By using gold (or alloy containing gold as the principal ingredient) for the second metal layer M12, it becomes possible to reduce a change of frequency of the crystal element due to oxidation of the second metal layer M12 while suppressing an increase of crystal impedance value or electric resistivity.

(Connection Part Forming Process)

The connection part forming process is the process of using vapor deposition technique or sputtering technique and forming the first connection parts 127 upon the upper surfaces, lower surfaces, and side surfaces of the crystal blank parts 121 so that single ends are superimposed on the first lead-out terminals 125a and the other ends are superimposed on the first mounting terminals 126. In the connection part forming process, in a state where the crystal wafer 160 at which the crystal blank parts 121 are formed is sandwiched between metal masks in which through holes for forming metal films having predetermined patterns are formed, vapor deposition or sputtering is carried out, and metal films forming predetermined patterns are formed on predetermined portions of the crystal blank parts 121.

In the connection part forming process, the metal films forming predetermined patterns are comprised of pluralities of metal layers of a third metal layer M13 and fourth metal layer M14 and form states where the fourth metal layer M14 is laminated on the third metal layer M13. Accordingly, the connection parts are provided so that single ends of the first connection parts 127 are superimposed on the first lead-out terminals 125a and the other ends of the first connection parts 127 are superimposed on the first mounting terminals 126, therefore, when paying attention to the two end parts of the first connection parts 127, structures in which the first metal layer M11, second metal layer M12, third metal layer M13, and fourth metal layer M14 are laminated in that order are formed.

For the third metal layer M13, use is made of a metal material having a good bondability with the crystal blank parts 121. For example, use is made of chromium, Nichrome, titanium, or nickel. By using a metal material having a good bondability with the crystal blank parts 121 for the third metal layer M13 and providing the fourth metal layer M14 on the third metal layer M13, even a metal material having the property of being hard to be adhered to the crystal blank parts 121 can be used for the fourth metal layer M14 on the side surfaces of the crystal blank parts 121. If the first connection parts 127 are constituted by only the fourth metal layer M14 without providing the third metal layer M13, when moving the crystal elements 120 by a suction nozzle in the mounting process, due to the contact with the suction nozzle or contact with the substrate 110 at the time of movement, portions of the first connection parts 127 are liable to peel off, therefore it becomes difficult to electrically connect the first lead-out terminals 125a and the first mounting terminals 126. That is, in the present embodiment, by constituting the first connection parts 127 by the third metal layer M13 and the fourth metal layer M14 laminated on the third metal layer M13, it is possible to reduced the poor conduction between the first lead-out terminals 125a and the first mounting terminals 126 due to peeling of the first connection parts 127 at the time of production of the crystal devices, consequently it becomes possible to reduce the increase of equivalent series resistance value.

For the fourth metal layer M14, use is made of a metal material having a relatively low electric resistivity among metal materials. Due to this, the increase of crystal impedance value or equivalent series resistance value caused by the first connection parts 127 can be suppressed. For the fourth metal layer M14, for example, use is made of gold, silver, aluminum, an alloy containing gold as the principal ingredient, or an alloy containing silver as the principal ingredient.

Further, for the fourth metal layer M14, use is made of a metal material having a low electric resistivity compared with the second metal layer M12. Due to this, when comparing electric resistivities of the first mounting terminals 126, first connection parts 127, first lead-out terminals 125a, first wiring parts 124a, and first excitation electrode parts 123a, the electric resistivity in the first connection parts 127 can be made smaller, therefore it becomes possible to make the crystal impedance values of the crystal elements 120 smaller. Further, compared with the case where the same metal material as that for the second metal layer M12 is used, the electric resistivity can be reduced more and the increase of equivalent series resistance value can be reduced.

In the first embodiment, chromium is used for the third metal layer M13 and silver is used for the fourth metal layer M14. By using chromium for the third metal layer M13, it becomes possible to secure bondability between the second metal layer M12 made of gold and the fourth metal layer M14 as well while securing the bondability between the crystal blank parts 121 and the fourth metal layer M14. By using silver for the fourth metal layer M14, change of frequency of the crystal elements 120 due to oxidation of the fourth metal layer M14 by oxygen in the surroundings can be reduced while suppressing the electric resistivity in the first connection parts 127 more. Further, by using silver for the fourth metal layer M14, when use is made of a conductive adhesive 140 comprised of a silicone resin binder in which a conductive powder is contained as a conductive filler, the formation of a coating film by the binder on the fourth metal layer M14 can be reduced, therefore it becomes possible to secure the conduction with the conductive filler contained in the conductive adhesive 140. Note that, here, the case where the fourth metal layer M14 is made of silver is explained, but it may be made of a metal containing silver to which a few percentage of palladium or the like is added as the principal ingredient in order to reduce sulfuration of the silver.

In the connection part forming process, the first connection parts 127 are formed by a vapor deposition technique or sputtering technique, therefore it becomes unnecessary to irradiate ultraviolet light on the side surfaces of the crystal blank parts 121 unlike the conventional connection part forming process. In the case where the first connection parts 127 are formed by using a photolithography technique and etching technique as in the conventional connection part forming process, when irradiating the ultraviolet light on the side surfaces of the crystal blank parts 121, it liable to occur that the adjacent crystal blank parts 121 or crystal wafer 160 blocks irradiation, therefore ultraviolet light having a predetermined intensity cannot be irradiated on the side surfaces of the crystal blank parts 121, so the ultraviolet light cannot be stably irradiated. As a result, there is a case where the first connection parts 127 cannot be stably formed. The state where the connection parts cannot be stably formed means a state where the widths of the connection parts become much thinner than the desired widths or the connection parts are partially disconnected when removing the unrequired metal film. This is a phenomenon caused because the state of deterioration of the photosensitive resist differs depending on the intensity of the ultraviolet light when irradiating ultraviolet light on the photosensitive resist.

Accordingly, in the connection part forming process in the method of production of a crystal device according to the first embodiment, the first connection parts 127 are formed by using a vapor deposition technique or sputtering technique, therefore it becomes unnecessary to irradiate ultraviolet light on the side surfaces of the crystal blank part 121. For this reason, in the method of production of a crystal device according to the first embodiment, the first connection parts 127 can be stably formed. As a result, in the connection part forming process in the method of production of a crystal device according to the first embodiment, the crystal impedance of the crystal devices can be stabilized while suppressing poor conduction between the first lead-out terminals 125a and the first mounting terminals 126. From another viewpoint, it becomes possible to reduce thinning of the line widths of the first connection parts 127 more than the desired line widths and reduce the increase of equivalent series resistance value. Due to this, it becomes possible to improve the productivity of the crystal devices.

Further, in the connection part forming process, use is made of a crystal wafer 160 in which a photolithography technique and etching technique are used to form metal films having predetermined patterns, specifically, the first excitation electrode parts 123a, second excitation electrode parts 123b, first wiring parts 124a, second wiring parts 124b, first lead-out terminals 125a, second lead-out terminals 125b, and first mounting terminals 126 at predetermined positions in the crystal blank parts 121. In the connection part forming process in the method of production of a crystal device according to the first embodiment, single ends of the first connection parts 127 are superimposed on the first lead-out terminals 125a, whereby it becomes possible to reliably electrically connect the first connection parts 127 and the first lead-out terminals 125a. Further, by formation so that the other ends of the first connection parts 127 are superimposed on the first mounting terminals 126, it becomes possible to reliably electrically connect the first connection parts 127 and the first mounting terminals 126. Accordingly, in the connection part forming process in the method of production of a crystal device according to the first embodiment, the first lead-out terminals 125a and first mounting terminals 126 which are formed by using a photolithography technique and etching technique and the first connection parts 127 to be formed by using a vapor deposition technique or sputtering technique are reliably electrically connected.

Further, in the connection part forming process, parts of the first connection parts 127 are formed on the inner circumferential surfaces of the through holes 162 which are formed in the crystal blank part forming process. Accordingly, in the connection part forming process, it becomes possible to easily form the first connection parts 127 and therefore the productivity can be improved because the inner circumferential surfaces of the through holes 162 become the side surfaces including the predetermined single sides of the crystal blank parts 121.

Further, in the connection part forming process, the first connection parts 127 are formed on the inner circumferential surfaces of the through holes 162 which are formed in the crystal blank part forming process. Therefore, compared with the case where parts of the first connection parts 127 are formed on single sides of the crystal blank parts 121 (single long sides of the crystal blank parts 121) which are connected to the predetermined single sides of the crystal blank parts 121 (single short sides of the crystal blank parts 121) at which the crystal blank parts 121 are fixed, the pitches of crystal blank parts 121 which are adjacent to each other can be shortened. As a result, the number of the crystal blank parts 121 to be formed in one crystal wafer 160 can be made larger, so it becomes possible to improve the productivity.

Further, in the connection part forming process, when viewing the upper surfaces of the crystal blank parts 121 on a plane, the end parts of the first connection parts 127 on the upper surface sides of the crystal blank parts 121 are positioned at positions where they are superimposed on the first mounting terminals 126 which are formed on the lower surfaces of the crystal blank parts 121. Accordingly, when viewing the lower surfaces of the crystal blank parts 121 on a plane while viewing them through the crystal blank parts 121 from the upper surface sides of the crystal blank parts 121, the distances between the sides of the first connection parts 127 which face the second excitation electrode parts 123*b* and the sides of the second excitation electrode parts 123*b* which face the first connection part 127 sides can be made longer than the distances between the sides of the first mounting terminals 126 which face the second excitation electrode part 123*b* sides and the sides of the second excitation electrode parts 123*b* which face the first mounting terminal 126 sides. Due to this, it becomes possible to reduce the occurrence of spurious vibration due to an inverse piezoelectric effect between the first connection parts 127 and the second excitation electrode parts 123*b*.

Further, in the connection part forming process, when viewing the lower surfaces of the crystal blank parts 121 on a plane, parts of the first connection parts 127 are formed on the side surfaces including the predetermined single sides of the crystal blank parts 121 on which the first mounting terminals 126 and the second lead-out terminals 125*b* are formed aligned, specifically, the predetermined single sides of the crystal blank parts 121 (single short sides of the crystal blank parts 121) at which the crystal blank parts 121 are fixed at the crystal wafer 160. Due to this, the distances between the side surfaces of the crystal blank parts 121 on which parts of the first connection parts 127 are formed and the second excitation electrode parts 123*b* can be made longer compared with the case where they are formed on the side surfaces including single sides of the crystal blank parts 121 (single long sides of the crystal blank parts 121) which are connected to the predetermined single sides of the crystal blank parts 121.

When used as crystal devices, voltage is applied from the external portions of the crystal devices. At this time, electric charges having different polarities are applied to the first mounting terminals 126 and the second lead-out terminals 125*b*. Therefore, in the first connection parts 127 which are electrically connected to the first mounting terminals 126 and in the second excitation electrode parts 123*b* which are electrically connected to the second lead-out terminals 125*b*, electric charges having different polarities are stored. In general, the amounts of electric charges which are stored differ according to the individual volumes. The larger the volumes are, the larger the amounts of electric charges which are stored become. Further, the piezoelectric material has the characteristic that the larger the difference of amounts of electric charges having different polarities is, the stronger the intensity of the electric field induced becomes and the easier the inverse piezoelectric effect occurs.

In the connection part forming process in the method of production of a crystal device according to the first embodiment, by forming parts of the first connection parts 127 on the side surfaces of the crystal blank parts 121 including the predetermined single sides of the crystal blank parts 121 (single short sides of the crystal blank parts 121) on which the first mounting terminals 126 and the second lead-out terminals 125*b* are formed aligned, the distances between the second excitation electrode parts 123*b* in which electric charges having a different polarity from that for the first connection parts 127 are stored, and parts of the first connection parts 127 which are formed on the side surfaces of the crystal blank parts 121 can be made longer compared with the case where they are formed on the side surfaces including single sides of the crystal blank parts 121 (single long sides of the crystal blank parts 121) which are connected to the predetermined single sides of the crystal blank parts 121. Accordingly, in the connection part forming process in the method of production of a crystal device according to the first embodiment, even when the thicknesses in the up-and-down direction of the first connection parts 127 are made thicker or the widths of the first connection parts 127 are made wider in order to reliably electrically connect the first mounting terminals 126 and the first lead-out terminals 125*a* by the first connection parts 127, it becomes possible to reduce occurrence of spurious vibration due to an inverse piezoelectric effect between the first connection parts 127 and the second excitation electrode parts 123*b*. As a result, the problem of the increase of crystal impedance values of the crystal devices due to spurious vibration can be reduced, therefore the productivity can be improved.

Further, in the connection part forming process in the method of production of a crystal device according to the first embodiment, by forming parts of the first connection parts 127 on the side surfaces including single short side of the crystal blank parts 121, the distances between the parts of the first connection parts 127 which are formed on the side surfaces and the second excitation electrode parts 123*b* can be made longer. Due to this, in the connection part forming process in the method of production of a crystal device according to the first embodiment, the spurious vibration caused by the first connection parts 127 and the second excitation electrode parts 123*b* can be reduced, the problem of the crystal impedance values of the crystal devices becoming larger is reduced, and it becomes possible to improve the productivity more.

(Segmentation Process)

The segmentation process is the process of snapping or cutting off the predetermined single sides of the crystal blank parts 121 which are formed at the crystal wafer 160 and thereby obtaining the separate crystal blank parts 121. In the crystal wafer 160 before the segmentation process, the crystal blank parts 121 having first excitation electrode parts 123*a*, second excitation electrode parts 123*b*, first wiring parts 124*a*, second wiring parts 124*b*, first lead-out terminals 125*a*, second lead-out terminals 125*b*, first mounting terminals 126, and first connection parts 127 which are formed thereon are fixed on single sides of the major surfaces of the crystal blank parts 121. In the segmentation process, the wafer is segmented into the individual crystal blank parts 121, whereby the crystal elements (vibration elements) 120 are formed.

(Mounting Process)

The mounting process is the process of electrically bonding the second lead-out terminal 125*b* and first mounting terminal 126 which are formed on each crystal blank 121 to mounting pads 111 which are provided on an upper surface of a substrate 110 to mount the crystal blank 121. In the mounting process, first, a conductive adhesives 140 are coated on the pair of mounting pads 111 of the substrate 110 by for example a dispenser. After that, the crystal blank 121 on which the first excitation electrode part 123*a*, second excitation electrode part 123*b*, first wiring part 124*a*, second wiring part 124*b*, first lead-out terminal 125*a*, second lead-out terminal 125*b*, first mounting terminal 126, and first connection part 127 are formed, that is, the crystal element 120, is placed on the conductive adhesive 140. When subjected to thermal curing in that state, the conductive adhesive 140 is sandwiched between one mounting pad 111 and the first mounting terminal 126, and the conductive adhesive 140 is sandwiched between the other mounting pad 111 and the second lead-out terminal 125b. In the mounting process, by thermal curing of the conductive adhesive 140 which is sandwiched between the one mounting pad 111 and the first mounting terminal 126 and the conductive adhesive 140 which is sandwiched between the other mounting pad 111 and the second lead-out terminal 125b, the one mounting pad 111 and the first mounting terminal 126 are electrically bonded, while the other mounting pad 111 and the second lead-out terminal 125b are electrically bonded, thereby mounting the crystal element 120 on the upper surface of the substrate 110.

(Lid Bonding Process)

The lid bonding process is the process of bonding a substrate 110 and a lid 130. In the lid bonding process, the upper surface of the substrate 110 and the lower surface of the lid 130 are bonded by the joining member 150, and the crystal element 120 mounted on the upper surface of the substrate 110 is hermetically sealed in a space which is formed by the substrate 110 and the lid 130. Here, the case where the material of the joining member 150 is made glass will be explained. In the lid bonding process, first, a paste-state glass frit paste which is formed by adding binder and solvent is coated on the lower surface of the sealing frame 132 of the lid 130, specifically the lower surface of the frame portion 132a and the lower surface of the flange portion 132b, by screen printing process and dried. Next, the lid 130 is arranged on the substrate 110 so that this glass frit paste is positioned between the upper surface of the substrate 110 and the lower surface of the lid 130. In this state, the glass frit paste is heated and melted, then solidified. That is, in the lid bonding process, the joining member 150 is provided between the upper surface of the substrate 110 and the lower surface of the lid 130, heated and melted, and solidified again, thereby bonding the substrate 110 and the lid 130.

In the method of production of a crystal device according to the first embodiment, a photolithography technique and etching technique are used to form the first excitation electrode parts 123a, first wiring parts 124a, and first lead-out terminals 125a on the upper surfaces of the crystal blank parts 121 and form the second excitation electrode parts 123b, second wiring parts 124b, second lead-out terminals 125b, and first mounting terminals 126 on the lower surfaces of the crystal blank parts 121. After that, a vapor deposition technique or sputtering technique is used to form the first connection parts 127 upon the upper surfaces, lower surfaces, and side surfaces of the crystal blank parts 121 so that single ends are superimposed on the first lead-out terminals 125a and the other ends are superimposed on the first mounting terminals 126. Accordingly, in the method of production of a crystal device according to the first embodiment, it becomes unnecessary to irradiate ultraviolet light on the side surfaces of the crystal blank parts 121 unlike the connection part forming process in the conventional method of production of a crystal device, therefore the first connection parts 127 can be stably formed. Further, in the method of production of a crystal device according to the first embodiment, the first connection parts 127 can be stably formed, therefore the crystal impedance of the crystal device can be stabilized while suppressing poor conduction between the first lead-out terminals 125a and the first mounting terminals 126. From another viewpoint, the increase of equivalent series resistance value can be reduced. Due to this, in the method of production of a crystal device according to the first embodiment, it becomes possible to improve the productivity of the crystal devices.

Further, in the method of production of a crystal device according to the first embodiment, in the connection part forming process, when viewing the lower surfaces of the crystal blank parts 121 on a plane, parts of the first connection parts 127 are formed on the side surfaces including the predetermined single sides of the crystal blank parts 121 on which the first mounting terminals 126 and the second lead-out terminals 125b are formed so that the two are aligned, specifically the predetermined single sides of the crystal blank parts 121 at which the crystal blank parts 121 are fixed. Accordingly, in the method of production of a crystal device according to the first embodiment, when viewing the lower surfaces of the crystal elements 120 at which the crystal blank parts 121 are formed by segmentation on a plane, the distances between parts of the first connection parts 127 which are formed on the side surfaces and the sides of the second excitation electrode parts 123b which face the side surface sides can be made longer compared with the case where the first connection parts 127 are formed on single sides of the crystal blank parts 121 which are connected to the predetermined single sides at which the crystal blank parts 121 are fixed. For this reason, in the method of production of a crystal device in the first embodiment, when the parts are used as crystal devices, if voltage is applied from the external portions and electric charges having different polarities are stored in the first connection parts 127 and in the second excitation electrode parts 123b, the occurrence of spurious vibration can be reduced due to an inverse piezoelectric effect between the parts of the first connection parts 127 which are formed on the side surfaces and the second excitation electrode parts 123b. As a result, in the method of production of a crystal device of the first embodiment, the increase of the crystal impedance values of the crystal devices which is caused due to the spurious vibration caused by parts of the first connection parts 127 which are formed on the side surface and the second excitation electrode part 123b can be reduced, therefore the productivity can be improved.

Further, in the method of production of a crystal device according to the first embodiment, in the connection part forming process, parts of the first connection parts 127 are formed on the side surfaces including single sides of the crystal blank parts 121. Accordingly, in the method of production of a crystal device according to the first embodiment, when viewing the crystal blank parts 121 which are segmented in the segmentation process, that is, the lower surfaces of the formed crystal elements 120 on a plane, the distances between parts of the first connection parts 127 which are formed on the side surfaces and the sides of the second excitation electrode parts 123b which face the side surface sides can be made longer compared with the case where the first connection parts 127 are formed on the side surfaces including single long sides of the crystal blanks 121. For this reason, in the method of production of a crystal device of the first embodiment, when used as crystal devices, if voltage is applied from the external portions and electric charges having different polarities are stored in the first connection parts 127 and in the second excitation electrode parts 123b, the occurrence of spurious vibration can be reduced due to an inverse piezoelectric effect between parts of the first connection parts 127 which are formed on the side surfaces and the second excitation electrode parts 123b. As a result, in the method of production of a crystal device of the first embodiment, the increase of the crystal impedance values of the crystal devices caused by the spurious vibration caused by parts of the first connection parts 127 which are formed on the side surfaces and the second excitation electrode parts 123b can be reduced, therefore the productivity can be improved.

Further, in the method of production of a crystal device according to the first embodiment, in the crystal blank part forming process, the through holes 162 are formed at predetermined single sides of the crystal blank parts 121, and the side surfaces including the predetermined single sides of the crystal blank parts 121 are formed in the state of the crystal wafer 160. For this reason, in the method of production of a crystal device according to the first embodiment, parts of the first connection parts 127 can be easily formed on the side surfaces including the predetermined single sides of the crystal blank parts 121, therefore the productivity can be improved.

Further, in the method of production of a crystal device according to the first embodiment, compared with the case where parts of the first connection parts 127 are formed on single sides which are connected to predetermined single sides of the crystal blank parts 121 at which the crystal blank parts 121 are fixed, the pitch of the crystal blank parts 121 adjacent to each other can be made shorter, therefore the number of crystal blank parts 121 which are formed in one crystal wafer 160 can be made larger therefore the productivity can be improved.

Further, in the method of production of a crystal device according to the first embodiment, a photolithography technique and etching technique are used to form the first excitation electrode parts 123a and second excitation electrode parts 123b at predetermined positions on the crystal blank parts 121. For this reason, in the method of production of a crystal device according to the first embodiment, unlike the case where the first excitation electrode parts 123a and second excitation electrode parts 123b are formed by the vapor deposition technique or sputtering technique, it is not necessary to perform positioning in the metal film coating-use masks according to the outer shape of the crystal wafer 160 in which the crystal blank parts 121 are formed. Therefore, compared with the case where the vapor deposition technique or sputtering technique is used, the first excitation electrode parts 123a and second excitation electrode parts 123b can be formed at predetermined positions on the crystal blank parts 121 with a high precision. Accordingly, in the method of production of a crystal device according to the first embodiment, it becomes possible to reduce the increase of the crystal impedance values of the crystal devices caused by the deviation of the first excitation electrode parts 123a or second excitation electrode parts 123b from the predetermined positions.

Further, in the method of production of a crystal device according to the first embodiment, in the excitation electrode part forming process, wiring part forming process, lead-out terminal forming process, and mounting terminal forming process, a metal film constituted by the first metal film and the second metal film laminated on the first metal film is formed, and predetermined metal patterns in which the second metal layer M12 is laminated on the first metal layer M11 are formed, therefore peeling of the second metal film (or second metal layer M12) can be reduced by the first metal film (or first metal layer M11). Accordingly, in the method of production of a crystal device according to the first embodiment, it becomes possible to reduce the increase of crystal impedance values caused due to peeling of the second metal film (or second metal layer M12) by forming the first metal film (or first metal layer M11) and improve the productivity. Further, in the method of production of a crystal device according to the first embodiment, in the connection part forming process, predetermined metal patterns in which the fourth metal layer M14 is laminated on the third metal layer M13 are formed, therefore peeling of the fourth metal layer M14 can be reduced by the third metal layer M13. Accordingly, in the method of production of a crystal device according to the first embodiment, it becomes possible to reduce the increase of crystal impedance value or equivalent series resistance value due to peeling of the fourth metal film by forming the third metal layer M13 and thus improve the productivity.

Further, in the method of production of a crystal device according to the first embodiment, the second metal layer M12 and the fourth metal layer M14 are made of different metal materials and the electric resistivity of the metal material for the fourth metal layer M14 is smaller than the electric resistivity of the metal material for the second metal layer M12. Accordingly, in the method of production of a crystal device according to the first embodiment, it becomes possible to make the electric resistivity smaller by exactly the amount of the first connection part 127, the crystal impedance value or equivalent series resistance value can be made smaller, so it becomes possible to improve the productivity.

Further, in the method of production of a crystal device according to the first embodiment, a metal material containing gold as the principal ingredient is used for the second metal layer M12 and a metal material containing silver as the principal ingredient is used for the fourth metal layer M14. Accordingly, in the method of production of a crystal device according to the first embodiment, it becomes possible to reduce the amount of oxidation by oxygen in the surroundings, therefore the change in frequency due to oxidation is suppressed and therefore the productivity can be improved. Further, the change of frequency which is caused by deterioration of the second metal layer M12 and fourth metal layer M14 according to the environment in the surroundings can be reduced while reducing the increase of equivalent series resistance value.

Further, by providing the first lead-out terminal 125a on the upper surface of the crystal blank 121, when voltage is applied to the crystal blank 121 by the first excitation electrode part 123a and second excitation electrode part 123b to cause a thickness slip vibration in portion of the crystal blank 121 which is sandwiched between the first excitation electrode part 123a and the second excitation electrode parts 123, different from the thickness slip vibration, contour slip vibration of vibration of the contour of the crystal blanks 121 can be attenuated by exactly the amount of mass of the first lead-out terminals 125a. The contour slip vibration is a vibration different from the thickness slip vibration, therefore is sometimes combined with the thickness slip vibration. When this is combined with the thickness slip vibration, the equivalent series resistance value is liable to increase. Accordingly, in the present embodiment, by providing the first lead-out terminal 125a, the contour slip vibration is attenuated and combination of the contour slip vibration and thickness slip vibration is reduced. For this reason, it becomes possible to reduce the increase of equivalent series resistance value which is caused by combining of the contour slip vibration and the thickness slip vibration.

Second Embodiment

Below, a method of production of a crystal device in a second embodiment will be explained. Note that, the same notations will be attached to the same portions as those in the first embodiment, and the explanations will be suitably omitted.

The method of production of a crystal device according to the second embodiment is comprised, as shown in FIG. 15 to FIG. 24, of the crystal wafer forming process, crystal blank part forming process, excitation electrode part forming process, wiring Part Forming Process, lead-out terminal forming process, mounting terminal forming process, connection part forming process, segmentation process, mounting process, and lid boding process. This is different from the first embodiment in the point that second mounting terminals 226b are formed together with first mounting terminals 226a in the mounting terminal forming process, and second connection parts 227b are formed together with first connection parts 227a in the connection part forming process.

(Mounting Terminal Forming Process)

The mounting terminal forming process is the process of using a photolithography technique and etching technique to form the second mounting terminals 226b on the upper surfaces of the crystal blank parts 221 at positions which face the second lead-out terminals 225b while forming the first mounting terminals 226a on the lower surfaces of the crystal blank parts 221 at positions which face the first lead-out terminals 225a. That is, in the mounting terminal forming process, the mounting terminals 226 constituted by the first mounting terminals 226a and second mounting terminals 226b are formed. In the mounting terminal forming process, first, metal films are coated on the two major surfaces of a crystal wafer 260 at which the crystal blank parts 221 are formed, then photosensitive resists are coated on the metal films and exposed to predetermined patterns and developed. After that, the crystal wafer 260 is immersed in a predetermined etching solution to remove the unrequired parts of the metal films. As a result, the first mounting terminals 226a are formed at predetermined positions on the lower surfaces of the crystal blank parts 221, and the second mounting terminals 226b are formed at predetermined positions on the upper surfaces of the crystal blank parts 221. At this time, when viewing the upper surfaces of the crystal blank parts 221 on a plane, a state where the first lead-out terminals 225a and the second lead-out terminals 226b are formed so that the two are aligned along the predetermined single sides of the crystal blank parts 221 is exhibited. When viewed on a plane while viewing the lower surfaces of the crystal blank parts 221 through the crystal blank parts 221 from the upper surface sides of the crystal blank parts 221, the states where the first mounting terminals 226a and the second lead-out terminals 225b are formed so that the two are aligned along the predetermined single sides of the crystal blank parts 221 are exhibited.

(Connection Part Forming Process)

The connection part forming process is the process of using a vapor deposition technique or sputtering technique to form first connection parts 227a on the upper surfaces, lower surfaces, and side surfaces of the crystal blank parts 221 so that single ends are superimposed on the first lead-out terminals 225a and the other ends are superimposed on the first mounting terminals 226a and to form second connection parts 227b on the upper surfaces, lower surfaces, and side surfaces of the crystal blank parts 221 so that single ends are superimposed on the second lead-out terminals 225b and the other ends are superimposed on the second mounting terminals 226b. That is, in the connection part forming process, connection parts 227 constituted by the first connection parts 227a and second connection parts 227b are formed.

In the connection part forming process, the first connection parts 227a and second connection parts 227b are formed by a vapor deposition technique or sputtering technique, therefore it becomes unnecessary to irradiate the ultraviolet light on the side surfaces of the crystal blank parts 221 unlike the conventional connection part forming process. In a case where the first connection parts 227a and second connection parts 227b are formed by using a photolithography technique and etching technique as in the conventional connection part forming process, when irradiating the ultraviolet light on the side surfaces of the crystal blank parts 221, the crystal blank parts 221 which are adjacent to them and the crystal wafer 260 obstruct irradiation, therefore ultraviolet light having a predetermined intensity cannot be irradiated on the side surfaces of the crystal blank parts 221, so the ultraviolet light is liable to unable to be stably irradiated. As a result, sometimes it becomes impossible to stably form the first connection parts and second connection parts. The state where the first connection parts 227a and second connection parts 227b cannot be formed means the state where, when removing the unrequired metal film, the widths of the connection parts become much thinner than the desired widths or the connection parts are partially disconnected. This is a phenomenon which is caused because the state of deterioration of the photosensitive resist differs depending on the intensity of the ultraviolet light when irradiating the ultraviolet light on the photosensitive resists.

Accordingly, in the connection part forming process in the method of production of a crystal device according to the second embodiment, the first connection parts 227a and second connection parts 227b are formed by using a vapor deposition technique or sputtering technique, therefore it becomes unnecessary to irradiate the ultraviolet light on the side surfaces of the crystal blank parts 121. For this reason, in the method of production of a crystal device according to the second embodiment, the first connection parts 227a and the second connection parts 227b can be stably formed. As a result, in the connection part forming process in the method of production of a crystal device according to the second embodiment, the crystal impedance of the crystal device can be stabilized while suppressing the poor conduction between the first lead-out terminals 225a and the first mounting terminals 226a and the poor conduction between the second lead-out terminals 225b and the second mounting terminals 226b. Due to this, it becomes possible to improve the productivity of the crystal devices.

In the connection part forming process in the method of production of a crystal device according to the second embodiment, the first connection parts 227a and the first lead-out terminals 225a are reliably electrically connected by forming the first connection parts 227a so that single ends of the first connection parts 227a are superimposed on the first lead-out terminals 225a, and the first connection parts 227a and the first mounting terminals 226a are reliably electrically connected by forming the first connection parts 227a so that the other ends of the first connection parts 227a are superimposed on the first mounting terminals 226a. Further, the second connection parts 227b and the second lead-out terminals 225b are reliably electrically connected by forming the second connection parts 227b so that single ends of the second connection parts 227b are superimposed on the second lead-out terminals 225b, and the second connection parts 227b and the second mounting terminals 226b are reliably electrically connected by forming the second connection parts 227b so that the other ends of the second connection parts 227b are superimposed on the second mounting terminals 226b. Accordingly, in the method of production of a crystal device of the second embodiment, the first mounting terminals 226a, second mounting terminals 226b, first lead-out terminals 225a, and second lead-out terminals 225b which are formed by using a photolithography technique and etching technique can be reliably electrically connected by first connection parts 227a and second connection parts 227b.

Further, in the connection part forming process, by utilizing the inner circumferential surfaces of the through holes 262 which are formed in the crystal blank part forming process, the first connection parts 227a and second connection parts 227b are formed. Accordingly, in the method of production of a crystal device of the second embodiment, the inner circumferential surfaces of the through holes 262 become the side surfaces including the predetermined single sides of the crystal blank parts 221, therefore parts of the first connection parts 227a and parts of the second connection parts 227b can be easily formed on the side surfaces including the predetermined single sides of the crystal blank parts 221, so the productivity can be improved.

Further, in the connection part forming process, the first connection parts 227a and second connection parts 227b are formed on the inner circumferential surfaces of the through holes 262 which are formed in the crystal blank part forming process. Therefore, compared with the case where parts of the first connection parts 227 are formed on single sides of the crystal blank parts 221 connected to the predetermined single sides of the crystal blank parts 221 at which the crystal blank parts 221 are fixed, the pitch of the crystal blank parts 221 which are adjacent to each other can be made shorter, resulting in the number of crystal blank parts 221 which are formed at one crystal wafer 260 can be made larger, so it becomes possible to improve the productivity.

Further, in the connection part forming process, when viewing the upper surfaces of the crystal blank parts 221 on a plane, the sizes of portions of the first connection parts 227a which are formed on the upper surfaces of the crystal blank parts 221 and the sizes of portions of the second connection parts 227b which are formed on the upper surfaces of the crystal blank parts 221 become the same, and the sizes of portions of the first connection parts 227a which are formed on the lower surfaces of the crystal blank parts 221 and the sizes of portions of the second connection parts 227b which are formed on the lower surfaces of the crystal blank parts 221 become the same. Accordingly, the first connection parts 227a and second connection parts 227b which are formed in the connection part forming process are formed so as to become axially symmetric with respect to virtual lines which pass through the centers of the predetermined single sides of the crystal blank parts 221 at which the crystal blank parts 221 are fixed and are parallel to the sides of the crystal blank parts 221 which are connected to the predetermined single sides of the crystal blank parts 221 at which the crystal blank parts 221 are fixed. For this reason, the masses of the predetermined metal patterns which are formed on the crystal blank parts 221, specifically the excitation electrode parts 222 (223a, 223b), wiring parts 224 (224a, 224b), lead-out terminals 225 (225a, 225b), mounting terminals 226 (226a, 226b), and connection parts 227 (227a, 227b) become the same between the right and the left (or the top and the bottom) of the virtual lines which pass through the centers of the predetermined single sides of the crystal blank parts 221 at which the crystal blank parts 221 are fixed and are parallel to the sides of the crystal blank parts 221 which are connected to the predetermined single sides of the crystal blank parts 221 at which the crystal blank parts 221 are fixed.

When voltage is applied from the external portions of the crystal device, a part of the crystal blank 221 which is sandwiched between the first excitation electrode part 223a and the second excitation electrode part 223b vibrates. However, at this time, this vibration is leaked to the outside of the part of the crystal blank 221 which is sandwiched between the first excitation electrode part 223a and the second excitation electrode part 223b as well. For this reason, the ease of vibration becomes different according to not only the first excitation electrode part 223a and second excitation electrode part 223b, but also the metal films which are formed on the crystal blank 221. Further, in general, the piezoelectric material has the property of the ease of vibration differing according to the weight of the metal films which are formed on the upper surface and lower surface of the crystal blank 221.

That is, the masses of the predetermined metal patterns which are formed on the crystal blank part 221, specifically, the excitation electrode parts 222 (223a, 223b), wiring parts 224 (224a, 224b), lead-out terminals 225 (225a, 225b), mounting terminals 226 (226a, 226b), and connection parts 227 (227a, 227b) become the same between the right and the left (or the top and bottom) of the virtual line which passes through the center of the predetermined single side of the crystal blank part 221 at which the crystal blank part 221 is fixed and is parallel to the side of the crystal blank part 221 which is connected to the predetermined single side of the crystal blank part 221 at which the crystal blank part 221 is fixed. Therefore, when voltage is applied to the crystal device from the external portions, the influence upon the vibration of the crystal blank 221 which is sandwiched between the first excitation electrode part 223a and the second excitation electrode part 223b becomes the same between the right and the left with respect to the virtual line. As a result, the ease of vibration of the crystal blank 221 which is sandwiched between the first excitation electrode part 223a and the second excitation electrode part 223b becomes the same between the right and the left with respect to the virtual line, therefore a vibration balance in the part which is sandwiched between the first excitation electrode part 223a and the second excitation electrode part 223b becomes good, so the increase of crystal impedance value can be reduced.

In the method of production of a crystal device of the second embodiment, in the connection part forming process, the first connection parts 227a and the second connection parts 227b are formed so as to become axially symmetric with respect to the virtual lines which pass through the centers of the predetermined single sides of the crystal blank parts 221 at which the crystal blank parts 221 are fixed and are parallel to the sides of the crystal blank parts 221 which are connected to the predetermined single sides of the crystal blank parts 221 at which the crystal blank parts 221 are fixed. Therefore, in the method of production of a crystal device of the second embodiment, the masses of the predetermined metal patterns which are formed on the crystal blank parts 221, specifically, the excitation electrode parts 222 (223a, 223b), wiring parts 224 (224a, 224b), lead-out terminals 225 (225a, 225b), mounting terminals 226 (226a, 226b), and connection parts 227 (227a, 227b) become the same between the right and the left (or the top and bottom) of the virtual lines which pass through the centers of the predetermined single sides of the crystal blank parts 221 at which the crystal blank parts 221 are fixed and are parallel to the sides of the crystal blank parts 221 which are connected to the predetermined single sides of the crystal blank parts 221 at which the crystal blank parts 221 are fixed. For this reason, in the method of production of a crystal device of the second embodiment, when voltage is applied from the external portions, the influence upon the vibration of the crystal blanks 221 which are sandwiched between the first excitation electrode parts 223a and the second excitation electrode parts 223b can be made the same between the right and the left with respect to the virtual lines. As a result, in the method of production of a crystal device of the second embodiment, the vibration balance in the parts which are sandwiched between the first excitation electrode parts 223a and the second excitation electrode parts 223b becomes good, increase of the crystal impedance values can be reduced, therefore it becomes possible to improve the productivity.

Further, the first lead-out terminals 225a and second mounting terminals 226b are provided on the upper surfaces of the crystal blanks 121. Therefore, as explained in the first embodiment, by attenuating the contour slip vibration, the combination of the contour slip vibration and thickness slip vibration is reduced, and consequently it becomes possible to reduce the possible increase of the equivalent series resistance value. Further, not only the first lead-out terminals 225a, but also the second mounting terminals 226b are provided, therefore it becomes possible to further reduce the increase of equivalent series resistance values more than the case where only the first lead-out terminals 225a are provided.

Further, when the crystal elements 220 are mounted by the conductive adhesive 140 by providing the first lead-out terminals 225a and the second mounting terminals 226b so that the two are aligned along the predetermined single sides of the upper surfaces of the crystal blanks 221, it becomes possible to make the states of the lower surfaces of the crystal blanks 221 and the states of the upper surfaces of the crystal blanks 221 approach each other more. When the crystal elements 220 are mounted by the conductive adhesive 140, the first mounting terminals 226a and the second lead-out terminals 225b which are provided on the lower surfaces of the crystal blanks 221 are bonded by the conductive adhesive 140, but the conductive adhesive 140 is not provided on the upper surfaces of the crystal elements 220. Accordingly, when the first lead-out terminals 225a and the second mounting terminals 226b are not provided on the upper surface sides of the crystal blanks 221, a state where vibration (thickness slip vibration and contour slip vibration) is influenced by bonding by the conductive adhesive 140 on the lower surface sides of the crystal blanks 221, but the vibration (thickness slip vibration and contour slip vibration) is not influenced on the upper surface sides of the crystal blanks 221 is exhibited. For this reason, by providing the first lead-out terminals 225a and second mounting terminals 226b on the upper surface sides of the crystal blanks 221, the vibration is influenced by only the amounts of the masses of the first lead-out terminals 225a and second mounting terminals 226b on the upper surface sides of the crystal blanks 221, therefore it becomes possible to influence the vibration on the upper surface sides of the crystal blanks 221 compared with the conventional case. As a result, when the crystal elements 220 are mounted by the conductive adhesive 140, the influences upon the vibrations can be made to approach between the lower surface sides of the crystal blanks 221 and the upper surface sides of the crystal blanks 221, therefore the vibration balance becomes good, so the increase of the equivalent series resistance values can be reduced more.

Further, the first lead-out terminals 225a and the second mounting terminals 226b which are provided so that the two are aligned along the predetermined single sides on the upper surfaces of the crystal blanks 221 are provided at positions so that they become axially symmetric with respect to the virtual vertical lines (not shown) which are perpendicular to the predetermined single sides of the crystal blanks 221 while passing through the centers of the crystal blanks 221. Accordingly, the masses of the metal patterns which are provided on the upper surfaces of the crystal blanks 221 can be made to approach each other more between the right and the left of the virtual vertical lines with respect to the virtual vertical lines which are perpendicular to the predetermined single sides of the crystal blanks 221 while passing through the centers of the crystal blanks 221. For this reason, when voltage is applied and parts of the crystal blanks 221 are vibrated, it becomes possible to make the states of vibration on the right and the left of the virtual vertical lines approach each other, therefore the vibration balance can be made better between the right and the left of the virtual vertical lines. As a result, it becomes possible to reduce the increase of equivalent series resistance values more.

The first mounting terminals 226a and the second lead-out terminals 225b which are aligned as a pair along the edge parts of the predetermined single sides of the crystal blanks 221 are for example provided so that, when viewing the lower surfaces of the crystal elements 220 on a plane, they become axially symmetric with respect to the virtual vertical lines (not shown) which pass through the centers of the crystal blanks 221 and are parallel to the predetermined single sides of the crystal blanks 221. Accordingly, when the first mounting terminal 226a and the second lead-out terminal 225b and the mounting pads 111 of the substrate 110 are bonded by the conductive adhesives 140, the influence upon the thickness slip vibration by bonding of the conductive adhesives 140 can be made to approach each other between the right and the left of the virtual vertical line. For this reason, balances of the right and the left with respect to the virtual vertical line due to bonding by the conductive adhesives 140 can be approached, therefore the state of holding of the crystal element 220 can be stabilized more, and it becomes possible to reduce the increase of equivalent series resistance value.

Note that, in the present embodiment, the case where the first lead-out terminals which are formed on the upper surfaces of the crystal blanks and the first mounting terminals which are formed on the lower surfaces of the crystal blanks have the same sizes when viewed on a plane was explained, but the sizes of the first lead-out terminals which are formed on the upper surfaces of the crystal blanks may become smaller than the sizes of the first mounting terminals as well. Due to this, occurrence of spurious vibration between the first lead-out terminals and the second excitation electrode parts can be reduced, so it becomes possible to improve the productivity.

Further, in the present embodiment, the case where the excitation electrode part forming process, wiring part forming process, lead-out terminal forming process, and mounting terminal forming process are separately carried out was explained. However, the excitation electrode part forming process, wiring part forming process, lead-out terminal forming process, and mounting terminal forming process may be simultaneously carried out as well.

Further, in the present embodiment, the case where the crystal blank part forming process, excitation electrode part forming process, wiring part forming process, lead-out terminal forming process, and mounting terminal forming process are separately carried out was explained. However, the crystal blank part forming process, excitation electrode part forming process, wiring part forming process, lead-out terminal forming process, and mounting terminal forming process may be simultaneously carried out as well. At this time, for the metal films provided on the two major surfaces of the crystal wafer in the crystal blank part forming process, use is made of the same metal materials as those for the metal films provided in the excitation electrode part forming process, wiring part forming process, lead-out terminal forming process, and mounting terminal forming process.

Third Embodiment

Below, a crystal device of a third embodiment will be explained. Note that, the same notations will be attached to the same portions as those in the first embodiment, and the explanation will be suitably omitted.

The crystal device according to the third embodiment, as shown in FIG. 25 to FIG. 28, is constituted by a crystal element 320, a substrate 110 on which the crystal element 320 is mounted, and a lid 130 which is bonded to the substrate 110 and hermetically seals the crystal element 120 in a concave portion 133 which is formed with the substrate 110. Note that, the perspective view of the crystal device according to the third embodiment is the same as FIG. 1.

The crystal element 320 is for obtaining a stable mechanical vibration and transmitting a reference signal of electronic equipment or the like. The crystal element 320 is comprised of a crystal blank 321 and metal patterns which are formed on the surfaces of the crystal blank 321, specifically, excitation electrode parts 322 (323a, 323b), wiring parts 324 (324a, 324b), lead-out terminals 325 (325a, 325b), mounting terminals 326 (326a, 326b), and connection parts 327 (327a, 327b). Further, the crystal element 320 is mounted on the upper surface of the substrate 110 by conductive adhesives 140 in a state where a portion of the metal patterns provided on the lower surface of the crystal blank 321, specifically, the second lead-out terminal 325b and first mounting terminal 326a, are bonded to and held by the pair of mounting pads 111 provided on the upper surface of the substrate 110 and are electrically connected.

The present embodiment differs from the other embodiments mainly in the constitution of the connection parts 327. The constitutions and method of production etc. of the crystal blank 321, excitation electrode parts 322, wiring parts 324, lead-out terminals 325, and mounting terminals 326 are the same as those in the first and second embodiments, therefore the explanation is omitted. Note that, the present embodiment is for example configured so that, in the same way as the second embodiment, not only the first mounting terminal 326a and first connection part 327a, but also the second mounting terminal 326b and second connection part 327b are provided.

The connection parts 327, in the same way as the connection parts in the first and second embodiments, are for connecting the lead-out terminals 325 and the mounting terminals 326. By superimposition on these terminals, they contribute to reduction and lightening of increase of the equivalent series resistance value caused by poor conduction. Note, the connection parts 327 differ from the connection parts in the first and second embodiments in specific shapes and dimensions. Note that, they are the same as the first and second embodiments in the other points. For example, they are the same as the first and second embodiments in the point that the connection parts 327 may be formed by a sputtering technique or vapor deposition technique, the metal film may be constituted by the third metal layer M13 and fourth metal layer M14, and the like, therefore the explanation is omitted. Other than those, the points not particularly referred to in the following description may be the same as the connection parts in the first and second embodiments.

Figure 27A:
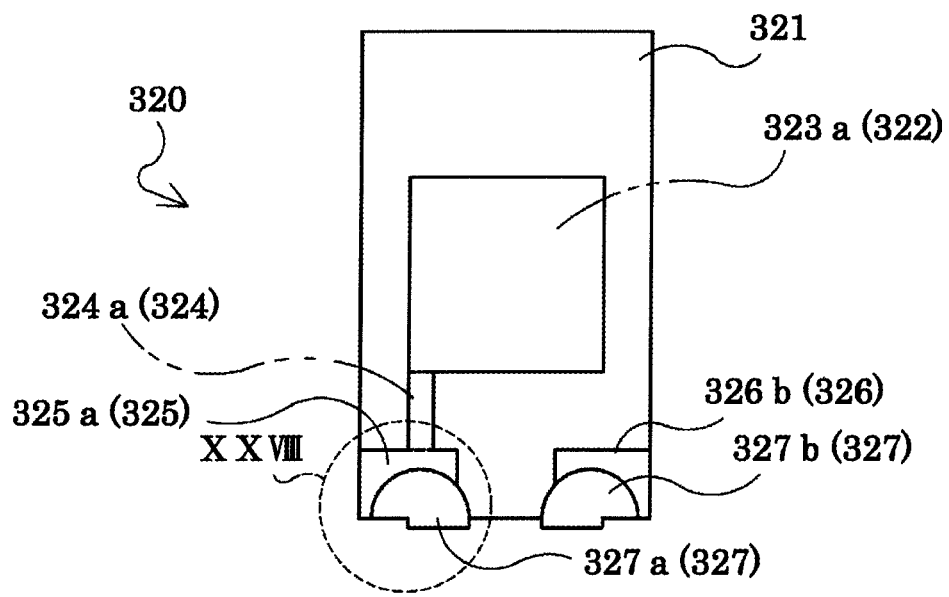
FIG. 27A is a plan view of the upper surface of the crystal element which is used in the crystal device in the third embodiment.
Figure 27B:
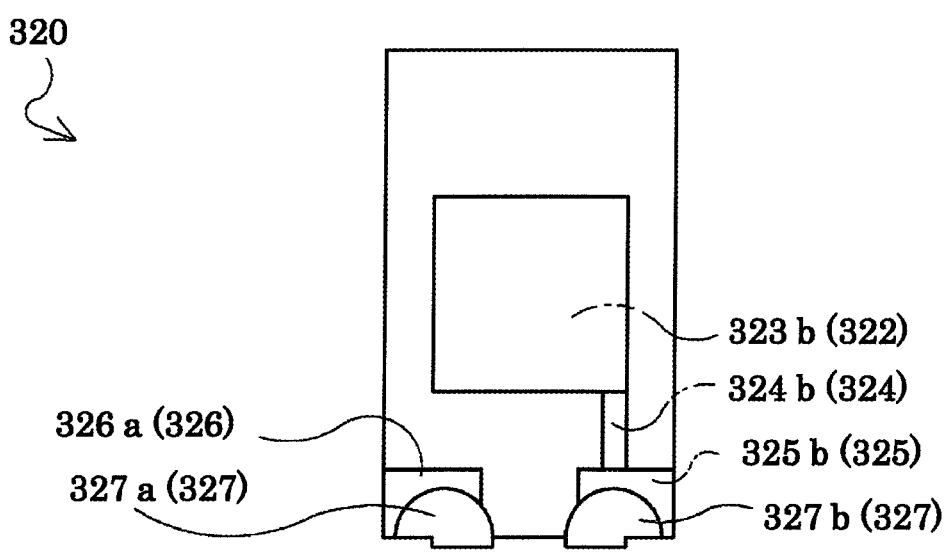
FIG. 27B is a transparent view when viewing the lower surface through the crystal element which is used in the crystal device in the third embodiment from the upper surface through the crystal element.

In the connection parts 327, as shown in FIG. 27A and FIG. 27B, when viewing the crystal blank 321 on a plane, the two end parts of the connection parts 327 have arc shapes. At this time, the centers of circles of the arcs are positioned on the outer edge side of the crystal blank 321. By setting in this way, when stress is applied in a direction which is parallel to the lower surface of the crystal blank 321 and extends from the outer edge of the crystal blank 321 toward the inner side, it becomes possible to mitigate this stress at the end parts of the connection parts 327. Accordingly, by forming the two end parts of the connection parts 327 in arc shapes and setting so that the centers of circles of the arcs are positioned on the outer edge side of the crystal blank 321, even in a case where shrinkage stress is applied in a direction which is parallel to the lower surface of the crystal blank 321 and extends from the outer edge of the crystal blank 321 toward the inner side when the conductive adhesive 140 is cured, this stress can be mitigated at the end parts of the connection parts 327. For this reason, in the crystal element 320, the stress which is applied to the end parts of the crystal blank 321 can be mitigated, therefore it becomes possible to reduce peeling of the connection parts 327 at the end parts of the crystal blank 321. As a result, the poor conduction between the first connection part 327a and the first mounting terminal 326a can be reduced, and it becomes possible to reduce the increase of the equivalent series resistance value due to the poor conduction between the first connection part 327a and the first mounting terminal 326a.

In particular, by forming the two end parts of the connection parts 327 to semi-circles or semi-ellipsoids, even in a case where shrinkage stress is applied in a direction which is parallel to the lower surface of the crystal blank 321 and extends from the outer edge of the crystal blank 321 toward the inner side, this stress can be mitigated more at the end parts of the connection parts 327. For this reason, the stress applied to the end parts of the crystal blank 321 can be mitigated, and it becomes possible to reduce peeling of the connection parts 327 at the end parts of the crystal blank 321. As a result, the poor conduction between the first connection part 327a and the first mounting terminal 326a can be reduced, and it becomes possible to reduce the increase of equivalent series resistance value due to the poor conduction between the first connection part 327a and the first mounting terminal 326a.

Figure 26:
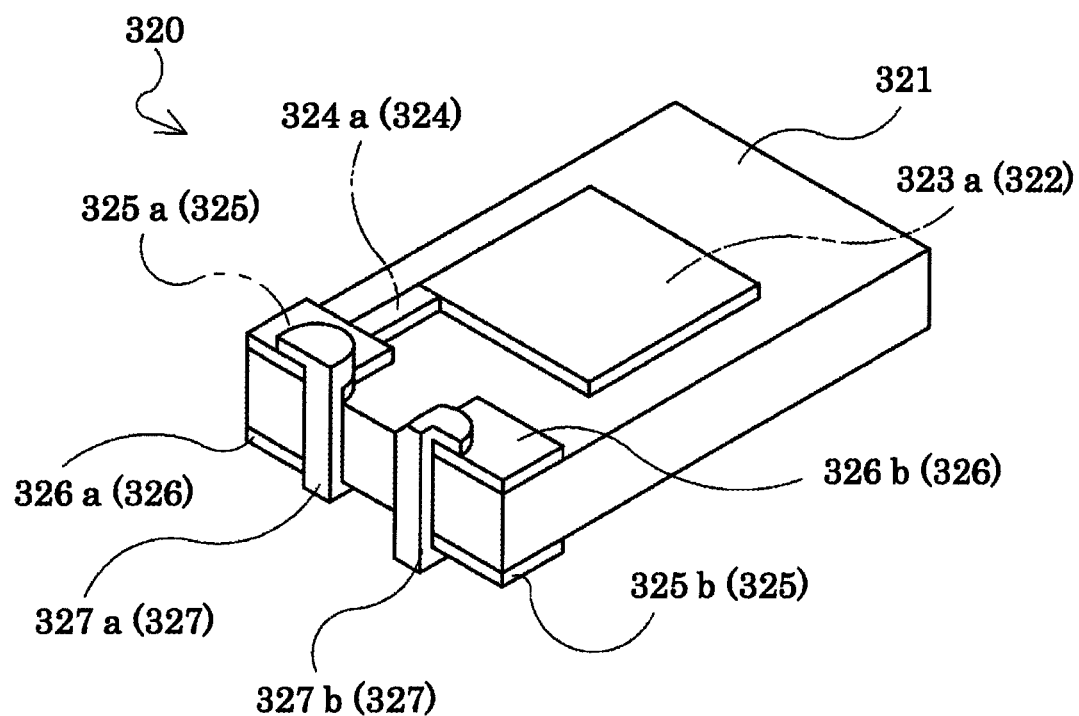
FIG. 26 A perspective view of a crystal element which is used in the crystal device in the third embodiment.
Figure 28:
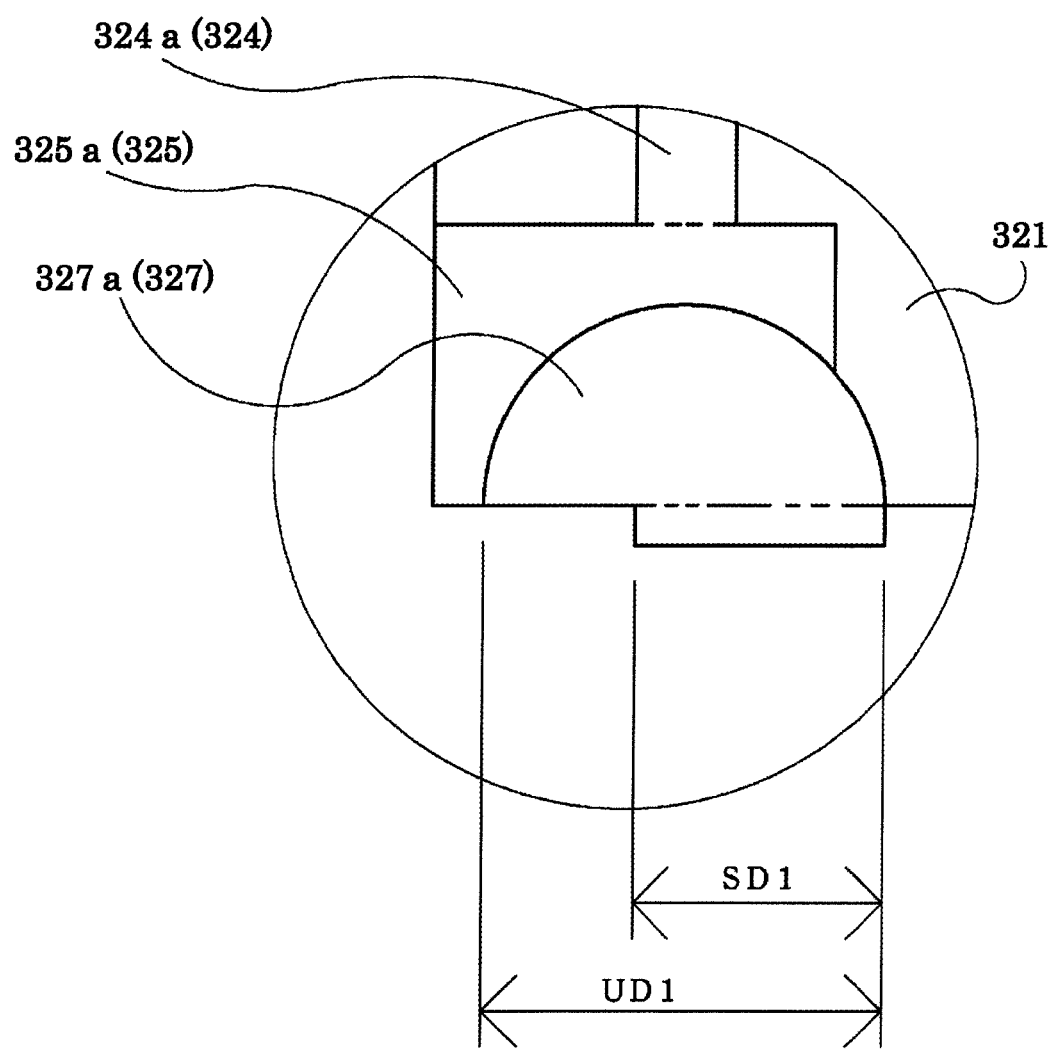
FIG. 28 A partially enlarged diagram of an XXVIII portion in FIG. 27.

In the connection parts 327, as shown in FIG. 26, the widths of portions of the connection parts 327 which are provided on the side surface of the crystal blank 321 become narrower than the widths of portions of the connection parts 327 which are provided on the upper surface of the crystal blank 321. Here, the widths of the portions of the connection parts 327 which are provided on the side surface of the crystal blank 321 are the lengths of the portions of the connection parts 327 which is parallel to the predetermined single side of the crystal blank on which the first lead-out terminal 325a and the second mounting terminal 326b are provided aligned when viewing the side surface of the crystal blank 321 on a plane. In the present embodiment, the widths of the portions of the connection parts 327 which are provided on the side surface of the crystal blank 321 will be referred to as the "side surface distances". Note that, as shown in FIG. 28, the side surface distance of the first connection part 327a will be defined as the "first side surface distance SD1", and the side surface distance of the second connection part 327b will be defined as the "second side surface distance (not shown)". Further, the widths of the portions of the connection parts 327 which are provided on the upper surface of the crystal blank 321 are, when viewing the upper surface of the crystal blank 321 on a plane, the lengths of the connection parts 327 on the predetermined single side of the crystal blank 322 on which the first lead-out terminal 325a and the second mounting terminal 326b are provided aligned. In the present embodiment, the widths of the portions of the connection parts 327 which are provided on the upper surface of the crystal blank 321 will be referred to as the "upper surface distances". Note that, as shown in FIG. 28, the upper surface distance of the first connection part 327a will be defined as the "first upper surface distance UD1", and the upper surface distance of the second connection part 327b will be defined as the "second upper surface distance" (not shown). Accordingly, in the first connection part 327a, the first side surface distance SD1 becomes shorter than the first upper surface distance UD1, and in the second connection part 327b, the second side surface distance becomes shorter than the second upper surface distance.

By employing such a constitution, the obstruction with respect to the thickness slip vibration can be reduced, and it becomes possible to reduce the increase of equivalent series resistance value. As the reasons for this, the following matter is considered. When voltage is applied to the excitation electrode parts 322 of the crystal blank 321, the portion of the crystal blank 321 which is sandwiched between the excitation electrode parts 322 starts the thickness slip vibration due to the inverse piezoelectric effect and piezoelectric effect. The thickness slip vibration is, as explained before, the vibration in the direction from the upper surface of the crystal blank 321 toward the lower surface of the crystal blank 321, that is, the thickness direction of the crystal blank 321. When voltage is applied to the excitation electrode parts 322, the state of the thickness slip vibration of the crystal blank 321 becomes one that the portion of the crystal blank 321 which is sandwiched between the excitation electrode parts 322 performs the thickness slip vibration most, the vibration leaks from the portion of the crystal blank 321 which is sandwiched between the excitation electrode parts 322, therefore the thickness slip vibration occurs even in a portion of the crystal blank 321 which is not sandwiched between the excitation electrode parts 322. Further, in the portion of the crystal blank 321 which is not sandwiched between the excitation electrode parts 322, the thickness slip vibration gradually attenuates as it goes from the outer edge of the excitation electrode parts 322 toward the end part of the crystal blank 321. Accordingly, even at the end part of the crystal blank 321, thickness slip vibration occurs. That is, since thickness slip vibration occurs even at the end parts of the crystal blank 321, in a case where the state changes on the surface of the crystal blank 321 in the thickness direction, in other words, on a side surface of the crystal blank 321, for example a case where a material which is different from the crystal such as a metal material is provided on the side surface of the crystal blank 321, the thickness slip vibration of the crystal blank 321 is influenced. Accordingly, by making the amount of change of the state of the side surface of the crystal blank 321 smaller, it becomes possible to reduce the obstruction with respect to the thickness slip vibration of the crystal blank 321, therefore it becomes possible to reduce the increase of equivalent series resistance value.

In the present embodiment, there is exhibited a constitution in which the first lead-out terminal 325a and second mounting terminal 326b which are provided on the upper surface of the crystal blank 321 and the first mounting terminal 326a and second lead-out terminal 325b which are provided on the lower surface of the crystal blank 321 are electrically connected by the connection parts 327, therefore portions of the connection parts 327 are provided on a side surface of the crystal blank 321. At this time, the widths of the portions of the connection parts 327 which are provided on the side surface of the crystal blank 321 (side surface distance) become narrower than the widths of the portions of the connection parts 327 which are provided on the upper surface of the crystal blank 321 (upper surface distance). By constituting the part in this way, the amount of change of the state of the side surface of the crystal blank 321 due to the connection part 327 can be made smaller, therefore it becomes possible to reduce the obstruction with respect to the thickness slip vibration of the crystal blank 322. As a result, the increase of equivalent series resistance value due to the obstruction of thickness slip vibration of the crystal blank 321 can be reduced.

In the connection part 327, when viewing the upper surface of the crystal blank 321 on a plane, the area of the portion in which the first lead-out terminal 325a and the first connection part 327a are superimposed on each other becomes a half or more of the area of the first lead-out terminal 325a or more. By employing such a constitution, due to the first connection part 327a which is provided on the upper surface of the crystal blank 321, the conduction with the first lead-out terminal 325a can be more reliably secured. Accordingly, even in a case where the first lead-out terminal 325a is provided on the inner edge side from the outer edge of the upper surface of the crystal blank 321, the conduction between the first connection part 327a and the first lead-out terminal 325a can be more reliably secured, therefore it becomes possible to reduce the increase of equivalent series resistance value due to the poor conduction between the first connection part 327a and the first lead-out terminal 325a. The relationship of area of the first lead-out terminal 325a and the first connection part 327a was explained, but this may be the same also for the relationships of areas of the first mounting terminal 326a and first connection part 327a, the second lead-out terminal 325b and the second connection part 327b, and the second mounting terminal 326b and the second connection part 327b.

The connection parts 327 are provided, when viewing the upper surface of the crystal blank 321 on a plane, on a side surface including the predetermined single side of the upper surface of the crystal blank 321 on which the first lead-out terminal 325a and the second mounting terminal 326b are provided so as to be aligned. By providing them in this way, when viewing the upper surface of the crystal blank 321 on a plane, it becomes possible to make the distance from the side of the excitation electrode part 322 which faces the first lead-out terminal 325a side up to the connection parts 327 which are provided on the side surface of the crystal blank 321 longer. Accordingly, the influence of the connection parts 327 upon the thickness slip vibration which is leaked and transmitted up to the end parts of the crystal blank 321 can be reduced more, therefore it becomes possible to reduce the increase of equivalent series resistance value. Note that, this effect is exerted in the same way even in the first embodiment and second embodiment in which the connection parts are provided on the side surface on which the lead-out terminals and the mounting terminals are provided aligned.

The sizes of the crystal blank 321, excitation electrode part 322, and wiring part 324 may be for example the same as those in the first embodiment. In the lead-out terminal 325 and the mounting terminal 326, for example, when viewing the crystal blank 321 on a plane, the sides parallel to the long side of the crystal blank 321 become 25 to 300 µm, and the sides parallel to the short side of the crystal blank 321 become 75 to 500 µm. In the connection parts 327, for example, the widths of the portions provided on the upper surface of the crystal blank 321 (upper surface distance) become 75 to 500 µm, and the widths of the portions provided on the side surface of the crystal blank 321 (side surface distance) become 30 to 400 µm. Note that, the thicknesses of these metal patterns are for example 50 to 500 Å in the same way as the first embodiment.

Further, here, the method of using the conductive adhesives 140 and electrically bonding the crystal element 320 to the pair of mounting pads 111 which are provided on the upper surface of the substrate 110 to thereby mount the crystal element 320 on the substrate 110 will be explained. First, the conductive adhesives 140 are coated on the mounting pads 111 by for example a dispenser. After that, the crystal element 320 is conveyed onto the conductive adhesives 140, the crystal element 320 is placed so as to sandwich the conductive adhesives 140 between the mounting pads 111 and the lower surface of the crystal blank 321, and thermal curing is carried out in that state. At this time, the conductive adhesive 140 which is coated on one mounting pad 111 is sandwiched between one mounting pad 111 and the first mounting terminal 326a which is provided on the lower surface of the crystal blank 321 and is sandwiched between the one mounting pad 111 and the first connection part 327a as well. The conductive adhesive 140 is hardened by thermal curing and electrically bonds the one mounting pad 111 and the first mounting terminal 326a and electrically bonds the one mounting pad 111 and the first connection part 327a. The conductive adhesive 140 which is coated on the other mounting pad 111 is sandwiched between the other mounting pad 111 and the second lead-out terminal 325b which is provided on the lower surface of the crystal blank 321 and is sandwiched between the other mounting pad 111 and the second connection part 327b as well. The conductive adhesive 140 is solidified by thermal curing and electrically bonds the other mounting pad 111 and the second lead-out terminal 325b and electrically bonds the other mounting pad 111 and the second connection part 327b. In this way, by providing the conductive adhesive 140 not only between the first mounting terminal 326a or second lead-out terminal 325b and the mounting pad 111, but also between the connection part 327 and the mounting pad 111, in a case where shrinkage stress caused when the conductive adhesive 140 is cured is applied, the shrinkage stress is applied to the first mounting terminal 326a or second lead-out terminal 325b and the connection part 327. Therefore, compared with the case where the conductive adhesive 140 is provided only between the mounting pad 111 and the first mounting terminal 326a or second lead-out terminal 325b as in the conventional case, the shrinkage stress which is applied to the first mounting terminal 326a or second lead-out terminal 325b can be reduced. For this reason, it becomes possible to reduce and lighten the increase of equivalent series resistance value which is caused by peeling of a portion of the first mounting terminal 326a or second lead-out terminal 325b due to the shrinkage stress.

The crystal device according to the present embodiment is provided with the crystal blank 321 having a substantially block shape, a first excitation electrode part 323a which is provided on the upper surface of the crystal blank 321, a first wiring part 324a which extends from the first excitation electrode part 323a up to the edge part of the upper surface of the crystal blank 321, a first lead-out terminal 325a which is provided on the edge part of the upper surface of the crystal blank 321 so as to be connected to the first wiring part 324a, a first mounting terminal 326a which is provided at a position which faces the first lead-out terminal 325a on the lower surface of the crystal blank 321, a first connection part 327a which is provided so that one end is superimposed on the first lead-out terminal 325a and the other end is superimposed on the first mounting terminal 326a, a second excitation electrode part 323b which is provided on the lower surface of the crystal blank 321, a second wiring part 324b which extends from the second excitation electrode part 323b up to the edge part of the lower surface of the crystal blank 321, a second lead-out terminal 325b which is provided on the edge part of the lower surface of the crystal blank 321 so as to be connected to the second wiring part 324b, a substrate 110 having a first mounting pad 111 and a second mounting pad 111 which are provided on its upper surface, conductive adhesives 140 which are provided between the first mounting pad 111 and the first mounting terminal 326a and between the second mounting pad 111 and the second lead-out terminal 325b, and a lid 130 which is bonded to the upper surface of the substrate 110.

In the present embodiment, by employing such a constitution, at the end part of the upper surface of the crystal blank 321, the thickness in the up-and-down direction can be made thicker by exactly the amount of the first connection part 327a. Therefore, in a case where stress is applied in a direction which is vertical to the lower surface of the crystal blank 321 and extends from the upper surface of the crystal blank 321 toward the lower surface of the crystal blank 321, it becomes possible to reduce the peeling due to the stress concentration at the end parts of the upper surface of the crystal blank 321. Accordingly, in the present embodiment, even in a case where shrinkage stress is applied in a direction which is vertical to the lower surface of the crystal blank 321 and extends from the upper surface of the crystal blank 321 toward the lower surface of the same when the conductive adhesive 140 is cured, compared with the conventional case, peeling due to the stress concentration can be reduced at the end parts of the upper surface of the crystal blank 321. For this reason, in the present embodiment, it becomes possible to reduce the poor conduction between the first lead-out terminal 325a and the first connection part 327a due to the peeling and reduce and lighten the increase of equivalent series resistance value caused by this poor conduction.

Further, the crystal device according to the present embodiment is provided with the second mounting terminal 326b which is provided on the upper surface of the crystal blank 321 at a position which faces the second lead-out terminal 325b and with the second connection part 327b which is provided so that one end is superimposed on the second mounting terminal 326b and the other end is superimposed on the second lead-out terminal 325b. By providing the second mounting terminal 326b on the upper surface of the crystal blank 321 in this way, when voltage is applied to the first excitation electrode part 323a and second excitation electrode part 323b to cause a thickness slip vibration in the portion of the crystal blank 321 which is sandwiched between the first excitation electrode part 323a and the second excitation electrode part 323b, separately from the thickness slip vibration, contour slip vibration of vibration of the contour of the crystal blank 321 can be attenuated exactly by the amount of the mass of the second mounting terminal 326b. Accordingly, in the present embodiment, it becomes possible to reduce the increase of equivalent series resistance value due to combination of the contour slip vibration and thickness slip vibration. Note that, it is possible to realize such an effect even in a case where the only the terminal on the upper surface of the crystal blank 321 is the first lead-out terminal 325*a*. However in the case where the terminals on the upper surface of the crystal blank 321 are constituted by the first lead-out terminal 325*a* and second mounting terminal 326*b*, more than the case where the only terminal is the first lead-out terminal 325*a*, it becomes possible to further reduce the increase of equivalent series resistance value.

Further, in the present embodiment, by providing the first lead-out terminal 325*a* and the second mounting terminal 326*b* so that the two are aligned along the edge part of a predetermined single side of the upper surface of the crystal blank 321, in a case where the crystal element 320 is mounted by the conductive adhesives 140, it becomes possible to make the state of the lower surface of the crystal blank 321 and the state of the upper surface of the crystal blank 321 approach each other more. Accordingly, in the present embodiment, by providing the first lead-out terminal 325*a* and second mounting terminal 326*b* on the upper surface side of the crystal blank 321, the vibration is affected by only the amount of mass of the first lead-out terminal 325*a* and second mounting terminal 326*b* on the upper surface side of the crystal blank 321. Therefore, compared with the conventional case, it becomes possible to influence the vibration on the upper surface side of the crystal blank 321. As a result, in the present embodiment, when the crystal element 320 is mounted by the conductive adhesives 140, the vibration balance becomes better and the increase of equivalent series resistance value can be reduced more because the influences upon the vibrations on the lower surface side of the crystal blank 321 and on the upper surface side of the crystal blank 321 can be made to approach.

Further, in the crystal device according to the present embodiment, the end parts of the first connection part 327*a* form arc shapes, and the centers of circles of the arcs are positioned on the outer edge sides of the crystal blank 321. By forming the part in this way, in the present embodiment, in a case where stress is applied in a direction which is parallel to the lower surface of the crystal blank 321 and extends from the outer edges of the crystal blank 321 toward the inner side, it becomes possible to mitigate this stress at the end parts of the first connection part 327*a*. Accordingly, in the present embodiment, by forming the two end parts of the first connection part 327*a* in arc shapes and positioning the centers of circles of the arcs on the outer edge sides of the crystal blank 321, even in a case where shrinkage stress is applied in the direction which is parallel to the lower surface of the crystal blank 321 and extends from the outer edges of the crystal blank 321 toward the inner side when the conductive adhesive 140 cures, this stress can be mitigated at the end parts of the first connection part 327*a*. For this reason, in the present embodiment, the stress which is applied to the end parts of the crystal blank 321 can be mitigated, and it becomes possible to reduce peeling of the first connection part 327*a* at the end parts of the crystal blank 321. As a result, the poor conduction between the first connection part 327*a* and the first mounting terminal 326*a* can be reduced, therefore it becomes possible to reduce the increase of equivalent series resistance value due to poor conduction.

Further, in the crystal device according to the present embodiment, the end parts of the first connection part 327*a* become semi-circular shapes or semi-ellipsoid shapes. In the present embodiment, by forming the part in this way, even in the case where stress is applied in the direction which is parallel to the lower surface of the crystal blank 321 and extends from the outer edge of the crystal blank 321 toward the inner side, this stress can be mitigated more at the end parts of the first connection part 327*a*. For this reason, in the present embodiment, the stress applied to the end parts of the crystal blank 321 can be mitigated, therefore it becomes possible to reduce peeling of the first connection part 327*a* at the end parts of the crystal blank 321. As a result, in the present embodiment, the poor conduction between the first connection part 327*a* and the first mounting terminal 326*a* can be reduced, and it becomes possible to reduce the increase of equivalent series resistance value due to the poor conduction.

In the crystal device according to the present embodiment, the width of the portion of the first connection part 327*a* which is provided on the side surface of the crystal blank 321 becomes narrower compared with the width of the portion of the first connection part 327*a* which is provided on the upper surface of the crystal blank 321. In the present embodiment, by employing such a constitution, the obstruction with respect to the thickness slip vibration can be reduced, therefore it becomes possible to reduce the increase of equivalent series resistance value. This is because the thickness slip vibration occurs also at the end part of the crystal blank 321. The thickness slip vibration is, as explained before, as shown in FIG. 29, the vibration in a direction from the upper surface of the crystal blank 321 toward the lower surface of the crystal blank 321, that is, the thickness direction of the crystal blank 321. When voltage is applied to the excitation electrode parts 322, the portion of the crystal blank 321 which is sandwiched between the excitation electrode parts 322 causes thickness slip vibration due to the inverse piezoelectric effect and piezoelectric effect. However, at this time, a state arises where the thickness slip vibration also leaks to a portion which is not sandwiched between the excitation electrode parts 322. Accordingly, a state arises where the thickness slip vibration gradually attenuates from the portion of the crystal blank 321 which is sandwiched between the excitation electrode parts 322, but the thickness slip vibration occurs also at the end part of the crystal blank 321. For this reason, according to the state of the side surface of the crystal blank 321, it becomes easier for the thickness slip vibration such as the vibration in the thickness direction of the crystal blank 321 to be influenced. From the above description, by making the width of the portion of the connection part 327 which is provided on the side surface portion of the crystal blank 321 narrower, the area can be made smaller and the change of state at the side surface of the crystal blank 321 can be made smaller, therefore it becomes possible to make the obstruction with respect to the thickness slip vibration at the end part of the crystal blank 321 further smaller. As a result, the obstruction with respect to the thickness slip vibration can be reduced, so it becomes possible to reduce the increase of equivalent series resistance value more.

Further, in the crystal device according to the present embodiment, when viewing the upper surface of the crystal blank 321 on a plane, the area of the portion in which the first lead-out terminal 325*a* and the first connection part 327*a* are superimposed on each other becomes a half of the area of the first lead-out terminal 325*a* or more. In the present embodiment, by employing such a constitution, due to the portion of the first connection part 327*a* which is provided on the upper surface of the crystal blank 321, the conduction between the first connection part 327*a* and the first lead-out terminal 325*a* can be more reliably secured.

Accordingly, in the present embodiment, even in a case where the first lead-out terminal 325a is provided on the inner edge side from the outer edge of the upper surface of the crystal blank 321, the conduction between the first connection part 327a and the first lead-out terminal 325a can be more reliably secured, therefore it becomes possible to reduce the increase of equivalent series resistance value due to poor conduction between the first connection part 327a and the first lead-out terminal 325a.

Further, in the crystal device according to the present embodiment, the conductive adhesive 140 is provided not only between the first mounting terminal 326a and the first mounting pad 111, but also between the other end of the first connection part 327a and the mounting pad 111. In the present embodiment, by doing this, when shrinkage stress is applied when the conductive adhesive 140 cures, the shrinkage stress is applied to the first mounting terminal 326a and the first connection part 327a. Therefore, compared with the case where the conductive adhesive 140 is provided only between the mounting pad 111 and the first mounting terminal 326a, the shrinkage stress which is applied to the first mounting terminal 326a can be reduced. For this reason, in the present embodiment, it becomes possible to reduce and lighten the increase of equivalent series resistance value caused by peeling of a portion of the first mounting terminal 326a due to the shrinkage stress.

Note that, in the present embodiment, the case where the crystal blank forms a schematically rectangular flat plate shape is explained. However when viewing the upper surface on a plane, so far as it forms a schematically rectangular shape, the blank may be for example a mesa type crystal blank in which the thickness in the up-and-down direction of the crystal blank becomes thick in the center portion of the crystal blank or an inverse mesa type crystal blank in which the thickness in the up-and-down direction of the crystal blank becomes thin in the center portion of the crystal blank.

In the first embodiment and second embodiment, the method of forming the excitation electrode parts, wiring parts, lead-out terminals, and mounting terminals by using a photolithography technique and etching technique and forming the connection parts by using a vapor deposition technique or sputtering technique was explained. However the method for forming the metal patterns is not limited to this. For example, in the crystal devices of the first embodiment to third embodiment, the excitation electrode parts, wiring parts, lead-out terminals, and mounting terminals may be formed by using a vapor deposition technique or sputtering technique. Further, for example, the connection parts may be formed by using a photolithography technique and etching technique. The method for forming the excitation electrode parts, wiring parts, lead-out terminals, and mounting terminals and the method for forming the connection parts may be the same as each other or may be different from each other.

Priorities are claimed on Japanese application No. 2014-112432 filed on May 30, 2014, No. 2014-222114 filed on Oct. 31, 2014 and No. 2015-15125 filed on Jan. 29, 2015, the contents of which are incorporated herein by reference.

REFERENCE SIGNS LIST

110 . . . substrate
111 . . . mounting pad
112 . . . external terminal
120, 220, 320 . . . crystal elements
121, 221, 321 . . . crystal blanks
122, 222, 322 . . . excitation electrode parts
123a, 223a, 323a . . . first excitation electrode parts
123b, 223b, 323b . . . second excitation electrode parts
124, 224, 324 . . . wiring parts
124a, 224a, 324a . . . first wiring parts
124b, 224b, 324b . . . second wiring parts
125, 225, 325 . . . lead-out terminals
125a, 225a, 325a . . . first lead-out terminals
125b, 225b, 325b . . . second lead-out terminals
126, 226a, 326a . . . first mounting terminals
226b, 326b . . . second mounting terminals
127, 227a, 327a . . . first connection parts
227b, 327b . . . second connection parts
130 . . . lid
131 . . . sealing base
132 . . . sealing frame
133 . . . concave portion
140 . . . conductive adhesive
150 . . . joining member
160 . . . crystal wafer
161 . . . crystal blank formation-use through hole
162 . . . through hole

The invention claimed is:

1. A crystal device comprising:
a crystal blank which has a substantially block shape,
a first excitation electrode part which is provided on an upper surface of the crystal blank,
a first wiring part which extends from the first excitation electrode part up to an edge part of the upper surface of the crystal blank,
a first lead-out terminal which is provided at the edge part of the upper surface of the crystal blank so as to be connected to the first wiring part,
a first mounting terminal which is provided at a position facing the first lead-out terminal on a lower surface of the crystal blank,
a first connection part which is provided so that one end is superimposed on the first lead-out terminal and the other end is superimposed on the first mounting terminal,
a second excitation electrode part which is provided on the lower surface of the crystal blank,
a second wiring part which extends from the second excitation electrode part up to an edge part of the lower surface of the crystal blank,
a second lead-out terminal which is provided at the edge part of the lower surface of the crystal blank so as to be connected to the second wiring part,
a substrate which has an upper surface provided with a first mounting pad and a second mounting pad,
conductive adhesives which are provided between the first mounting pad and the first mounting terminal and between the second mounting pad and the second lead-out terminal, and
a lid which is bonded to the upper surface of the substrate.

2. The crystal device as set forth in claim 1, further comprising:
a second mounting terminal which is provided at a position which is on the upper surface of the crystal blank and faces the second lead-out terminal and
a second connection part which is provided so that one end is superimposed on the second lead-out terminal and the other end is superimposed on the second mounting terminal.

3. The crystal device as set forth in claim 1, wherein at least one of the end parts of the first connection part forms arc shape, and the center of the circle of the arc is positioned on the outer edge side of the crystal blank.

4. The crystal device as set forth in claim 3, wherein the arc forms semi-circular shape or semi-ellipsoid shape.

5. The crystal device as set forth in claim 1, wherein the width of the portion of the first connection part which is provided on the side surface of the crystal blank is narrower compared with the width of the portion of the first connection part which is provided on the upper surface of the crystal blank.

6. The crystal device as set forth in claim 1, wherein, when viewing the upper surface of the crystal blank on a plane, the area of a portion in which the first lead-out terminal and the first connection part are superimposed on each other becomes a half of the area of the first lead-out terminal or more.

7. The crystal device as set forth in claim 1, wherein the conductive adhesive is provided not only between the first mounting terminal and the first mounting pad, but also between the other end of the first connection part and the first mounting pad.

8. The crystal device as set forth in claim 1, wherein:
the first excitation electrode part, the second excitation electrode part, the first mounting terminal, the second lead-out terminal, the first wiring part, the second wiring part, and the first lead-out terminal are constituted by a first metal layer and a second metal layer which are provided on the first metal layer, and
the first connection part is constituted by a third metal layer and a fourth metal layer which are provided on the third metal layer.

9. The crystal device as set forth in claim 8, wherein:
different metal materials are used for the second metal layer and the fourth metal layer, and
the electric resistivity of the metal material for the fourth metal layer is smaller than the electric resistivity of the metal material for the second metal layer.

10. The crystal device as set forth in claim 9, wherein a metal material containing gold as the principal ingredient is used for the second metal layer, and a metal material containing silver as the principal ingredient is used for the fourth metal layer.

\* \* \* \* \*